United States Patent
Agan et al.

(10) Patent No.: US 10,505,540 B2
(45) Date of Patent: Dec. 10, 2019

(54) UNIPOLAR LOGIC CIRCUITS

(71) Applicant: TACHO HOLDINGS, LLC, St. Louis Park, MN (US)

(72) Inventors: Tommy Allen Agan, Maple Grove, MN (US); James John Lupino, St. Louis Park, MN (US)

(73) Assignee: Tacho Holdings, LLC, St. Louis Park, MN (US)

( * ) Notice: Subject to any disclaimer, the term of this patent is extended or adjusted under 35 U.S.C. 154(b) by 0 days.

(21) Appl. No.: 15/915,733

(22) Filed: Mar. 8, 2018

(65) Prior Publication Data

US 2018/0302091 A1    Oct. 18, 2018

Related U.S. Application Data

(63) Continuation-in-part of application No. 15/729,470, filed on Oct. 10, 2017, now Pat. No. 10,079,602.

(51) Int. Cl.

| H03K 19/00 | (2006.01) |
|---|---|
| H03K 19/20 | (2006.01) |
| H03K 23/40 | (2006.01) |
| H03K 5/15 | (2006.01) |
| H03K 3/012 | (2006.01) |
| H03K 19/094 | (2006.01) |

(52) U.S. Cl.
CPC ......... *H03K 19/0013* (2013.01); *H03K 3/012* (2013.01); *H03K 5/1506* (2013.01); *H03K 19/094* (2013.01); *H03K 19/20* (2013.01); *H03K 23/40* (2013.01)

(58) Field of Classification Search
CPC ...... H03K 19/096; H03K 23/40; H03K 23/58; H03K 5/1506; H03K 5/13; H03K 5/05; H03K 3/012; H03K 19/0944; H03L 7/07; H03M 1/188; G06F 2217/62; H01L 27/1104; H01L 29/49; H01L 29/783; H01L 2924/13091

See application file for complete search history.

(56) References Cited

U.S. PATENT DOCUMENTS 3,935,474 A * 1/1976 Komarek ............ H03K 19/096
326/96
3,999,081 A * 12/1976 Nakajima .......... H03K 19/0963
326/122

(Continued)

FOREIGN PATENT DOCUMENTS

| JP | 2017041635 A | 2/2017 |
|---|---|---|
| WO | 2016183687 A1 | 11/2016 |

*Primary Examiner* — Vibol Tan
(74) *Attorney, Agent, or Firm* — Kinney & Lange, P.A.

(57) ABSTRACT

Novel unipolar circuits and vertical structures are described which exhibit low stand-by power, low dynamic power, high speed performance, and have higher density compared to conventional silicon CMOS circuitry. In one embodiment, a design methodology utilizing either a p-channel or n-channel transistor type such that each logic gate is clocked and the clocking mechanism provides the pull up or pull down. Further embodiments include novel designs of vertical unipolar logic gates which provides for high density. Ultra-short transistor channel lengths in vertical unipolar logic gates are fabricated with a deposition process—in lieu of a lithography process—thereby providing for high speed operation and low cost manufacturing.

16 Claims, 63 Drawing Sheets

UNIPOLAR PRECHARGED NAND GATE

(56) References Cited

U.S. PATENT DOCUMENTS

| | | | | |
|---|---|---|---|---|
| 4,100,430 A | * | 7/1978 | Lesser | H03K 19/096 |
| | | | | 326/119 |
| 4,316,106 A | * | 2/1982 | Young | H03K 3/356078 |
| | | | | 326/88 |
| 4,495,426 A | * | 1/1985 | Leach | H03K 19/096 |
| | | | | 326/102 |
| 6,798,248 B2 | * | 9/2004 | Hazucha | H03K 3/0315 |
| | | | | 326/93 |
| 6,801,056 B2 | | 10/2004 | Forbes | |
| 7,649,130 B2 | * | 1/2010 | Spirkl | H03K 19/096 |
| | | | | 326/104 |
| 7,671,660 B2 | * | 3/2010 | Van Acht | H03K 19/017 |
| | | | | 326/88 |
| 10,079,602 B1 | * | 9/2018 | Agan | H03K 19/20 |
| 2017/0084754 A1 | | 3/2017 | Shionoiri et al. | |
| 2017/0111046 A1 | | 4/2017 | Sun et al. | |

\* cited by examiner

UNIPOLAR CLOCKED INVERTER GATE - LOW POWER CIRCUIT
SINGLE CLK PER GATE

VERTICAL STRUCTURE OF UNIPOLAR PRECHARGED NOR GATE (FIG 1C)

VERTICAL UNIPOLAR PRECHARGED GATE – EITHER NAND GATE (FIG 1A) OR NOR GATE (FIG 1C)

TOP CONNECTIONS

BOTTOM CONNECTIONS

VERTICAL STRUCTURE OF UNIPOLAR PRECHARGED NAND GATE – LOW POWER CIRCUIT (FIG. 1B)

VERTICAL STRUCTURE OF UNIPOLAR PRECHARGED NAND GATE – LOW POWER CIRCUIT (FIG. 1B)

VERTICAL STRUCTURE OF UNIPOLAR PRECHARGED NOR GATE – LOW POWER CIRCUIT (FIG. 1D)

VERTICAL UNIPOLAR PRECHARGED NAND and NOR GATE – LOW POWER CIRCUITS (FIG. 1B and FIG. 1D)

TOP CONNECTIONS

BOTTOM CONNECTIONS

VERTICAL STRUCTURE OF UNIPOLAR CLOCKED NAND GATE
– LOW POWER CIRCUIT – SINGLE CLK PER GATE (FIG. 1E)

VERTICAL STRUCTURE OF UNIPOLAR CLOCKED NOR GATE – LOW POWER CIRCUIT – SINGLE CLK PER GATE (FIG. 1F)

VERTICAL STRUCTURE OF UNIPOLAR CLOCKED NOR GATE - LOW POWER CIRCUIT – SINGLE CLK PER GATE (FIG. 1F)

VERTICAL UNIPOLAR CLOCKED NAND and NOR GATE – LOW
POWER CIRCUITS, SINGLE CLK PER GATE (FIG. 1E, 1F, 1I and 1J)

TOP CONNECTIONS

BOTTOM CONNECTIONS

VERTICAL STRUCTURE OF UNIPOLAR CLOCKED NAND GATE — LOW POWER CIRCUIT — SINGLE CLK PER GATE (FIG. 1I)

UNIPOLAR LOGIC CIRCUITS

CROSS-REFERENCE TO RELATED APPLICATION(S)

This application claims the benefit of U.S. Provisional Application No. 62/468,725 filed Mar. 8, 2017, for "UNIPOLAR LOGIC CIRCUITS" by Tommy Allen Agan and James John Lupino, the entire disclosure of which is hereby incorporated by reference. This application is also a continuation in part of U.S. Non-Provisional application Ser. No. 15/729,470 filed Oct. 10, 2017, for "UNIPOLAR LOGIC CIRCUITS" by Tommy Allen Agan and James John Lupino, the entire disclosure of which is hereby incorporated by reference.

BACKGROUND

Conventional CMOS logic integrated circuits employ both PMOS and NMOS transistors for high performance and low power. Unipolar logic may be employed—using only NMOS transistors or only PMOS transistors—to reduce the cost of manufacturing, however, high stand-by power of such methods to-date have prohibited unipolar logic to be utilized on a large scale. The continued advancement in the semiconductor and flat panel display industries has yielded new types of transistor materials to be considered for integrated circuits. Some materials such as thin film amorphous metal oxides are low cost and may be fabricated monolithically in 3D structures thereby enabling true monolithic 3D integrated circuits. Furthermore, compound semiconductors such as InAs, InGaAs and GaAs exhibit electron mobility much higher than silicon and therefore are promising candidates to replace silicon. However, these thin film and compound semiconductor transistors are mainly implemented in only NMOS or PMOS type, but not both. A new circuit design is therefore required to enable low stand-by power unipolar logic in order for such new transistor materials to reach a large scale in the electronics industry.

SUMMARY

Novel unipolar circuits and vertical structures are described which exhibit low stand-by power, high speed performance, and higher density compared to conventional silicon CMOS circuitry. In one embodiment, capacitors are employed to enable a precharge state. In another embodiment, capacitors are employed in a bootstrap fashion to maintain the integrity of the high voltage gate output. In yet another embodiment, a clocked gate design utilizes a clock at each gate to bootstrap the voltage so there's no loss due to threshold voltage drop. Further embodiments include novel designs of vertical unipolar logic gates which provides for high density. Ultra-short transistor channel lengths in vertical unipolar logic gates are fabricated with a deposition process—in lieu of a lithography process—thereby providing for high speed operation and low cost manufacturing.

DEFINITION OF DRAWING NUMERALS

10—CLK, Unipolar Clocked NAND or NOR Gate, Low Power Circuit Single CLK per Gate
21—NMOS Transistors, Unipolar Precharged NAND or NOR Gate
22, 23, 24 and 25—NMOS Transistors, Unipolar Precharged or Clocked NAND or NOR Gate
26—Capacitor, Unipolar Precharged NAND or NOR Gate
27—Capacitor, Unipolar Precharged or Clocked NAND or NOR Gate, Low Power Circuit
28, 29 and 30—NMOS Transistors, Unipolar Precharged or Clocked NAND or NOR Gate, Low Power Circuit
31—Vdd
32—CLK, Unipolar Precharged NAND or NOR Gate
33—A input to NAND or NOR Gate
34—B input to NAND or NOR Gate
35—Output of NAND or NOR Gate
36—Ground
38—Low power circuitry of Unipolar Precharged or Clocked NAND Gate
39—Low power circuitry of Unipolar Precharged or Clocked NOR, Inverter or Buffer Gate
41—R interconnect line of Unipolar Bootstrapped NAND Gate
42—T interconnect line of Unipolar Bootstrapped NAND Gate
43—U interconnect line of Unipolar Bootstrapped NAND Gate
47—Capacitor, Unipolar Clocked Buffer Gate, Low Power Circuit
61, 62, 63, 64, 65, 66, 67, 68, 69, 70, and 71—NMOS Transistors, Unipolar Bootstrapped NAND Gate
72 and 73—Capacitors, Unipolar Bootstrapped NAND Gate
92—$\overline{CLK}$, Unipolar Precharged NAND or NOR Gate
93—$\overline{A}$ input to Unipolar Bootstrapped NAND Gate
94—$\overline{B}$ input to Unipolar Bootstrapped NAND Gate
95—$\overline{Output}$, Unipolar Bootstrapped NAND Gate
101—First Unipolar Precharged NAND Gate
201—Second Unipolar Precharged NAND Gate
301—Third Unipolar Precharged NAND Gate
313—Intermediate routing line in Z-direction for Vdd (31)
331—Intermediate routing line in X-direction for A input (33)
332—Intermediate routing line in Y-direction for A input (33)
333—Intermediate routing line in Z-direction for A input (33)
351—Intermediate routing line in X-direction for Output (35)
353—Intermediate routing line in Z-direction for Output (35)
951—Intermediate routing line in X-direction for $\overline{Output}$ (95)
953—Intermediate routing line in Z-direction for $\overline{Output}$ (95)

DETAILED DESCRIPTION

Figure 1A:
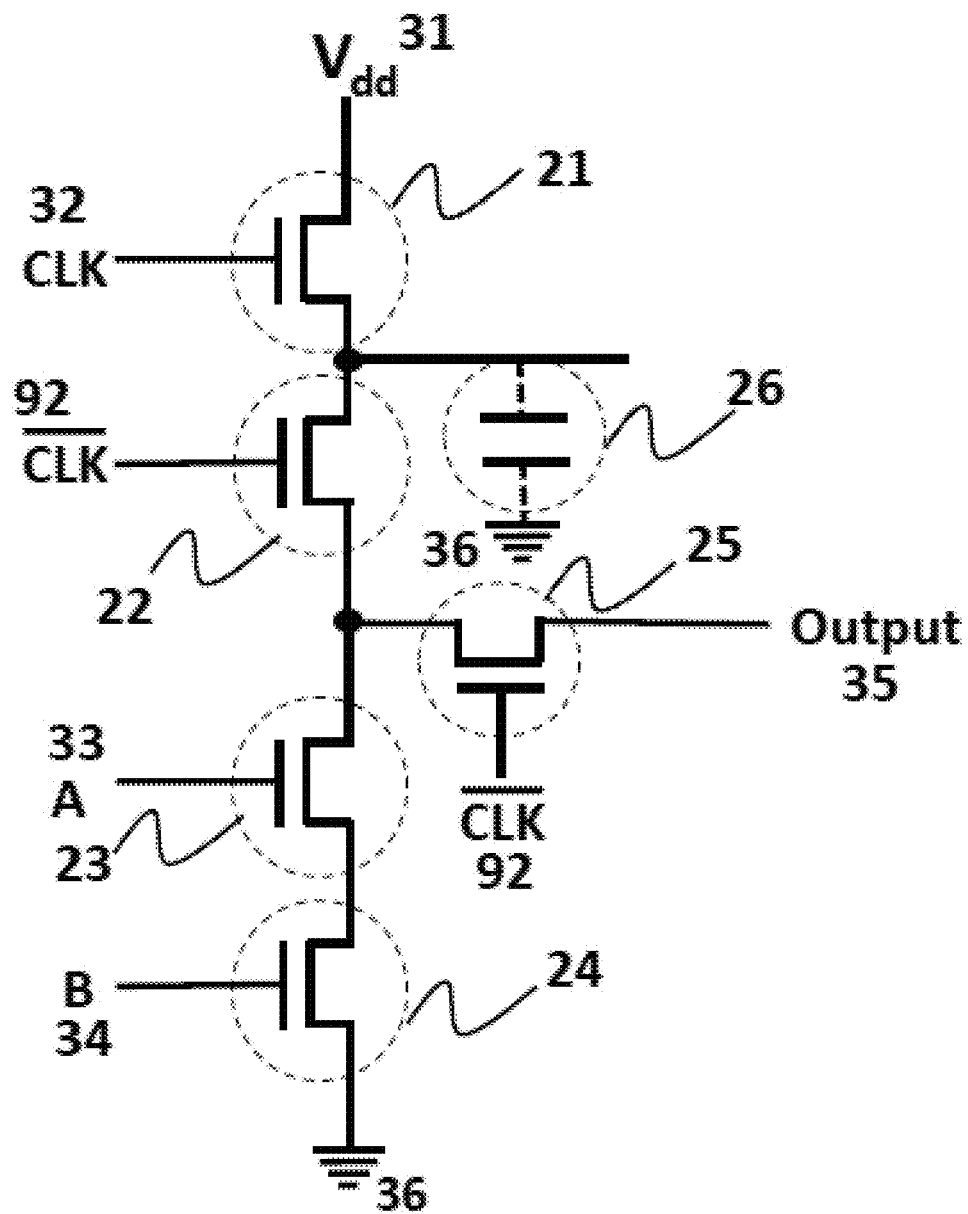
FIG. 1A—Unipolar Precharged NAND Gate Circuit according to an embodiment of the present invention
FIG. 1B—Unipolar Precharged NAND Gate Low Power Circuit according to an embodiment of the present invention
FIG. 1C—Unipolar Precharged NOR Gate Circuit according to an embodiment of the present invention
FIG. 1D—Unipolar Precharged NOR Gate Low Power Circuit according to an embodiment of the present invention
FIG. 1E—Unipolar Clocked NAND Gate Low Power Circuit Single Clock per Gate according to an embodiment of the present invention
FIG. 1F—Unipolar Clocked NOR Gate Low Power Circuit Single Clock per Gate according to an embodiment of the present invention
FIG. 1G—Unipolar Clocked Inverter Gate Low Power Circuit Single Clock per Gate according to an embodiment of the present invention FIG. 1H—Unipolar Clocked Buffer Gate Low Power Circuit Single Clock per Gate according to an embodiment of the present invention FIG. 1I—Unipolar Clocked NAND Gate Low Power Circuit Single Clock per Gate according to an embodiment of the present invention FIG. 1J—Unipolar Clocked NOR Gate Low Power Circuit Single Clock per Gate according to an embodiment of the present invention FIG. 1K—Unipolar Clocked Inverter Gate Low Power Circuit Single Clock per Gate according to an embodiment of the present invention FIG. 1L—Unipolar Clocked Inverter Gate Low Power Circuit Single Clock per Gate according to an embodiment of the present invention FIG. 2—Sequential Precharged NAND Gate Circuits according to an embodiment of the present invention FIG. 3—CLK and $\overline{CLK}$ signals for Precharged Logic Circuits according to an embodiment of the present invention FIG. 4—Logic blocks according to the prior art FIG. 5—Clocked Logic Blocks according to an embodiment of the present invention FIG. 6A—Cross-section view of a Vertical Structure of a Unipolar Precharged NAND Gate according to an embodiment of the present invention FIG. 6B—Cross-section view of a Vertical Structure of a Unipolar Precharged NAND Gate according to an embodiment of the present invention FIG. 6C—Cross-section view of a Vertical Structure of a Unipolar Precharged NOR Gate according to an embodiment of the present invention FIG. 6D—Cross-section view of a Vertical Structure of a Unipolar Precharged NOR Gate according to an embodiment of the present invention FIG. 6E—Top view of the Top Layer Connections of a Vertical Unipolar Precharged NAND or NOR Gate according to an embodiment of the present invention FIG. 6F—Top view of the Bottom Layer Connections of a Vertical Unipolar Precharged NAND or NOR Gate according to an embodiment of the present invention FIG. 6G—An illustration of an array of Vertical Unipolar Precharged NAND or NOR Gates with an average cell size approximately equal to 20 $F^2$ according to an embodiment of the present invention FIG. 6H—Cross-section view of a Vertical Structure of a Unipolar Precharged NAND Gate Low Power Circuit according to an embodiment of the present invention FIG. 6I—Cross-section view of a Vertical Structure of a Unipolar Precharged NAND Gate Low Power Circuit according to an embodiment of the present invention FIG. 6J—Cross-section view of a Vertical Structure of a Unipolar Precharged NOR Gate Low Power Circuit according to an embodiment of the present invention FIG. 6K—Cross-section view of a Vertical Structure of a Unipolar Precharged NOR Gate Low Power Circuit according to an embodiment of the present invention FIG. 6L—Top view of the Top Layer Connections of a Vertical Unipolar Precharged NAND Gate Low Power Circuit or NOR Gate Low Power Circuit according to an embodiment of the present invention FIG. 6M—Top view of the Bottom Layer Connections of a Vertical Unipolar Precharged NAND Gate Low Power Circuit or NOR Gate Low Power Circuit according to an embodiment of the present invention FIG. 6N—An illustration of an array of Vertical Unipolar Precharged NAND or NOR Gates Low Power Circuits with an average cell size approximately equal to 24 $F^2$ according to an embodiment of the present invention FIG. 6O—Cross-section view of a Vertical Structure of a Unipolar Clocked NAND Gate Low Power Circuit Single CLK Per Gate according to an embodiment of the present invention FIG. 6P—Cross-section view of a Vertical Structure of a Unipolar Clocked NAND Gate Low Power Circuit Single CLK Per Gate according to an embodiment of the present invention FIG. 6Q—Cross-section view of a Vertical Structure of a Unipolar Clocked NOR Gate Low Power Circuit Single CLK Per Gate according to an embodiment of the present invention FIG. 6R—Cross-section view of a Vertical Structure of a Unipolar Clocked NOR Gate Low Power Circuit Single CLK Per Gate according to an embodiment of the present invention FIG. 6S—Top view of the Top Layer Connections of a Vertical Unipolar Clocked NAND Gate Low Power Circuit or NOR Gate Low Power Circuit, Single CLK Per Gate, according to an embodiment of the present invention FIG. 6T—Top view of the Bottom Layer Connections of a Vertical Unipolar Clocked NAND Gate Low Power Circuit or NOR Gate Low Power Circuit, Single CLK Per Gate, according to an embodiment of the present invention FIG. 6U—An illustration of an array of Vertical Unipolar Clocked NAND or NOR Gates Low Power Circuits, Single CLK Per Gate, with an average cell size approximately equal to 22 $F^2$ according to an embodiment of the present invention FIG. 6V—Cross-section view of a Vertical Structure of a Unipolar Clocked NAND Gate Low Power Circuit Single CLK Per Gate according to an embodiment of the present invention FIG. 6W—Cross-section view of a Vertical Structure of a Unipolar Clocked NAND Gate Low Power Circuit Single CLK Per Gate according to an embodiment of the present invention FIG. 6X—Cross-section view of a Vertical Structure of a Unipolar Clocked NOR Gate Low Power Circuit Single CLK Per Gate according to an embodiment of the present invention FIG. 6Y—Cross-section view of a Vertical Structure of a Unipolar Clocked NOR Gate Low Power Circuit Single CLK Per Gate according to an embodiment of the present invention FIG. 7—A Unipolar Bootstrap NAND Gate Circuit according to an embodiment of the present invention FIG. 8A—Cross section view of a Vertical Structure of a Unipolar Bootstrapped NAND Gate according to an embodiment of the present invention FIG. 8B—Cross section view of a Vertical Structure of a Unipolar Bootstrapped NAND Gate according to an embodiment of the present invention FIG. 8C—Top view of the Top Layer Connections of a Vertical Unipolar Bootstrapped NAND Gate according to an embodiment of the present invention FIG. 8D—Top view of the Bottom Layer Connections of a Vertical Unipolar Bootstrapped NAND Gate according to an embodiment of the present invention FIG. 8E—Illustrations of arrays of Vertical Unipolar Bootstrapped NAND Gates with average cell sizes ranging from approximately 34 $F^2$ to 36 $F^2$ according to an embodiment of the present invention FIG. 9A—Unipolar Precharged NAND Gate Circuit according to an embodiment of the present invention FIG. 9B—Unipolar Precharged NAND Gate Low Power Circuit according to an embodiment of the present invention FIG. 9C—Unipolar Precharged NOR Gate Circuit according to an embodiment of the present invention FIG. 9D—Unipolar Precharged NOR Gate Low Power Circuit according to an embodiment of the present invention FIG. 9E—Unipolar Clocked NAND Gate Low Power Circuit Single Clock per Gate according to an embodiment of the present invention FIG. 9F—Unipolar Clocked NOR Gate Low Power Circuit Single Clock per Gate according to an embodiment of the present invention FIG. 9G—Unipolar Clocked Inverter Gate Low Power Circuit Single Clock per Gate according to an embodiment of the present invention FIG. 9H—Unipolar Clocked Buffer Gate Low Power Circuit Single Clock per Gate according to an embodiment of the present invention FIG. 9I—Unipolar Clocked NAND Gate Low Power Circuit Single Clock per Gate according to an embodiment of the present invention FIG. 9J—Unipolar Clocked NOR Gate Low Power Circuit Single Clock per Gate according to an embodiment of the present invention FIG. 9K—Unipolar Clocked Inverter Gate Low Power Circuit Single Clock per Gate according to an embodiment of the present invention FIG. 9L—Unipolar Clocked Inverter Gate Low Power Circuit Single Clock per Gate according to an embodiment of the present invention FIG. 10—Sequential Precharged NAND Gate Circuits according to an embodiment of the present invention FIG. 11A—Unipolar Clocked Inverter Circuit FIG. 11B—Unipolar Clocked Inverter Circuit—Simulation FIG. 12A—Unipolar Clocked Buffer Circuit FIG. 12B—Unipolar Clocked Buffer Circuit Simulation FIG. 13A—Unipolar Clocked NAND Circuit FIG. 13B—Unipolar Clocked NAND Circuit Simulation FIG. 14A—Unipolar Clocked 3 NAND Circuit FIG. 14B—Unipolar Clocked 3 NAND Circuit Simulation

FIG. 1A is a schematic diagram of a unipolar precharged NAND gate circuit according to an embodiment of the present invention. When CLK (32) is driven high, A (33) and B (34) can change, transistor (21) turns on and capacitor (26) is charged to Vdd. Further, when CLK (32) is driven high, $\overline{CLK}$ (92) is driven low and there is no other path for Vdd other than charging capacitor (26). When CLK (32) is driven low, A (33) and B (34) cannot change, $\overline{CLK}$ (92) is driven high and the charge on capacitor (26) is available to drive the Output (35) high provided either A (33) or B (34) are low. The only manner for a low output is when A (33) and B (34) are both high. Transistor (25) does not allow any changes of A (33) or B (34) to propagate to Output (35) when $\overline{CLK}$ (92) is not asserted (driven low). Every clock cycle of which the output is to be pulled low, the charge from capacitor (26) is pulled to ground through transistors (22, 23 and 24). Additional logic circuitry, FIG. 1B (38), may be employed to keep the capacitor (26) from discharging to ground when A (33) and B (34) are both high; this would provide for lower power circuitry.

Figure 1B:
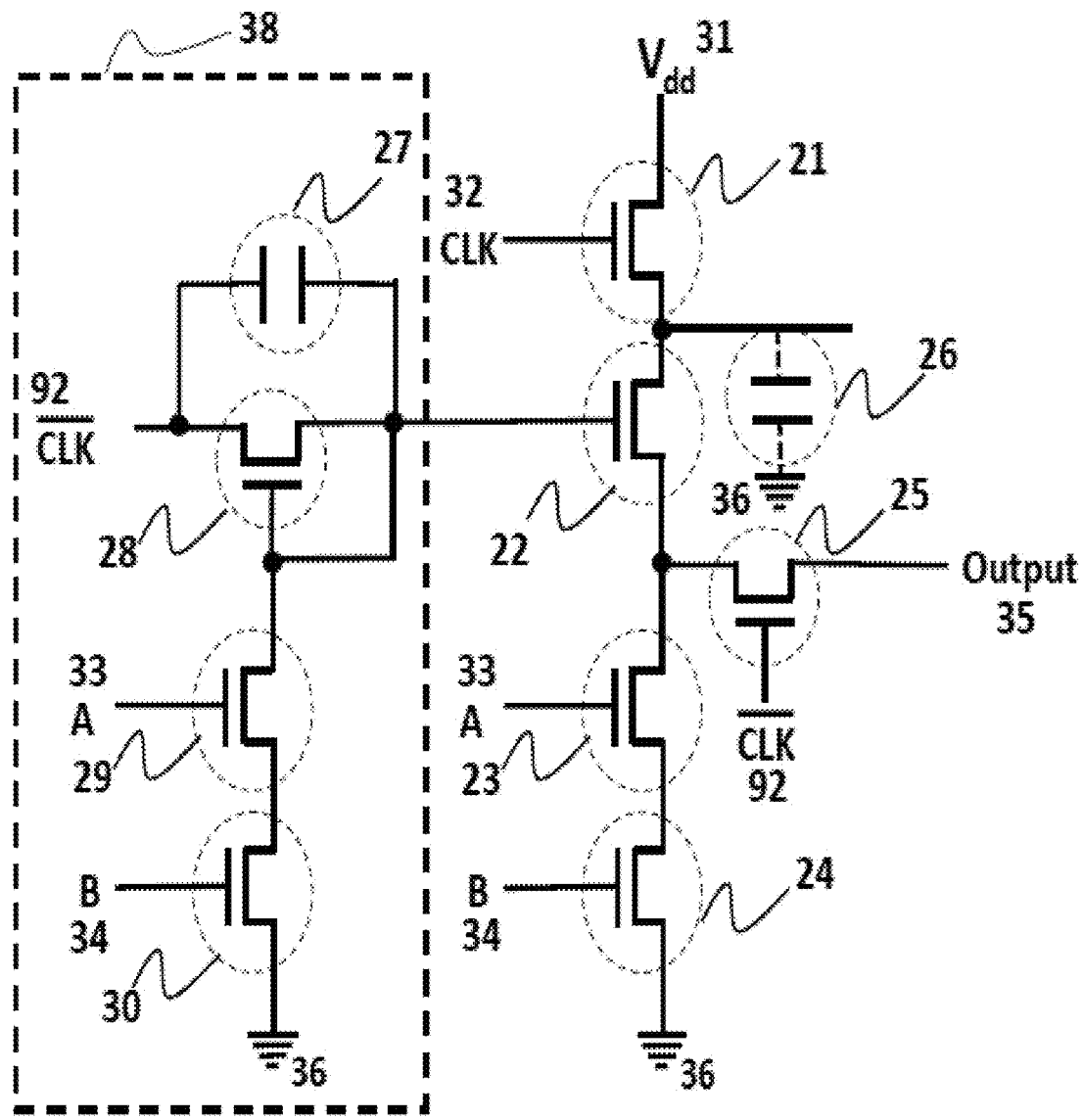

FIG. 1B is such an example of a unipolar precharged NAND gate low power circuit according to an embodiment of the present invention. When A (33) and B (34) are on (high) the Output (35) is to be pulled low, but it is desirable to not discharge capacitor (26). The point of the additional circuitry is to turn off transistor (22) when both A (33) and B (34) are on (high). When A (33) and B (34) are on, transistors (28) and (22) are turned off (low), thereby not providing a path for capacitor (26) to discharge to ground. In order for transistor (22) to turn on (high), either A (33) or B (34) is off (low), thereby not providing a path for the gate of transistor (22) to ground. Further, when either A (33) or B (34) is off (low), it is desirable that $\overline{CLK}$ (92) drives the gate of transistor (22). When $\overline{CLK}$ (92) is driven high, capacitor (27) will bump up the voltage of the gate of transistor (22) and the gate of transistor (28). When the gate of transistor (28) reaches its threshold voltage, transistor (28) turns on allowing the voltage of $\overline{CLK}$ (92) to propagate to the gate of transistor (22). This allows the charge on capacitor (26) to propagate to the Output (35).

Figure 1C:
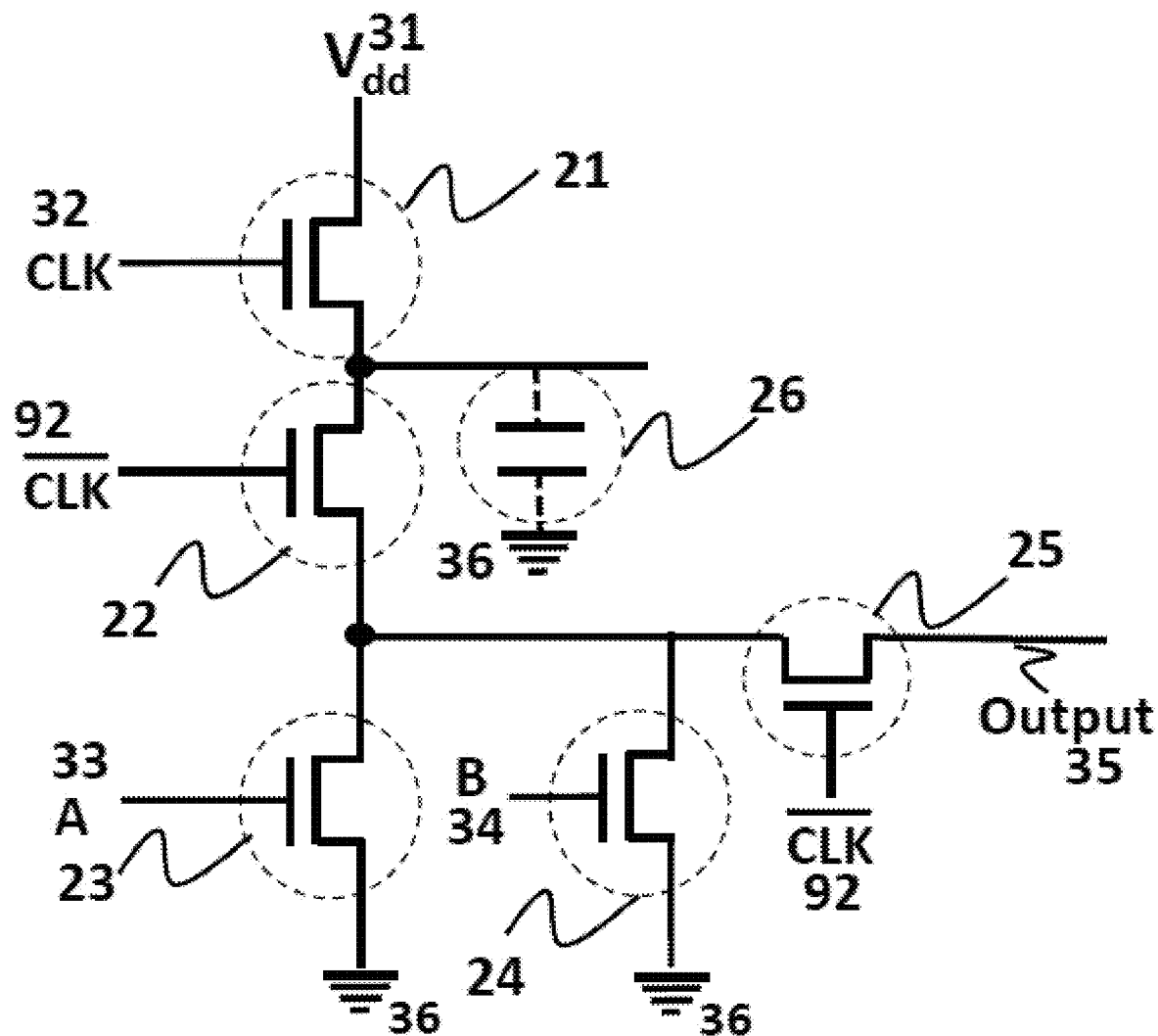

FIG. 1C is a schematic diagram of a unipolar precharged NOR gate circuit according to an embodiment of the present invention. When CLK (32) is driven high, A (33) and B (34) can change, transistor (21) turns on and capacitor (26) is charged to Vdd. Further, when CLK (32) is driven high, $\overline{CLK}$ (92) is driven low and there is no other path for Vdd other than charging capacitor (26). When CLK (32) is driven low, A (33) and B (34) cannot change, $\overline{CLK}$ (92) is driven high and the charge on capacitor (26) is available to drive the Output (35) high provided both A (33) and B (34) are low. The only manner for a low output is when A (33) or B (34) are both high. Transistor (25) does not allow any changes of A (33) or B (34) to propagate to Output (35) when $\overline{CLK}$ (92) is not asserted. Every clock cycle, of which the output is to be pulled low, the charge from capacitor (26) is pulled to ground through transistors (22 and 23 or 22 and 24). Additional logic circuitry, FIG. 1D (39), may be employed to keep the capacitor (26) from discharging to ground when A (33) or B (34) is high; this would provide for lower power circuitry.

Figure 1D:
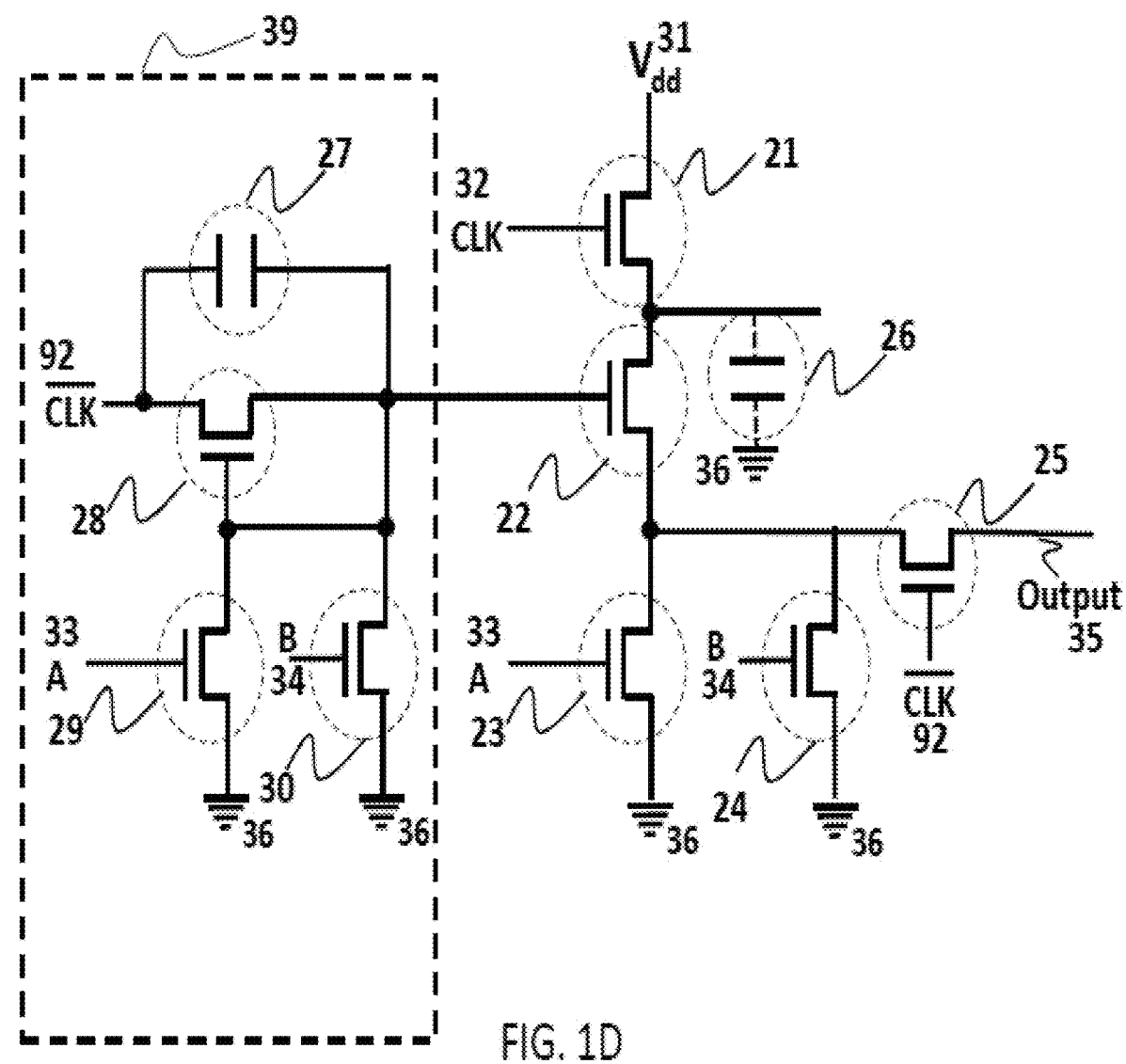

FIG. 1D is such an example of a unipolar precharged NOR gate low power circuit according to an embodiment of the present invention. When A (33) or B (34) is on (high) the Output (35) is to be pulled low, but it is desirable to not discharge capacitor (26). The point of the additional circuitry is to turn off transistor (22) when either A (33) or B (34) is on (high). When A (33) or B (34) is on, transistors (28 and 22) are turned off (low), thereby not providing a path for capacitor (26) to discharge to ground. In order for transistor (22) to turn on (high), both A (33) and B (34) must be off (low), thereby not providing a path for the gate of transistor (22) to ground. Further, when both A (33) and B (34) are off (low), it is desirable that $\overline{CLK}$ (92) drives the gate of transistor (22). When $\overline{CLK}$ (92) is driven high, capacitor (27) will bump up the voltage of the gate of transistor (22) and the gate of transistor (28). When the gate of transistor (28) reaches its threshold voltage, transistor (28) turns on allowing the voltage of $\overline{CLK}$ (92) to propagate to the gate of transistor (22). This allows the charge on capacitor (26) to propagate to the output.

There are numerous reasons for implementing unipolar logic. Unipolar logic is not often used because of the drawbacks of implementing unipolar logic. For example, NMOS logic utilizes a resistor to pull the voltages high. These resistors draw current too much of the time resulting in high power consumption. If the resistors are higher valued to reduce to power consumption, the speed suffers (i.e., speed is reduced). Other methods known in the art require too many transistors and tend to be slow speed compared to conventional CMOS. As known in the art, system speed has been increasing for some time and as of late the increases in speed has slowed. Historically there have been two methods to increase the speed. One method is the reduction in gate length which increases transistor speed and increases density which decreases parasitic losses due to capacitance, inductance and resistance. The other method is to reduce the path length from latch to latch.

Figure 1E:
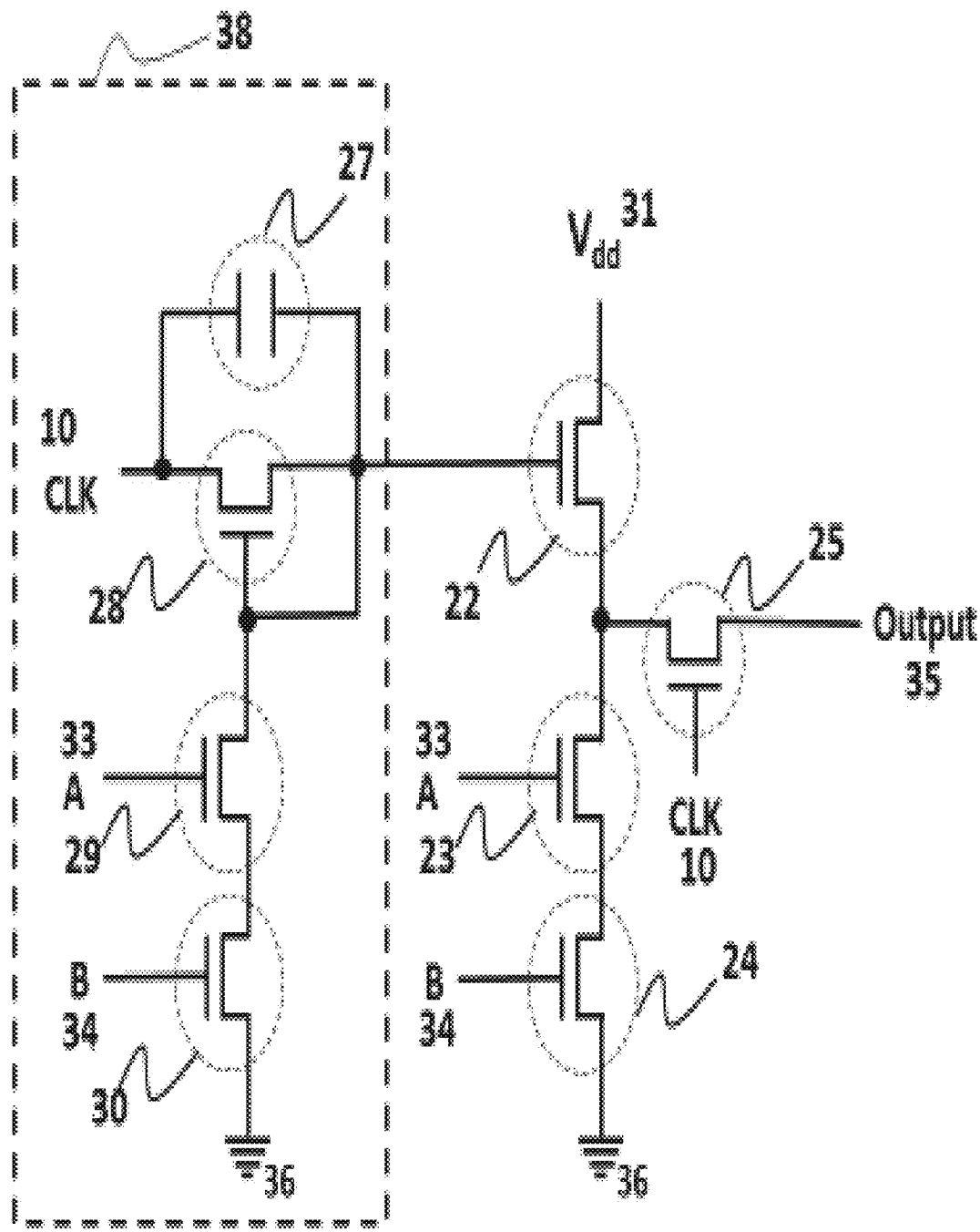
Figure 1F:
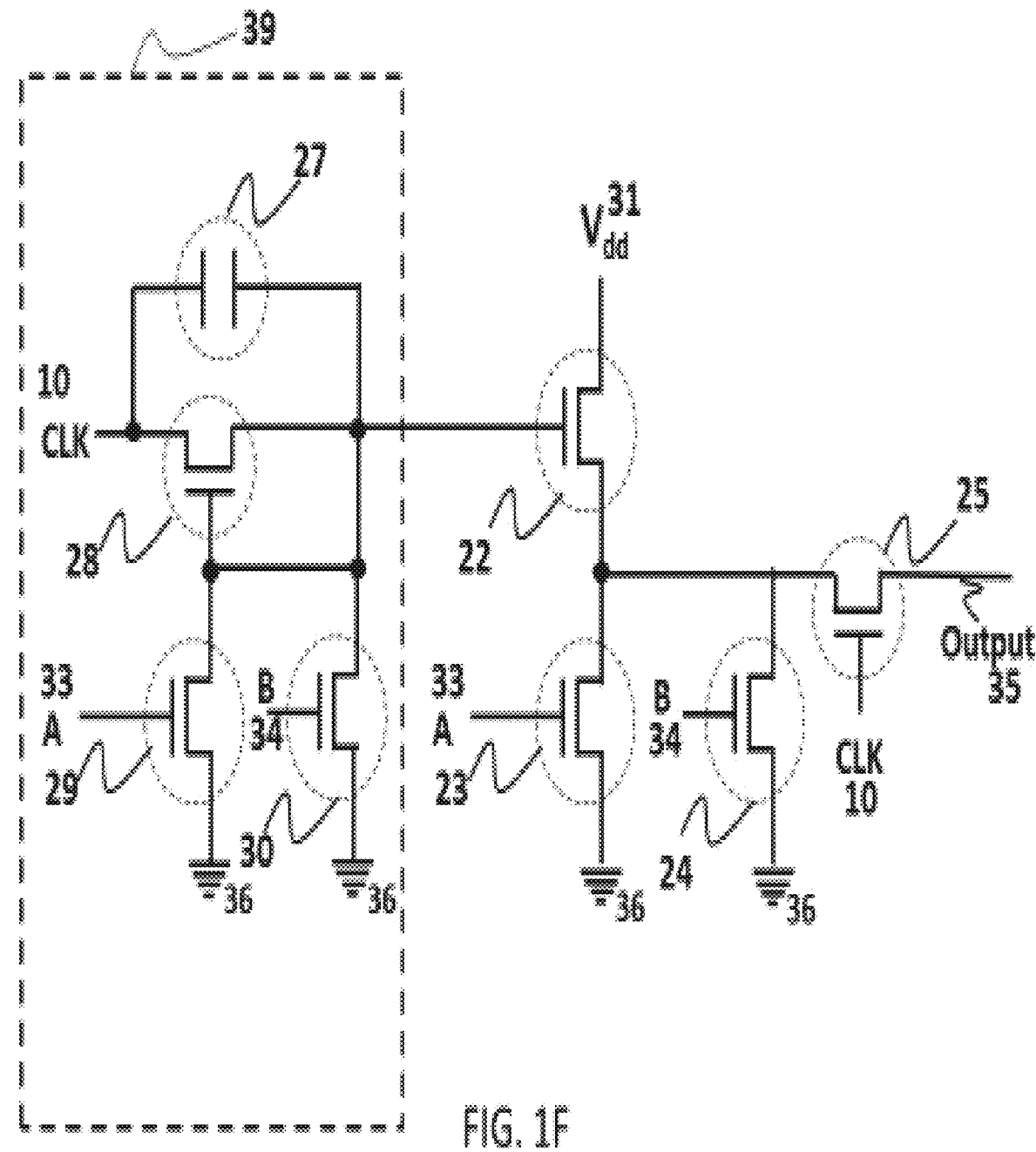

The methods outlined below, related to FIG. 1E and FIG. 1F, improve the clock speed by reducing the logic path between gates to a minimum. Effectively, every gate is clocked providing for a maximum of clock speed. Clocking each gate in conventional CMOS logic is not often done due to the increase in number of latches that would be required. With approximately 8 transistors per latch, that would be not feasible. In FIGS. 1E, 1F, 1G, 1H, 1I, 1J, 1K and 1L we have created a methodology in circuitry which enables unipolar logic at very high speed clocking at each gate. It utilizes a clock at each gate to bootstrap the voltage so there's no loss due to threshold voltage drop. We refer to this methodology as Unipolar Clocked Logic.

FIG. 1E is an example of an improved unipolar Clocked NAND gate low power circuit single clock according to an embodiment of the present invention. When A (33) and B (34) are on (high) the Output (35) is to be pulled low when CLK (10) is asserted. The Output (35) can only change and only be driven when the CLK (10) is asserted. For the Output (35) to be asserted low, transistors (25, 23 and 24) are on and transistor (22) is off. In order for transistor (22) to be off, transistors (29 and 30) are on. For the Output (35) to be asserted high, transistors (25, 22, and 28) are on and transistors (23 or 24) are off. In order for transistor (22) to be on, CLK (10) increases in voltage causing an increase in voltage on gate of transistor (22) through capacitor (27). This increase in voltage will be reduced if transistors (29 and 30) are on. If either (29 or 30) are off, transistors (28 and 22) will turn on. When CLK (10) is not asserted the Output (35) node is floating and the parasitic capacitance will maintain the state for some period of time. When A (33) and B (34) are not both high (on), it is desirable with NAND gate logic to pull the Output (35) high. In order for the Output (35) to go high, the gate of transistor (22) needs to be high. Transistor (22) gate goes high when either A (33) or B (34) are off and CLK (10) is high. When the gate of transistor (25) gate goes high, the Output (35) is enabled. The requirements on the voltage of the Output (35) is that it must exceed the threshold voltage of the unipolar (e.g., NMOS) transistor.

FIG. 1F is an example of an improved unipolar Clocked NOR gate low power circuit single clock according to an embodiment of the present invention. When A (33) or B (34) are on (high) the Output (35) is to be pulled low when CLK (10) is asserted. The Output (35) can only change and only be driven when the CLK (10) is asserted. For the Output (35) to be asserted low, transistors (25 and 23 or 25 and 24) are on and transistor (22) is off. In order for transistor (22) to be off, transistors (29 or 30) are on. For the Output (35) to be asserted high, transistors (25, 22, and 28) are on and transistors (23 and 24) are off. In order for transistor (22) to be on, CLK (10) increases in voltage causing an increase in voltage on gate of transistor (22) through capacitor (27). This increase in voltage will be reduced if transistors (29 or 30) are on. If both (29 and 30) are off, transistors (28 and 22) will turn on. When CLK (10) is not asserted the Output (35) node is floating and the parasitic capacitance will maintain the state for some period of time. When A (33) and B (34) are not both high (on), it is desirable with NOR gate logic to pull the Output (35) high. In order for the Output (35) to go high, the gate of transistor (22) needs to be high. Transistor (22) gate goes high when both A (33) and B (34) are off and CLK (10) is high. When the gate of transistor (25) gate goes high, the Output (35) is enabled. The requirements on the voltage of the Output (35) is that it must exceed the threshold voltage of the unipolar (e.g., NMOS) transistor.

Figure 1G:
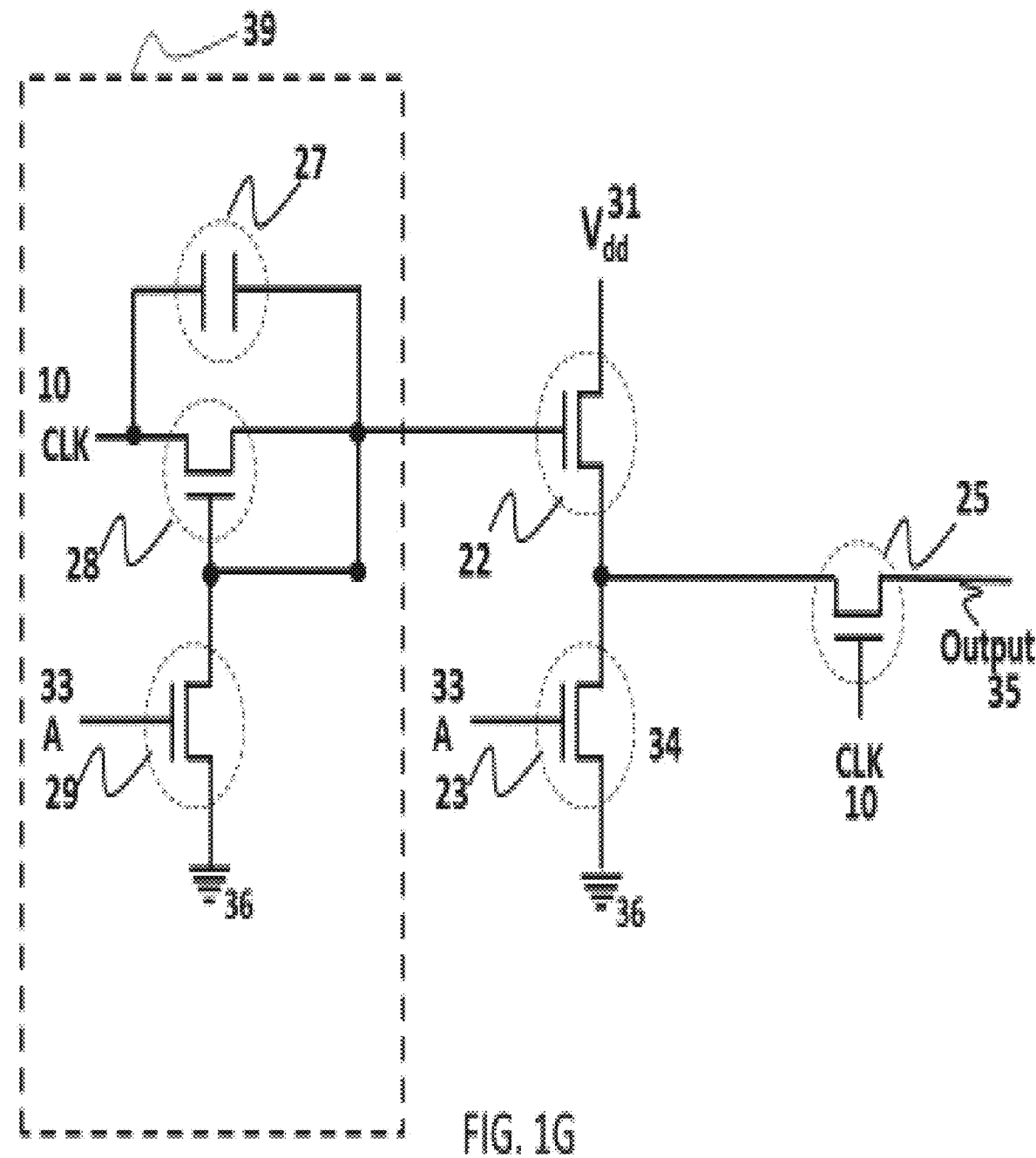
Figure 1H:
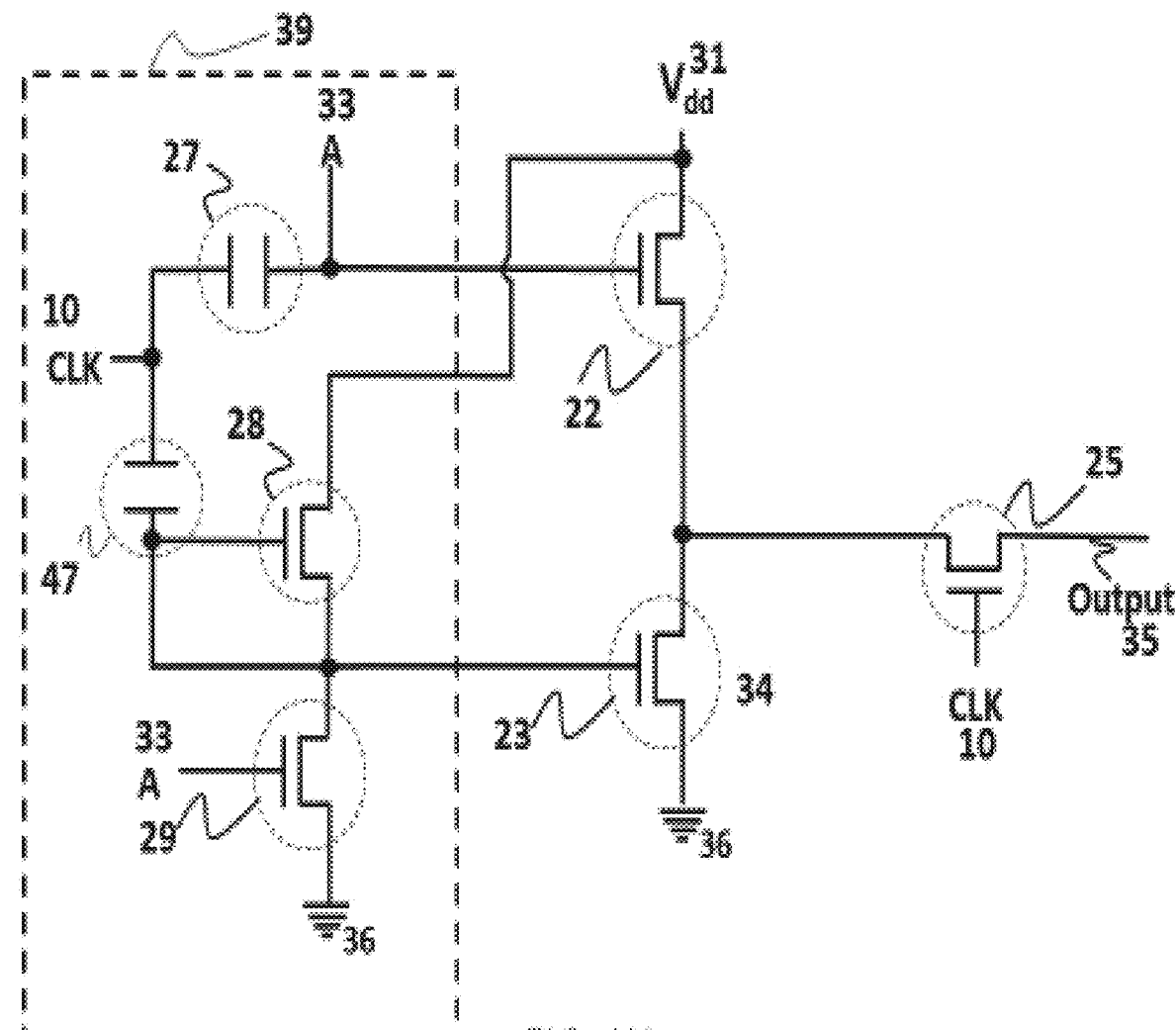
Figure 11:
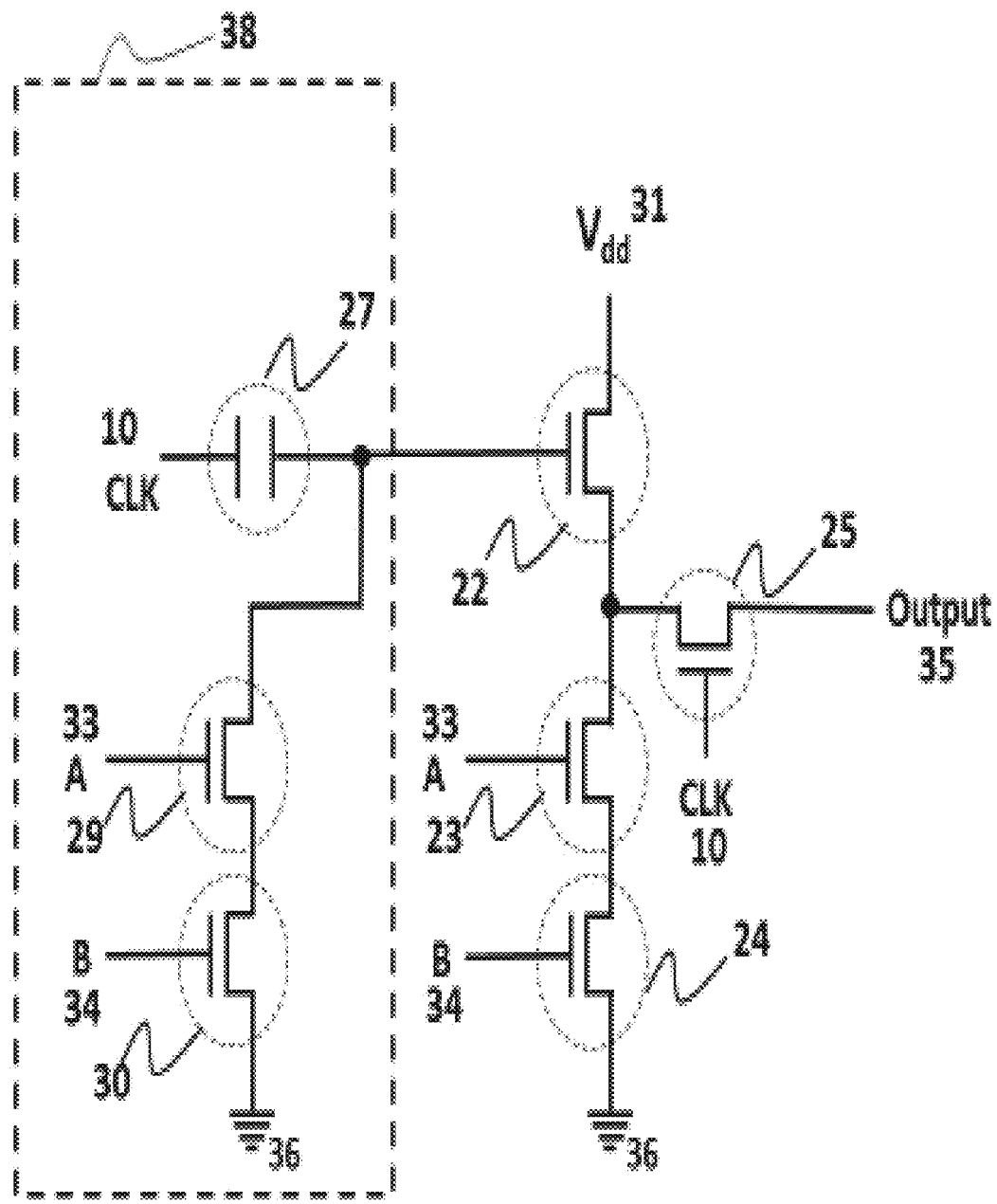
Figure 1U:
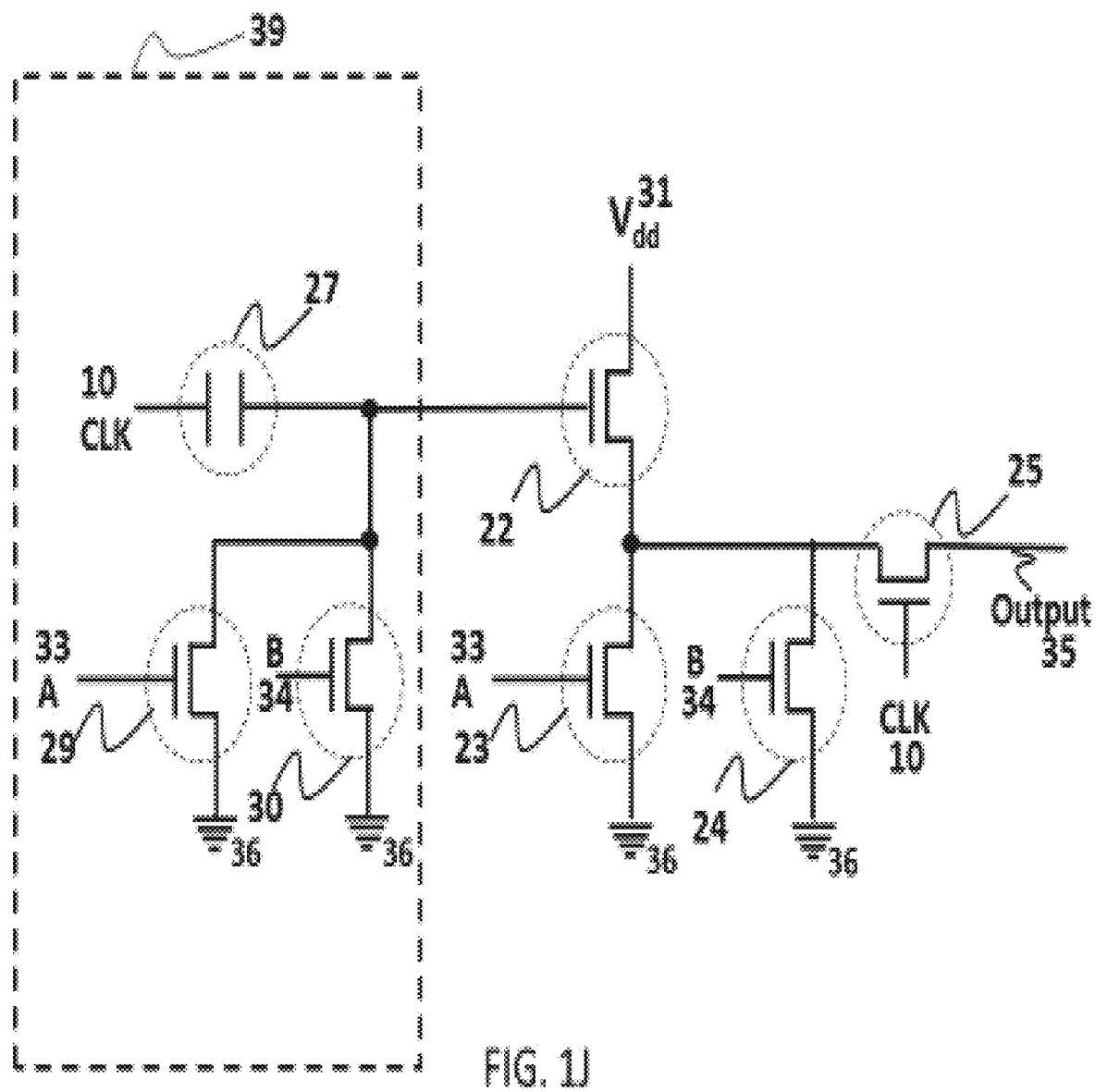
Figure 1K:
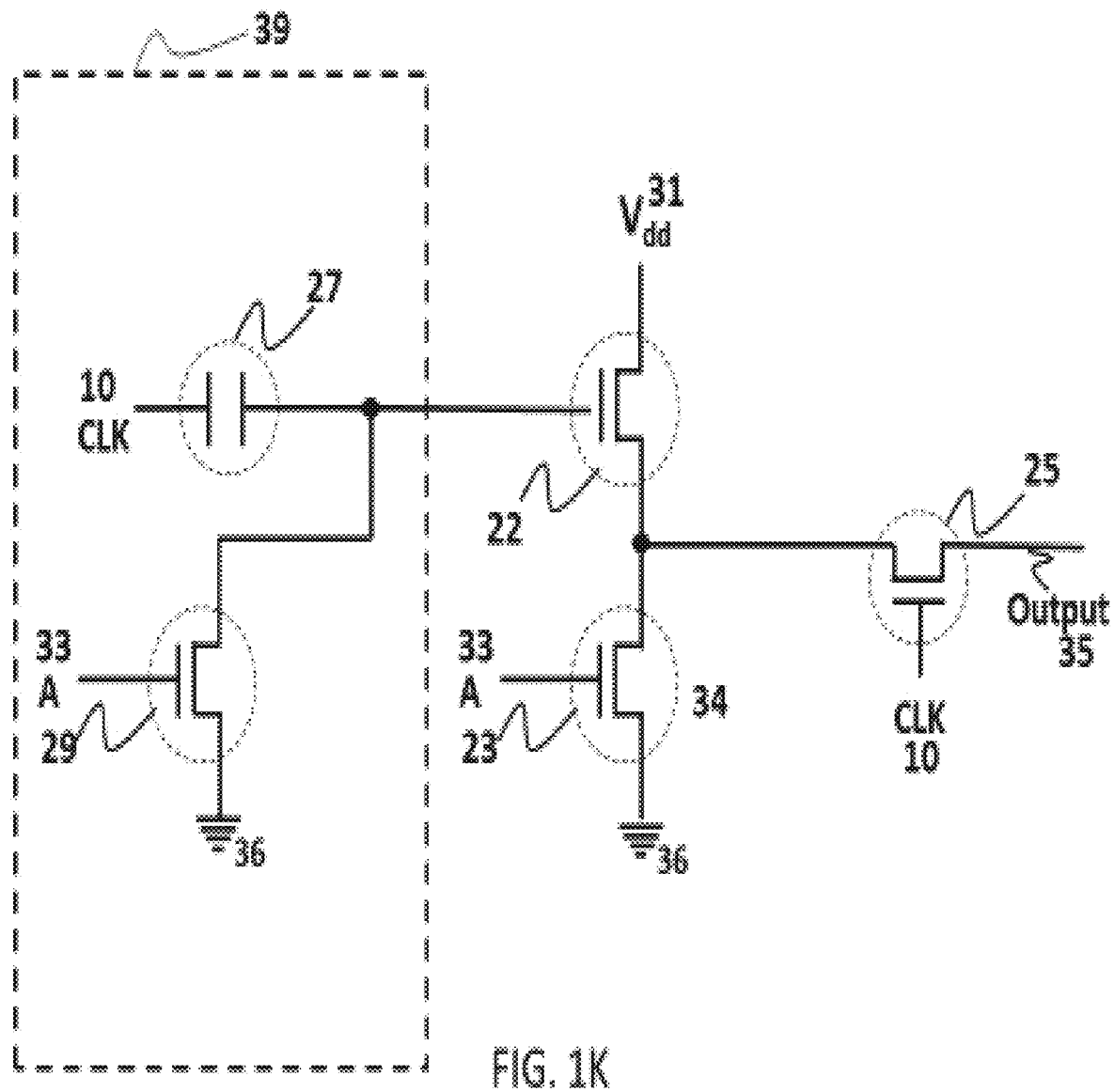
Figure 1L:
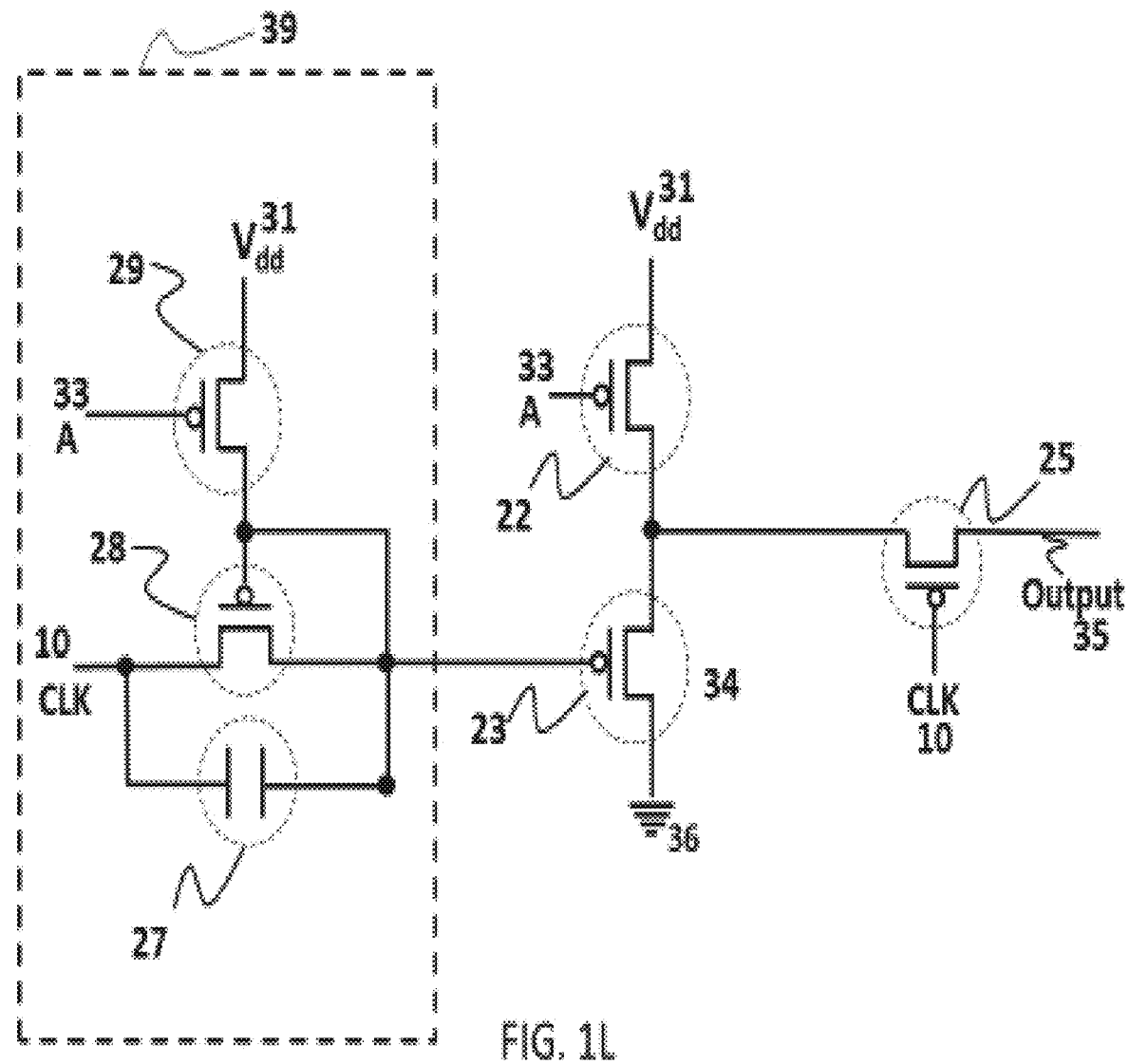

Other examples of Unipolar Clocked Logic circuits include an inverter gate, FIG. 1G or FIG. 1L—Unipolar Clocked Inverter Gate Low Power Circuit Single Clock per Gate and a buffer gate, FIG. 1H—Unipolar Clocked Buffer Gate Low Power Circuit Single Clock per Gate.

Simplified circuitry employing Unipolar Clocked Logic may be possible by removing transistor (28) in FIGS. 1E, 1F, 1G and 1L due to the edge rate of the clock and the value of the capacitor (27) will cause the gate voltage on transistor (22) to be sufficient without requiring transistor (28). FIGS. 1I, 1J and 1K illustrate such simplified circuits for unipolar clocked logic NAND, NOR and Inverter gates respectively.

Figure 2:
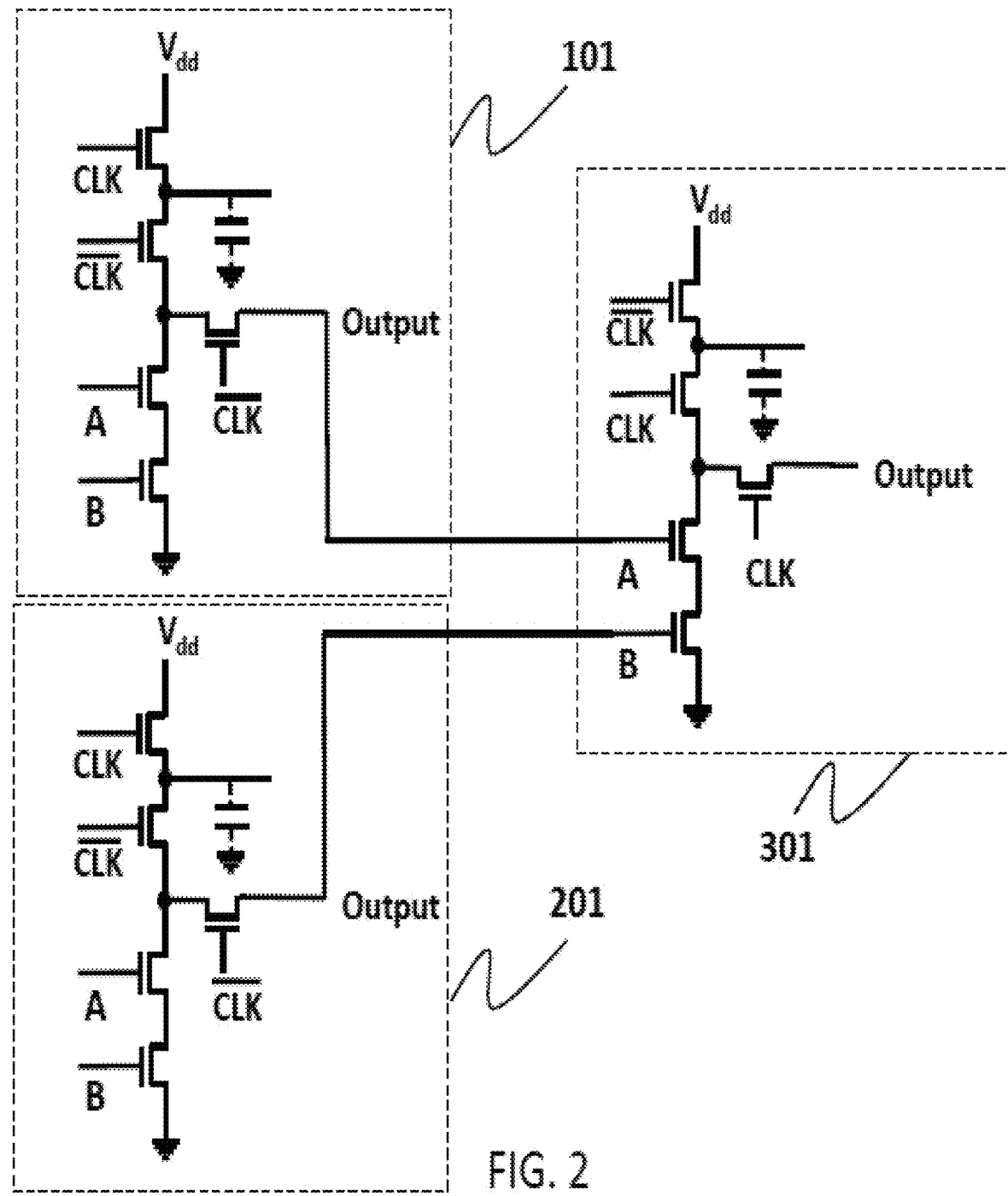

FIG. 2 is a schematic diagram of sequential precharged NAND gate circuits according to an embodiment of the present invention. A first unipolar precharged NAND gate (101) and a second unipolar precharged NAND gate (201) operate in parallel and the outputs are propagated on $\overline{CLK}$ (92). The outputs of NAND gate (101) and NAND gate (201) are inputs to a third unipolar precharged NAND gate (301). NAND gate (301) output is propagated on CLK (32) and not on $\overline{CLK}$ (92). Alternating the clock phase of serially connected logic gates prevents signals from propagating through more than one gate at a time or shooting through clock cycles. Such a clock phase arrangement can prevent crowbar currents while input voltages are undergoing transient behavior.

Figure 3:
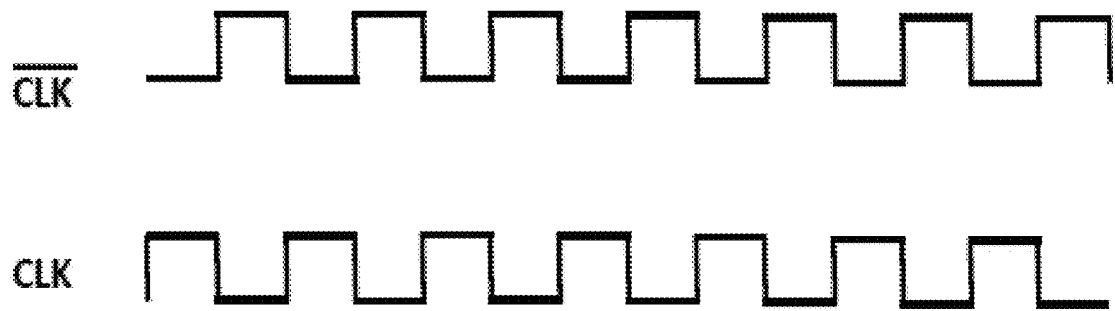

FIG. 3 is a schematic diagram of the CLK and $\overline{CLK}$ signals for Precharged Logic Circuits according to an embodiment of the present invention. The CLK and $\overline{CLK}$ signals are asymmetrical to each other and no time interval between the rise of one and the fall of the other is required. Such a complementary clocking scheme can be used because of the alternating clock phases of serially connected logic gates. Such clock phasing minimizes stringent timing requirements of clocking edges.

Figure 4:
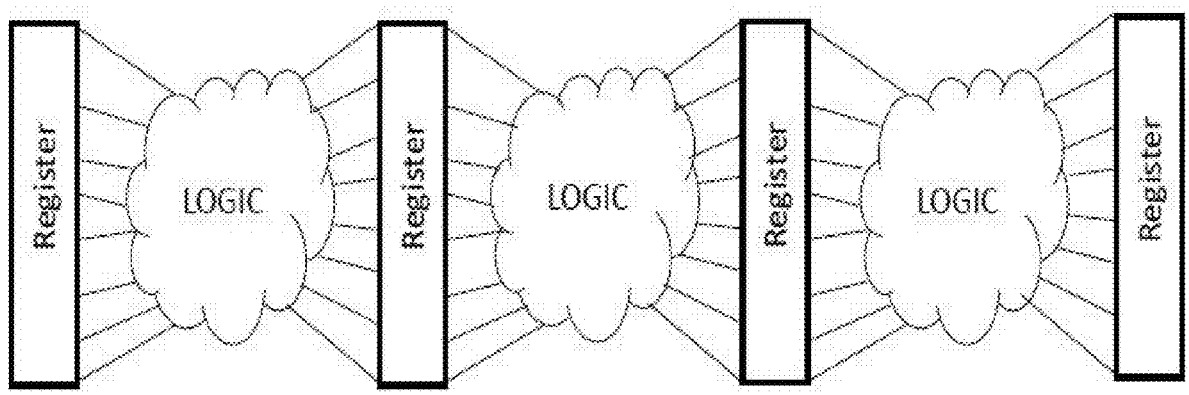

FIG. 4 is a diagram illustrating logic blocks according to the prior art. Conventional circuit designs can employ registers interposed between blocks of logic. Such interposed registers can be called pipeline design of logic. In such pipeline designs, a maximum clock speed can be limited by the setup and hold time of the register plus the delay time of the blocks of logic.

Figure 5:
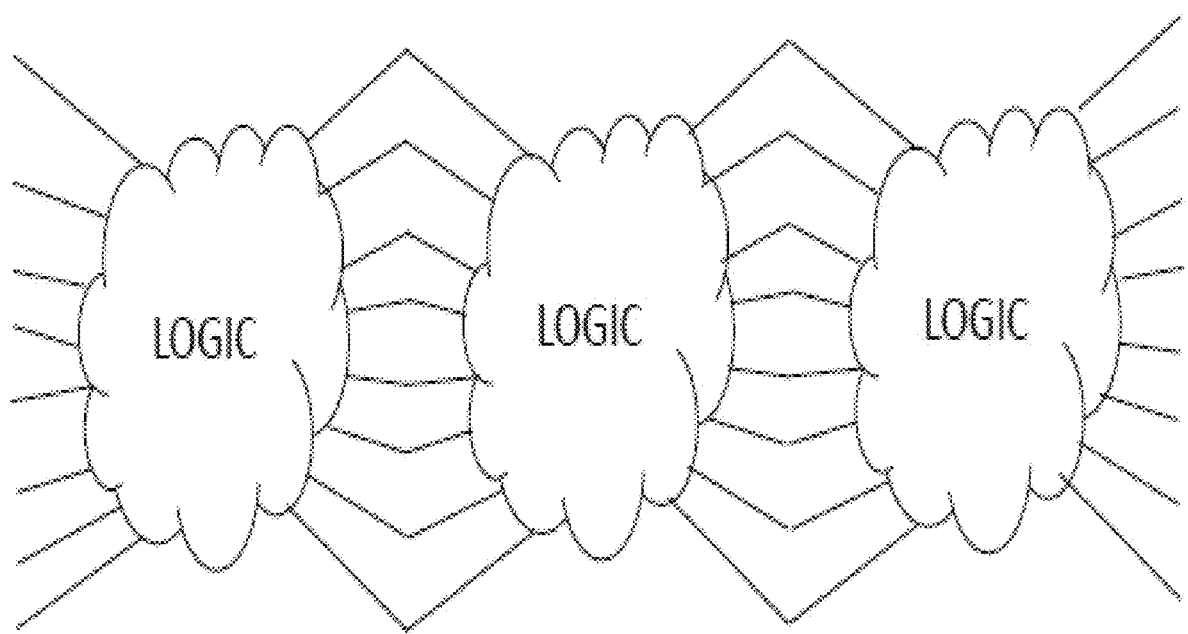

All of the unipolar logic circuits described herein are clocked logic blocks including the precharged logic (FIGS. 1A-1D), clocked logic (FIGS. 1E-1H) and bootstrapped logic (FIG. 2). FIG. 5 is a diagram illustrating clocked logic blocks according to an embodiment of the present invention. In contrast to FIG. 4, separate registers are not needed for logic blocks because each gate acts as its own register. Further, the load capacitance acts as a storage element to store the output state. Such clocking schemes provide a dynamic register capability to the logic block. The clock speed for such clocked logic cells can be determined by the time is takes to charge the load capacitance. Therefore, the clock speed of the present inventions can be much higher than that required by standard logic such as FIG. 4

Figure 6A:
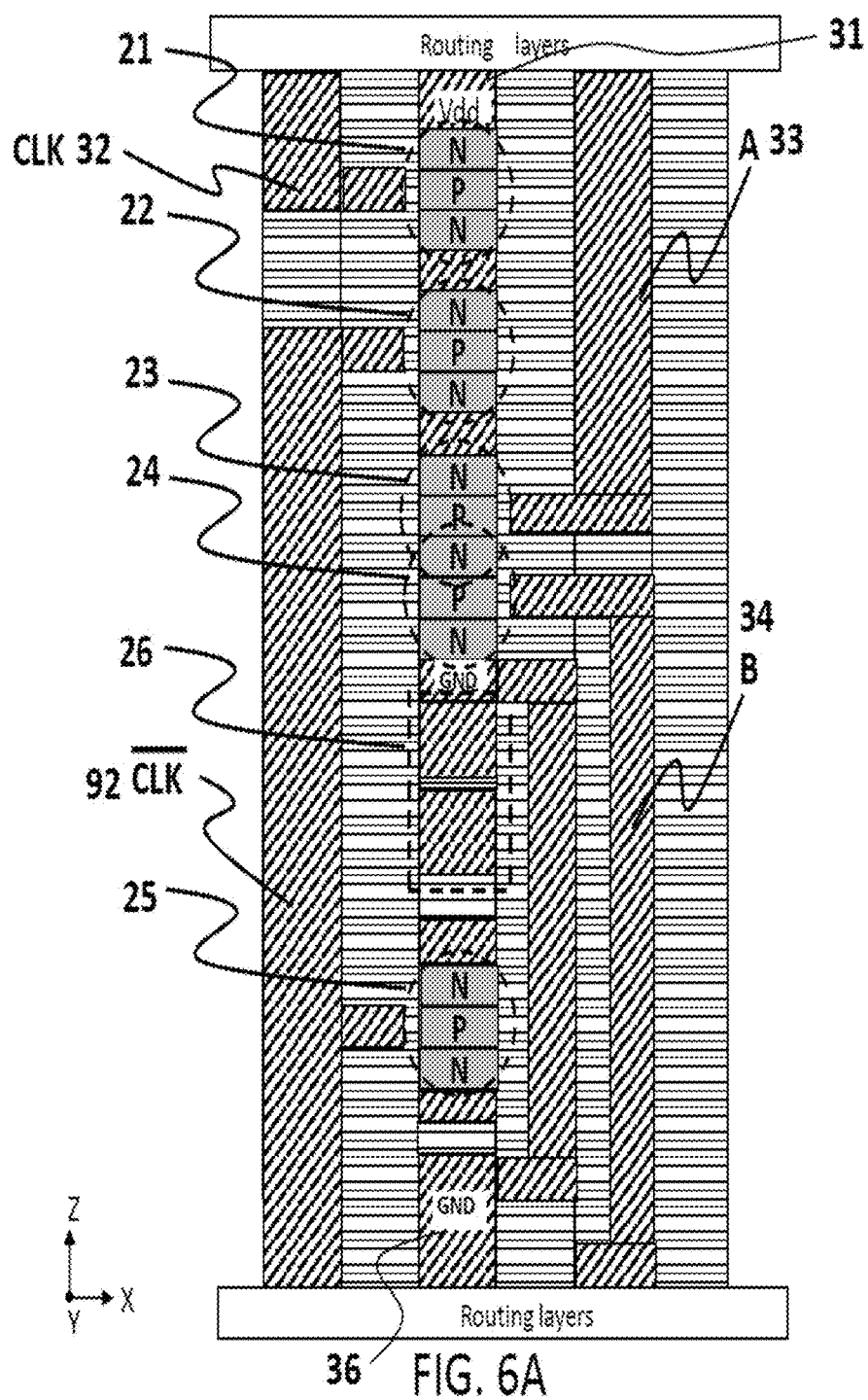
Figure 6B:
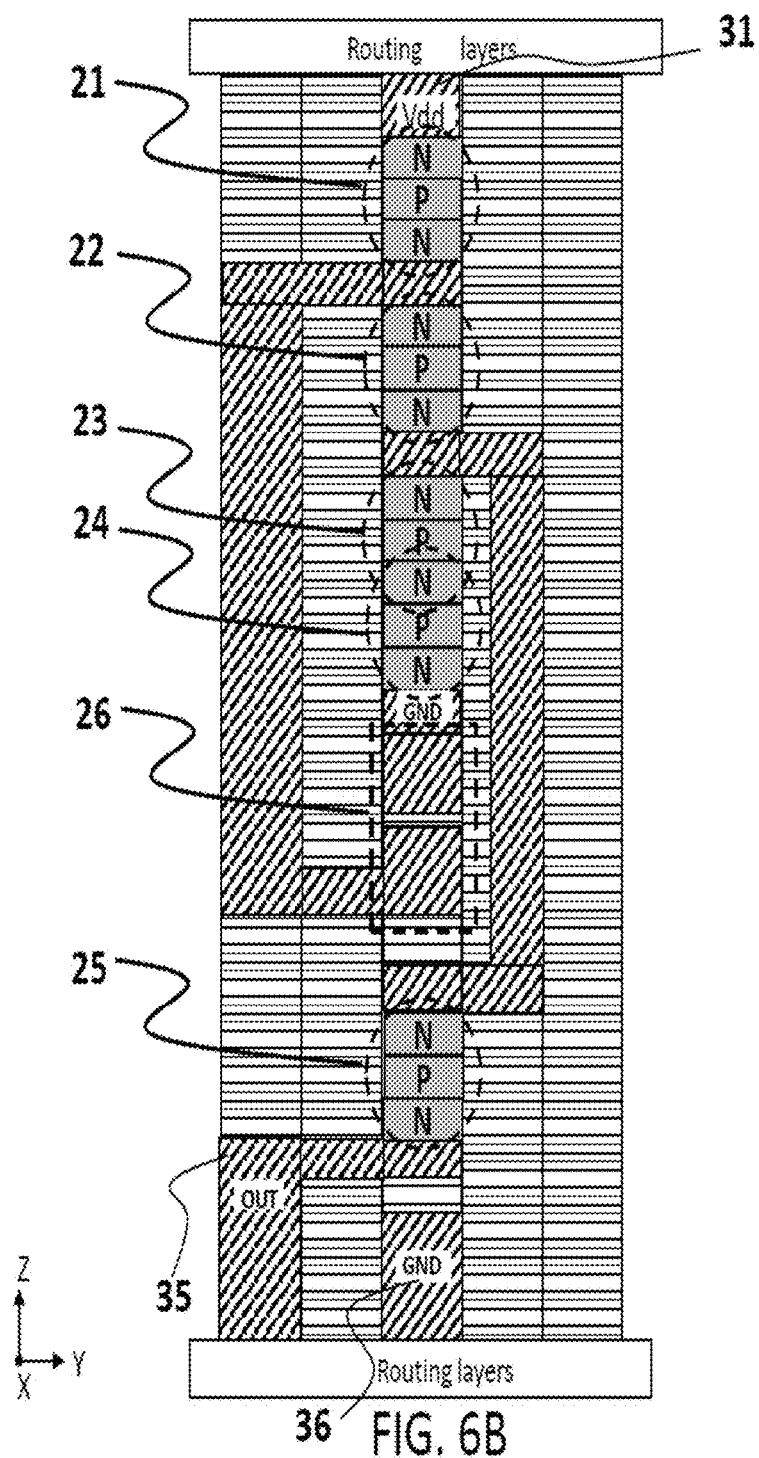

FIG. 6A and FIG. 6B are cross-sectional views of a vertical structure of a unipolar precharged NAND gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6A and 6B are cross-sectioned in quadrature planes (planes whose normal vectors are orthogonal to one another). Both FIGS. 6A and 6B section through an active column (e.g., a column of semiconductor material in which active devices can be fabricated). The semiconductor layers of transistors (21, 22, 23, 24 and 25) of FIG. 1A are all fabricated in a single stack. The transistor channel lengths are determined by deposition and not by lithography. This allows very high density circuitry and very high speed. The manufacturing methodology for fabricating the structure shown in FIG. 6A and FIG. 6B can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors; alternatively, one may separate the transistors and connect them with a metal interconnect.

Figure 6C:
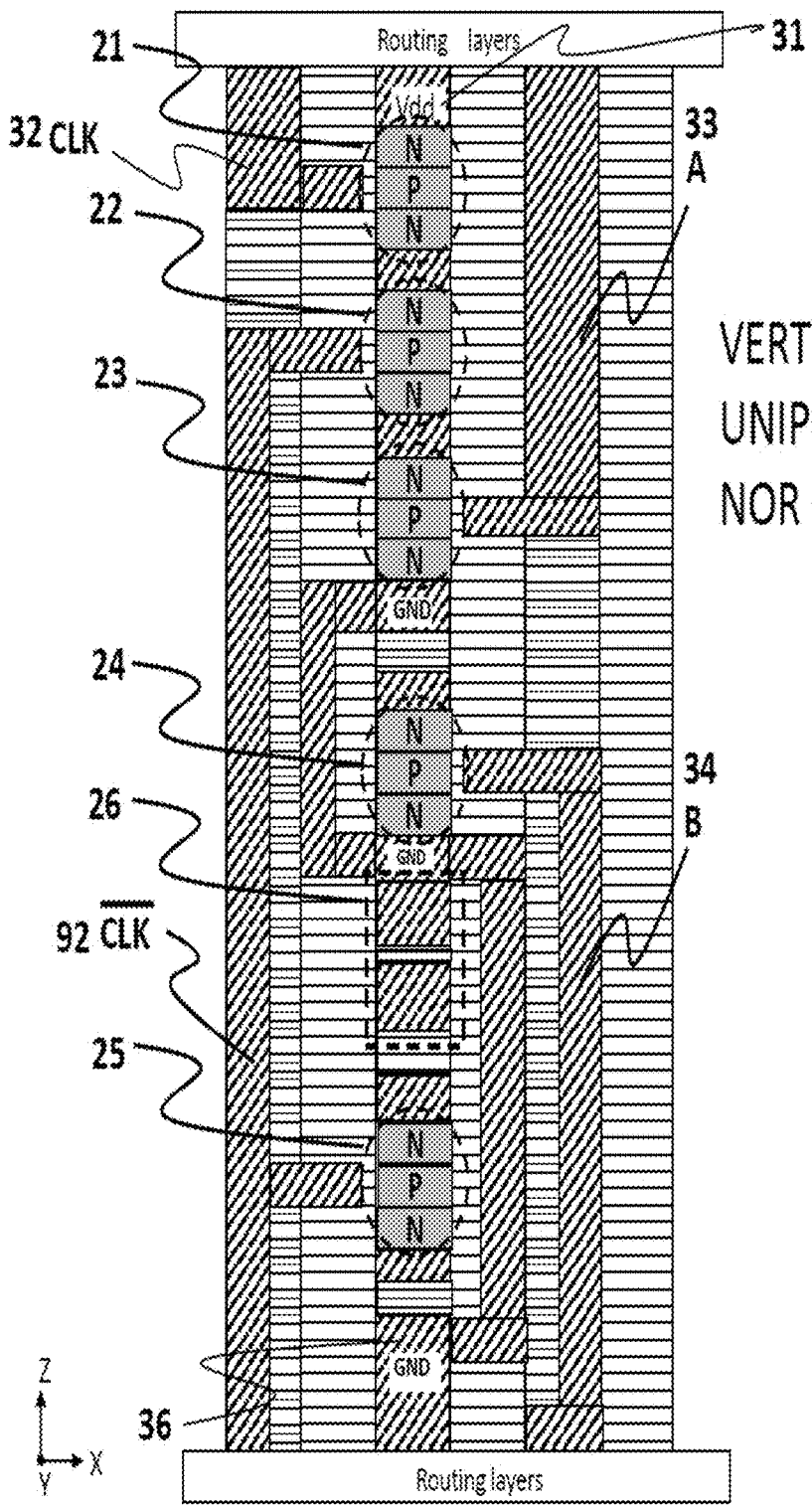
Figure 6D:
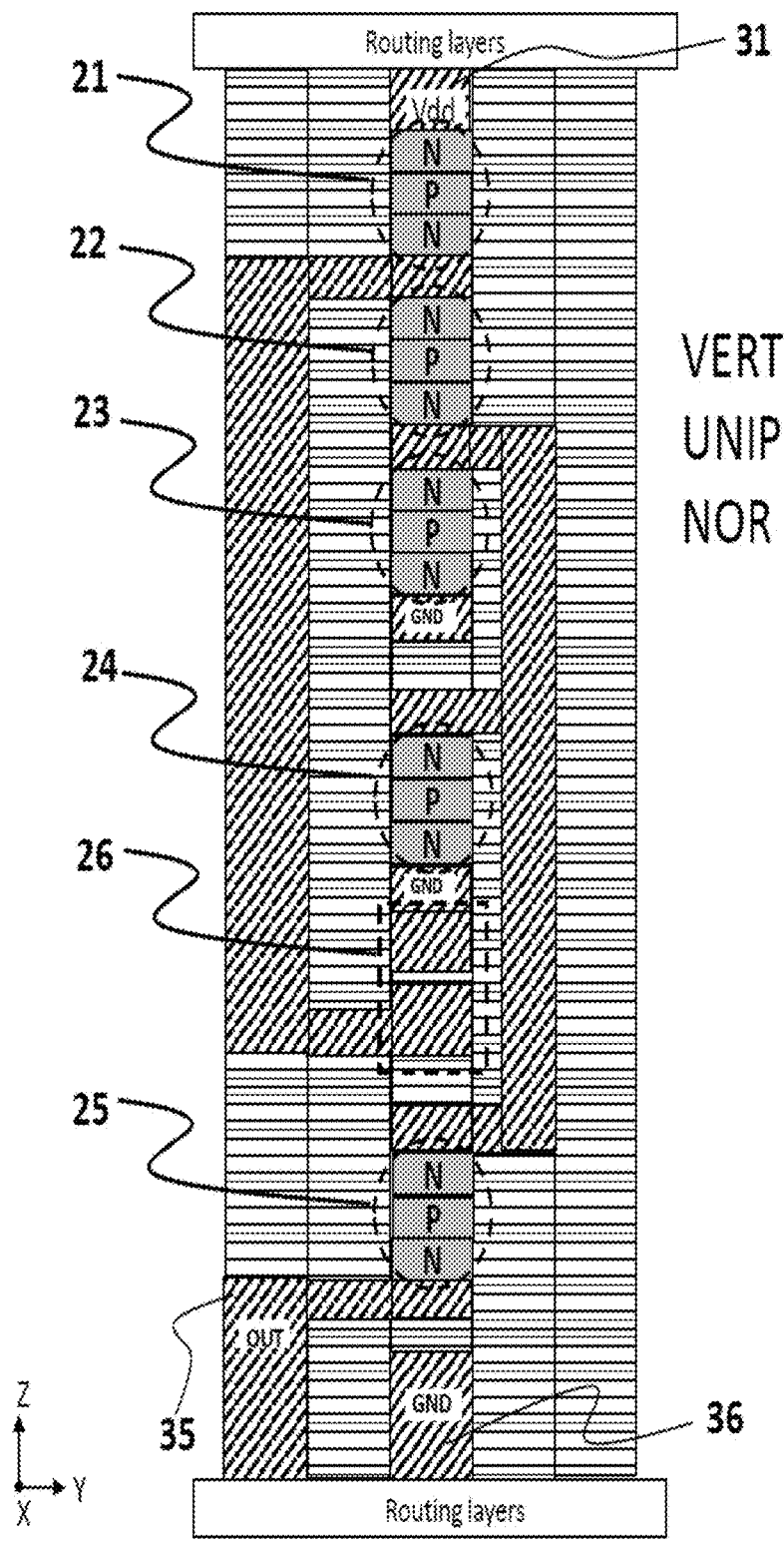

FIG. 6C and FIG. 6D are cross-sectional views of a vertical structure of a unipolar precharged NOR gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6C and 6D are cross-sectioned in quadrature planes (planes whose normal vectors are orthogonal to one another). Both FIGS. 6C and 6D section through an active column (e.g., a column of semiconductor material in which active devices can be fabricated). The semiconductor layers of transistors (21, 22, 23, 24 and 25) of FIG. 1C are all fabricated in a single stack. The transistor channel lengths are determined by deposition and not by lithography. This allows very high density circuitry and very high speed. The manufacturing methodology for fabricating the structure shown in FIG. 6C and FIG. 6D can be similar to methods employed by the flash memory industry for making 3D NAND and other 3D non-volatile memory devices. The gates of the transistors may be of the surrounding gate type thereby permitting better performance.

Figure 6E:
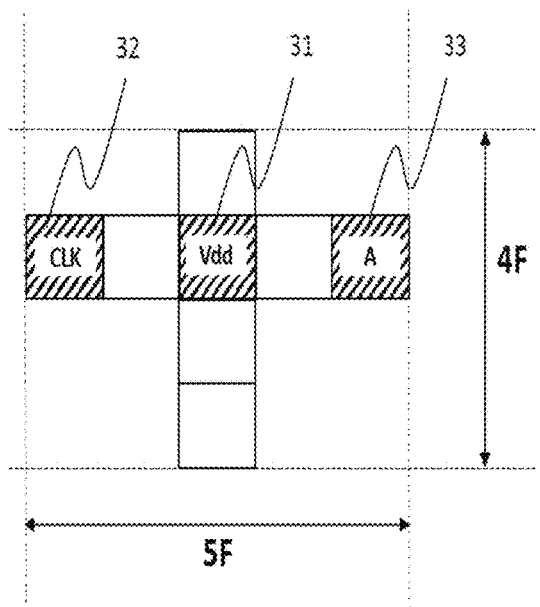
Figure 6F:
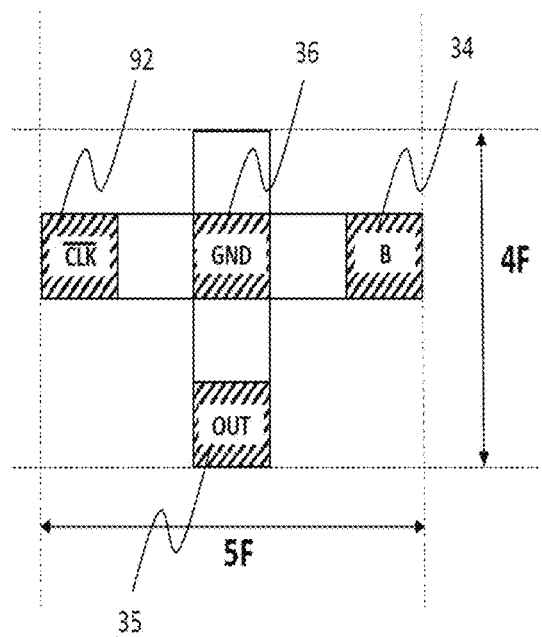
Figure 6G:
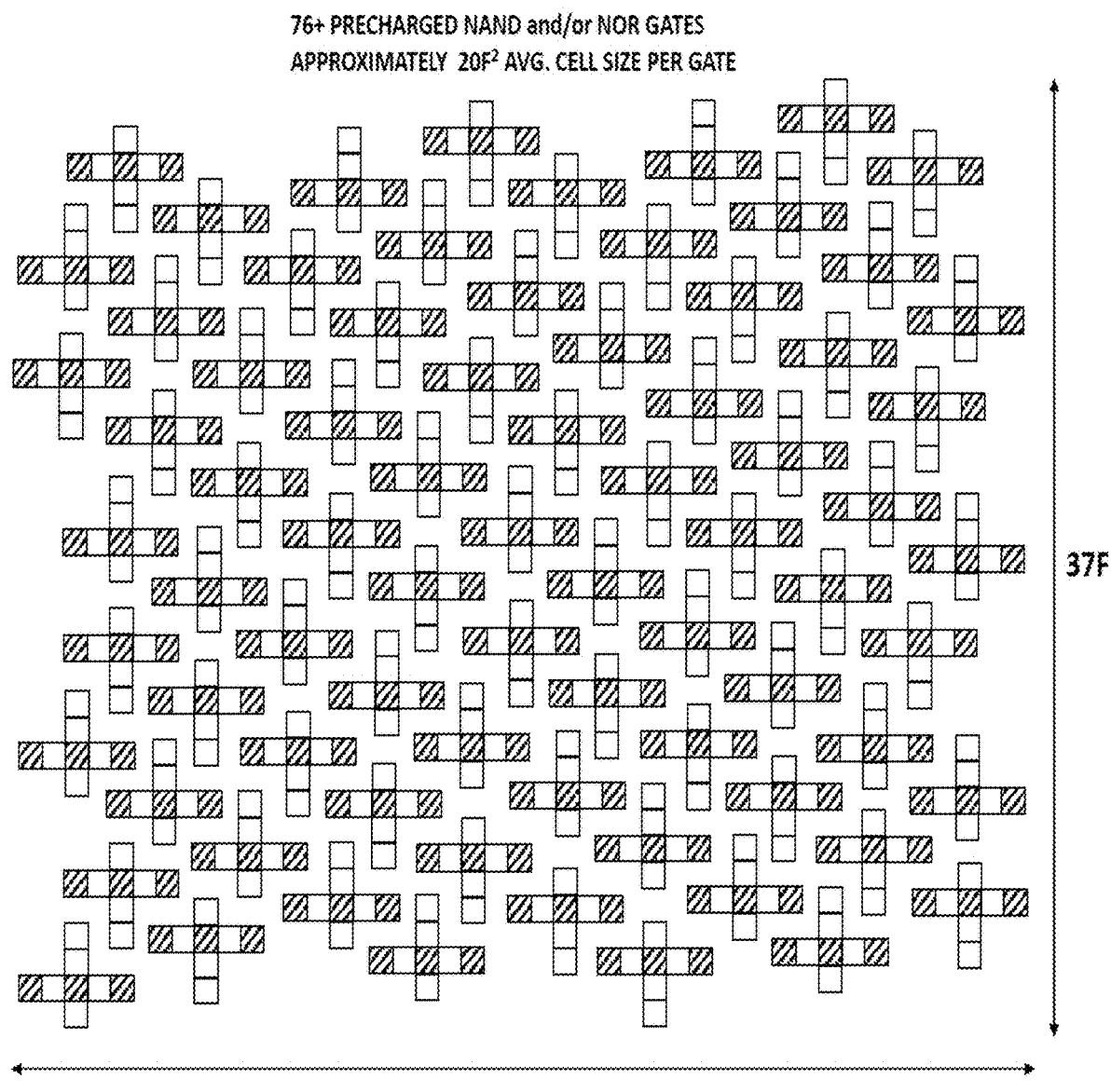

FIG. 6E is a top view of the top layer connections of a vertical unipolar precharged NAND or NOR gate according to an embodiment of the present invention and FIG. 6F is a top view of the bottom layer connections of a vertical unipolar precharged NAND or NOR gate according to an embodiment of the present invention. FIGS. 6E and 6F depict the top and bottom views, respectively, of the vertical structure of a unipolar precharged NAND or NOR gate depicted in FIGS. 6A-6B or FIGS. 6C-6D respectively. Connections for gate routing may be made to the vertical gates either from above or below the structure. To maximize density, the output (35) is made from the bottom only in FIG. 6F. Alternatively, output (35) may be routed to the top (not shown), however, that may increase the gate cell area. Other arrangements of connections may also be made without departing from the spirit of the invention. FIG. 6G is an illustration of one method of creating an array of Vertical Unipolar Precharged NAND and/or NOR Gates with an average cell size approximately equal to 20 $F^2$ according to an embodiment of the present invention. Other orientations than shown in FIG. 6G may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation.

Figure 6H:
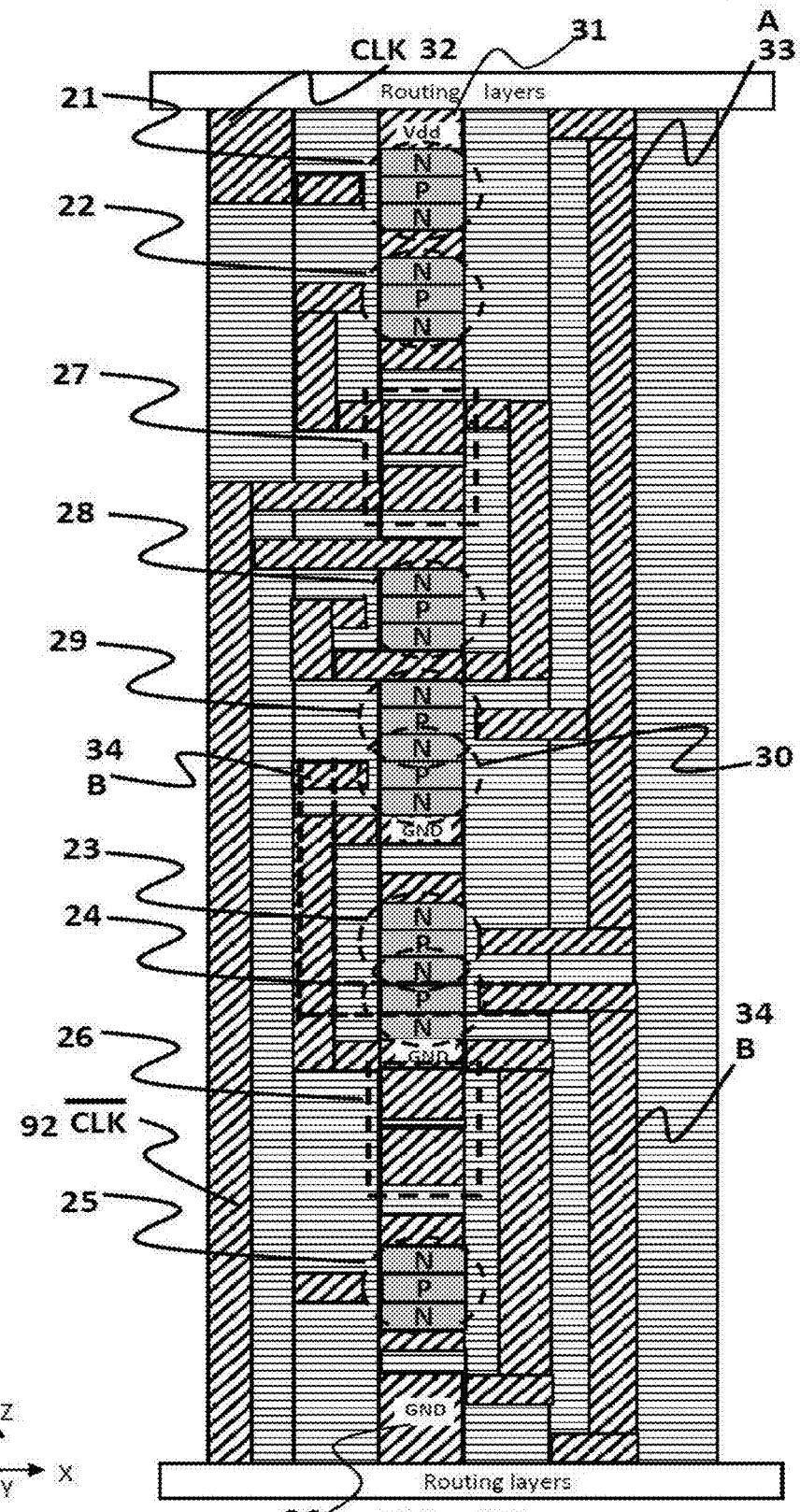
Figure 6I:
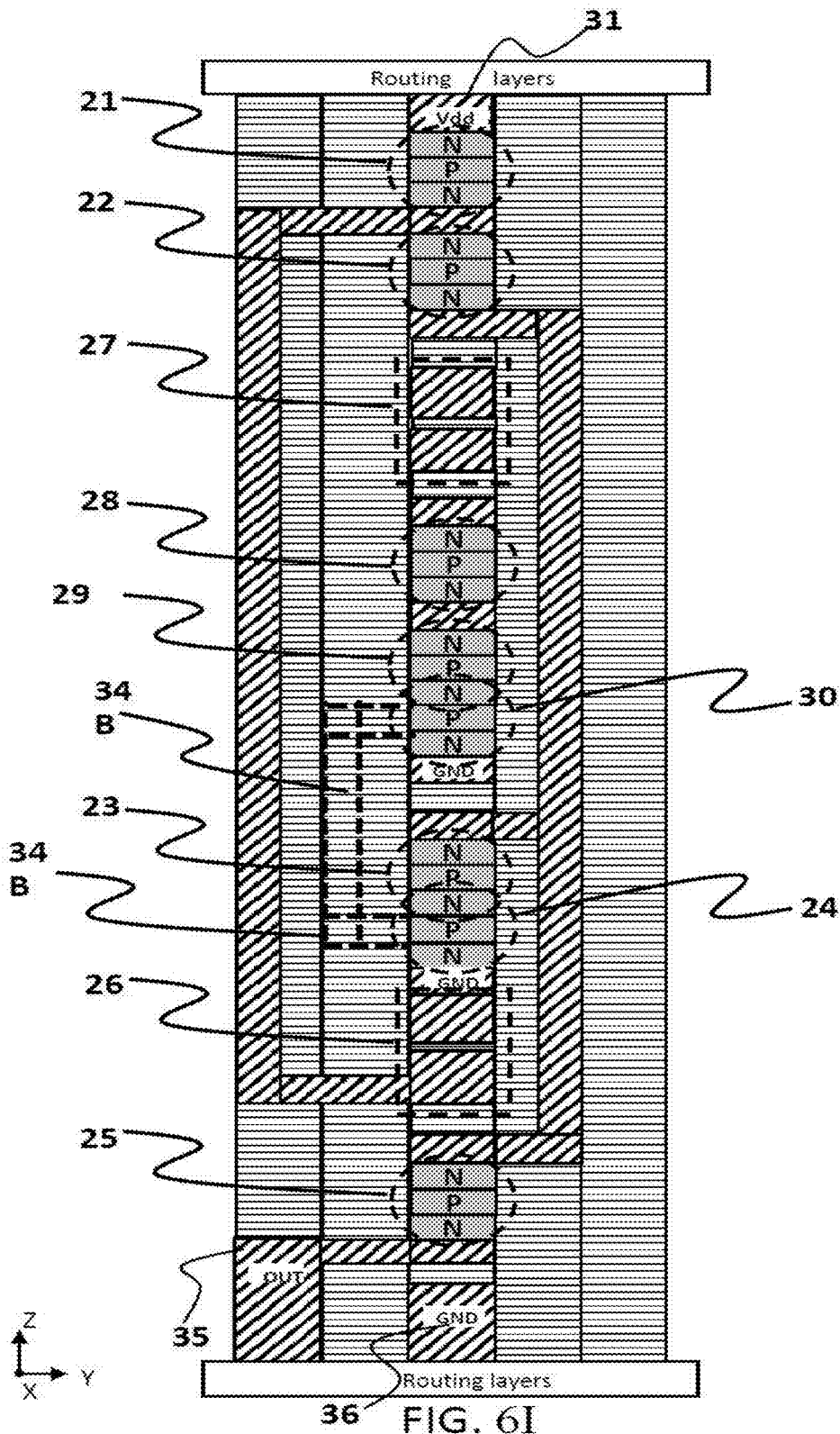

FIG. 6H and FIG. 6I are cross-sectional views of a vertical structure of a unipolar precharged NAND gate low power circuit according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6H and 6I are cross-sectioned in quadrature planes (planes whose normal vectors are orthogonal to one another). Both FIGS. 6H and 6I section through an active column (e.g., a column of semiconductor material in which active devices can be fabricated). The semiconductor layers of transistors (21, 22, 23, 24, 25, 28, 29 and 30) of FIG. 1B and capacitor (27) are all fabricated in a single stack. The transistor channel lengths are determined by deposition and not by lithography. This allows very high density circuitry and very high speed. The manufacturing methodology for fabricating the structure shown in FIG. 6H and FIG. 6I can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors as are transistors (29) and (30); alternatively, one may separate the transistors and connect them with a metal interconnect.

Figure 6J:
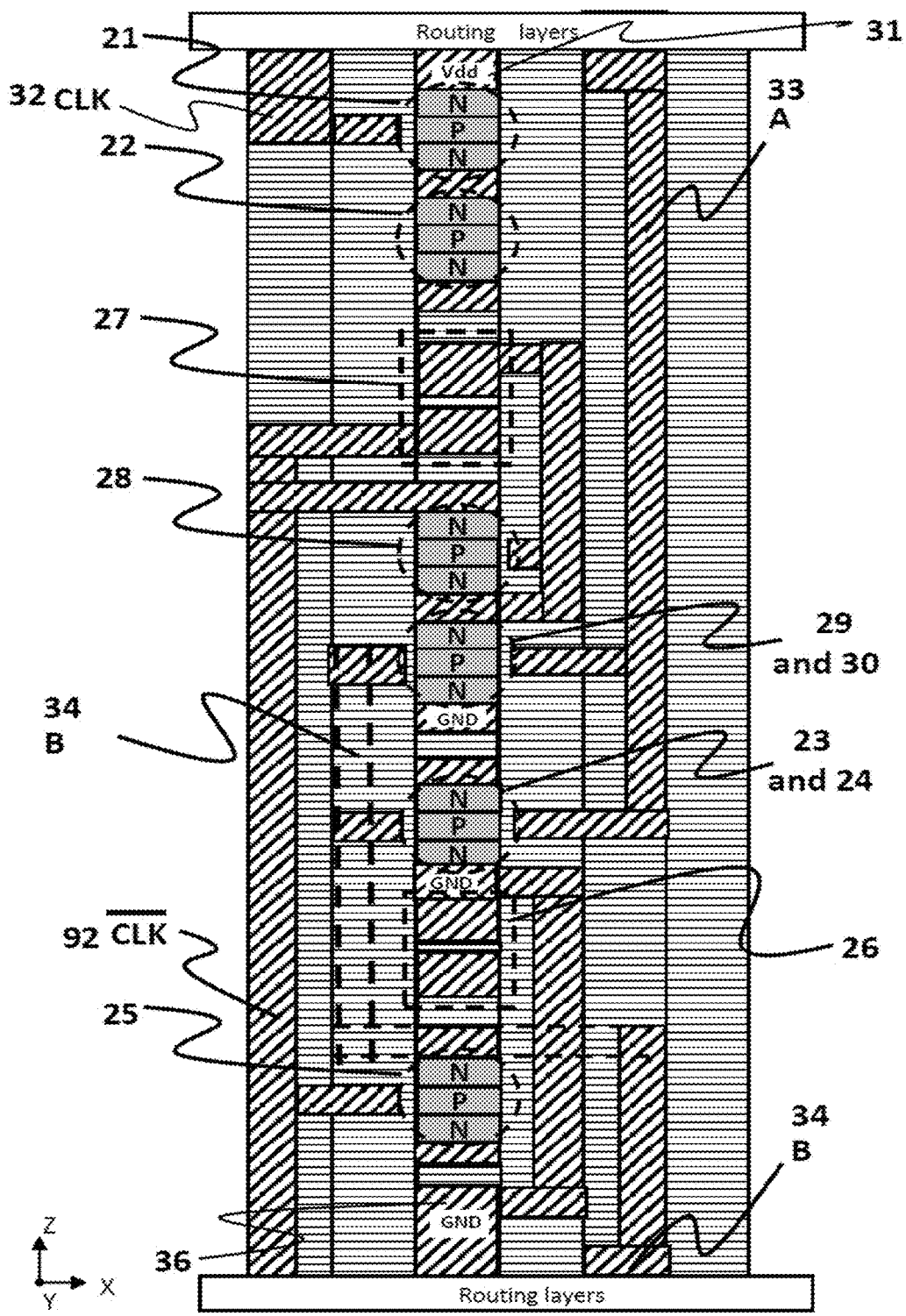
Figure 6K:
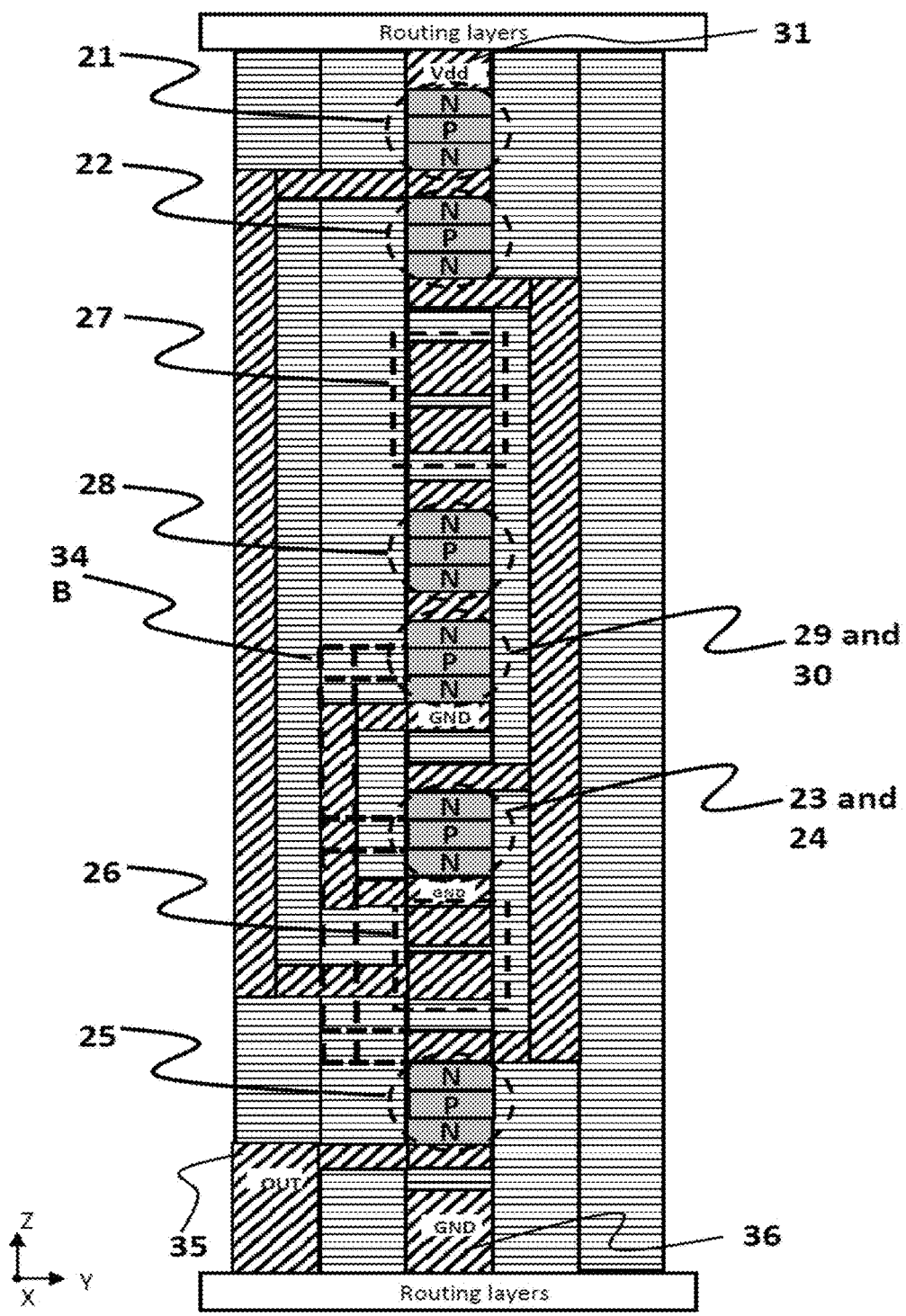

FIG. 6J and FIG. 6K are cross-sectional views of a vertical structure of a unipolar precharged NOR gate low power circuit according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6J and 6K are cross-sectioned in quadrature planes (planes whose normal vectors are orthogonal to one another). Both FIGS. 6J and 6K section through an active column (e.g., a column of semiconductor material in which active devices can be fabricated). The semiconductor layers of transistors (21, 22, 23, 24, 25, 28, 29, and 30) and capacitor (27) of FIG. 1D are all fabricated in a single stack. The transistor channel lengths are determined by deposition and not by lithography. This allows very high density circuitry and very high speed. The manufacturing methodology for fabricating the structure shown in FIG. 6J and FIG. 6K can be similar to methods employed by the flash memory industry for making 3D NAND and other 3D non-volatile memory devices. The gates of the transistors may be of the surrounding gate type thereby permitting better performance.

Figure 6L:
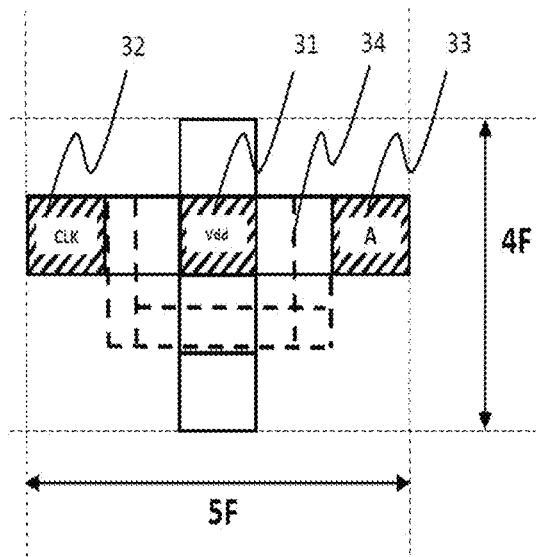
Figure 6M:
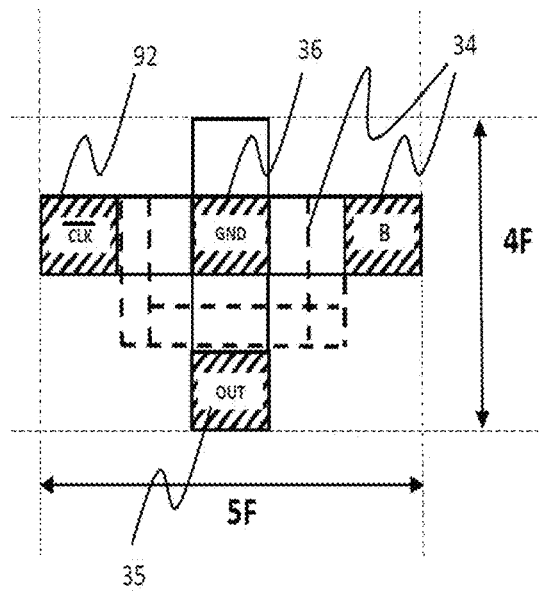
Figure 6N:
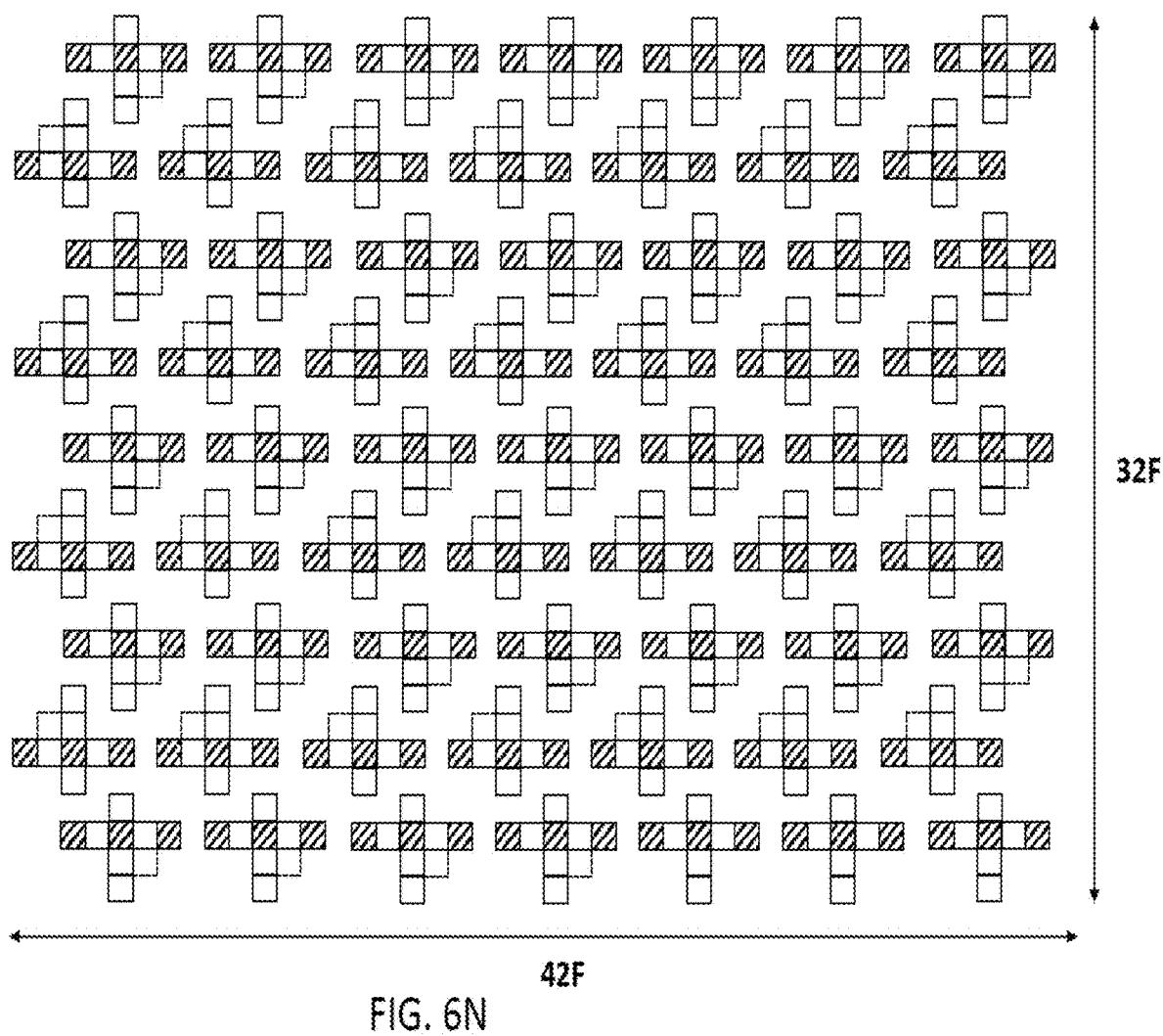

FIG. 6L is a top view of the top layer connections of a vertical unipolar precharged NAND or NOR gate low power circuits according to an embodiment of the present invention and FIG. 6M is a top view of the bottom layer connections of a vertical unipolar precharged NAND or NOR gate low power circuits according to an embodiment of the present invention. FIGS. 6L and 6M depict the top and bottom views, respectively, of the vertical structure of a unipolar precharged NAND or NOR gate low power circuits depicted in FIGS. 6H-6I or FIGS. 6J-6K respectively. Connections for gate routing may be made to the vertical gates either from above or below the structure. To maximize density, the output (35) is made from the bottom only in FIG. 6M. Alternatively, output (35) may be routed to the top (not shown), however, that may increase the gate cell area. Other arrangements of connections may also be made without departing from the spirit of the invention. FIG. 6N is an illustration of one method of creating an array of Vertical Unipolar Precharged NAND and/or NOR Gates low power circuits with an average cell size approximately equal to 24

$F^2$ according to an embodiment of the present invention. Other orientations than shown in FIG. 6N may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation. The average cell size area of the low power unipolar precharged NAND and NOR gate circuits shown in FIGS. 6H, 6I, 6J, 6K, 6L and 6M is only slightly larger (about 1-2 $F^2$) compared to the unipolar precharged NAND and NOR gate circuits shown in FIGS. 6A, 6B, 6C, 6D, 6E and 6F that do not have the additional low power circuitry employed.

Figure 6O:
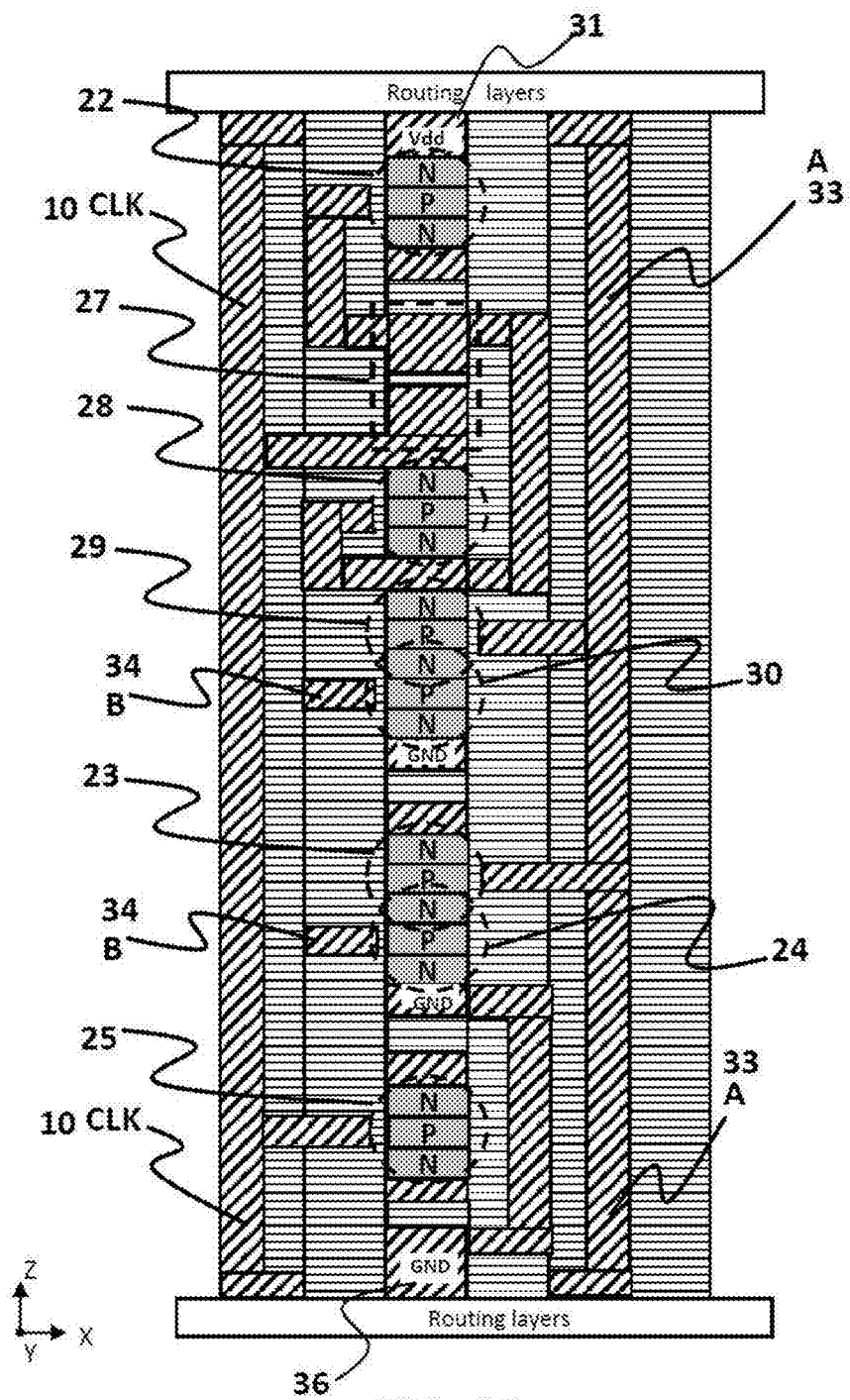
Figure 6P:
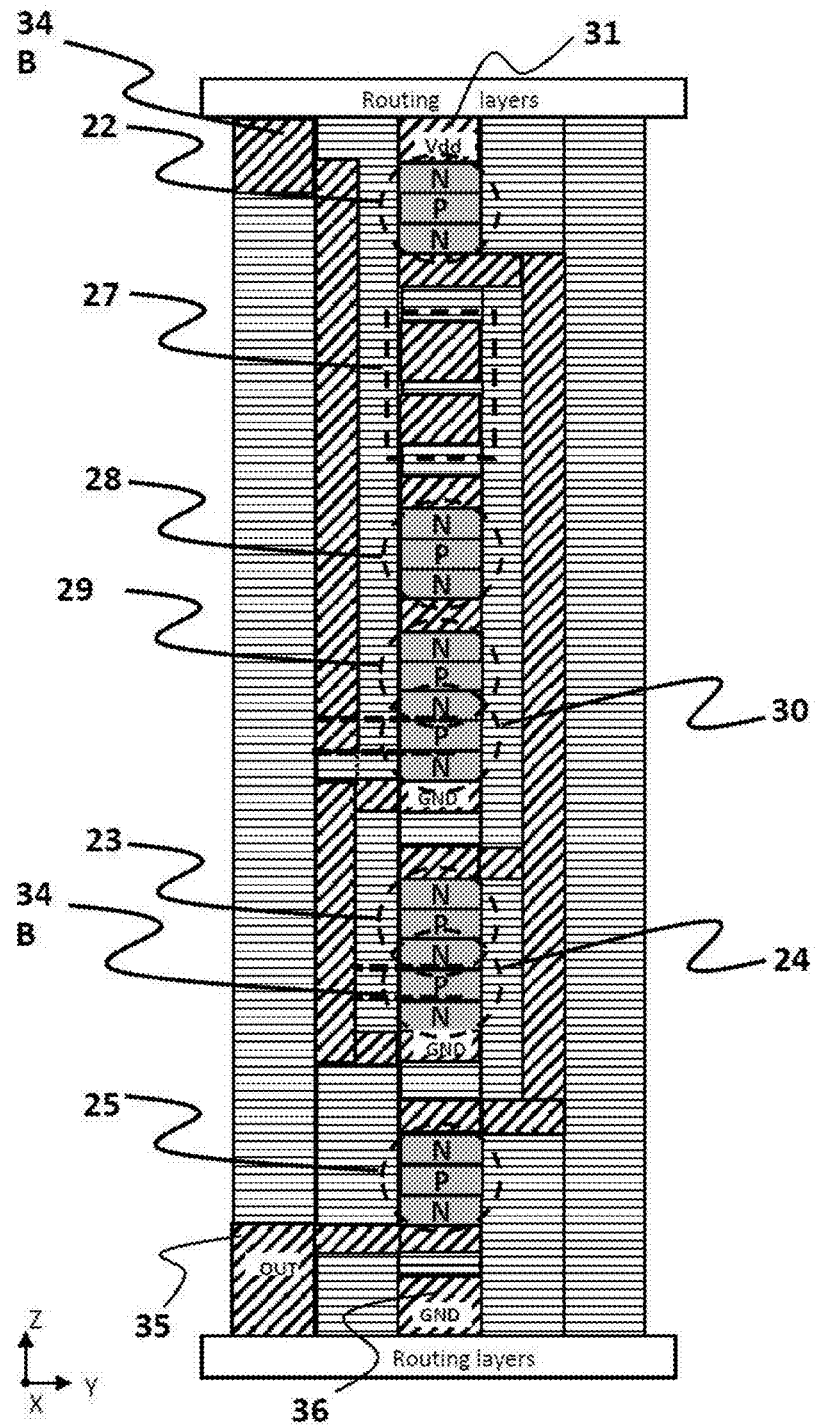

FIG. 6O and FIG. 6P are cross-section views of a vertical structure of a unipolar clocked NAND gate low power circuit single CLK per gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6O and 6P are cross-sectioned in quadrature planes (planes whose normal vectors are orthogonal to one another). Both FIGS. 6O and 6P section through an active column (e.g., a column of semiconductor material in which active devices can be fabricated). The semiconductor layers of transistors (22, 23, 24, 25, 28, 29 and 30) of FIG. 1E and capacitor (27) are all fabricated in a single stack. The transistor channel lengths are determined by deposition and not by lithography. This allows very high density circuitry and very high speed. The manufacturing methodology for fabricating the structure shown in FIG. 6O and FIG. 6P can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors as are transistors (29) and (30); alternatively, one may separate the transistors and connect them with a metal interconnect.

Figure 6Q:
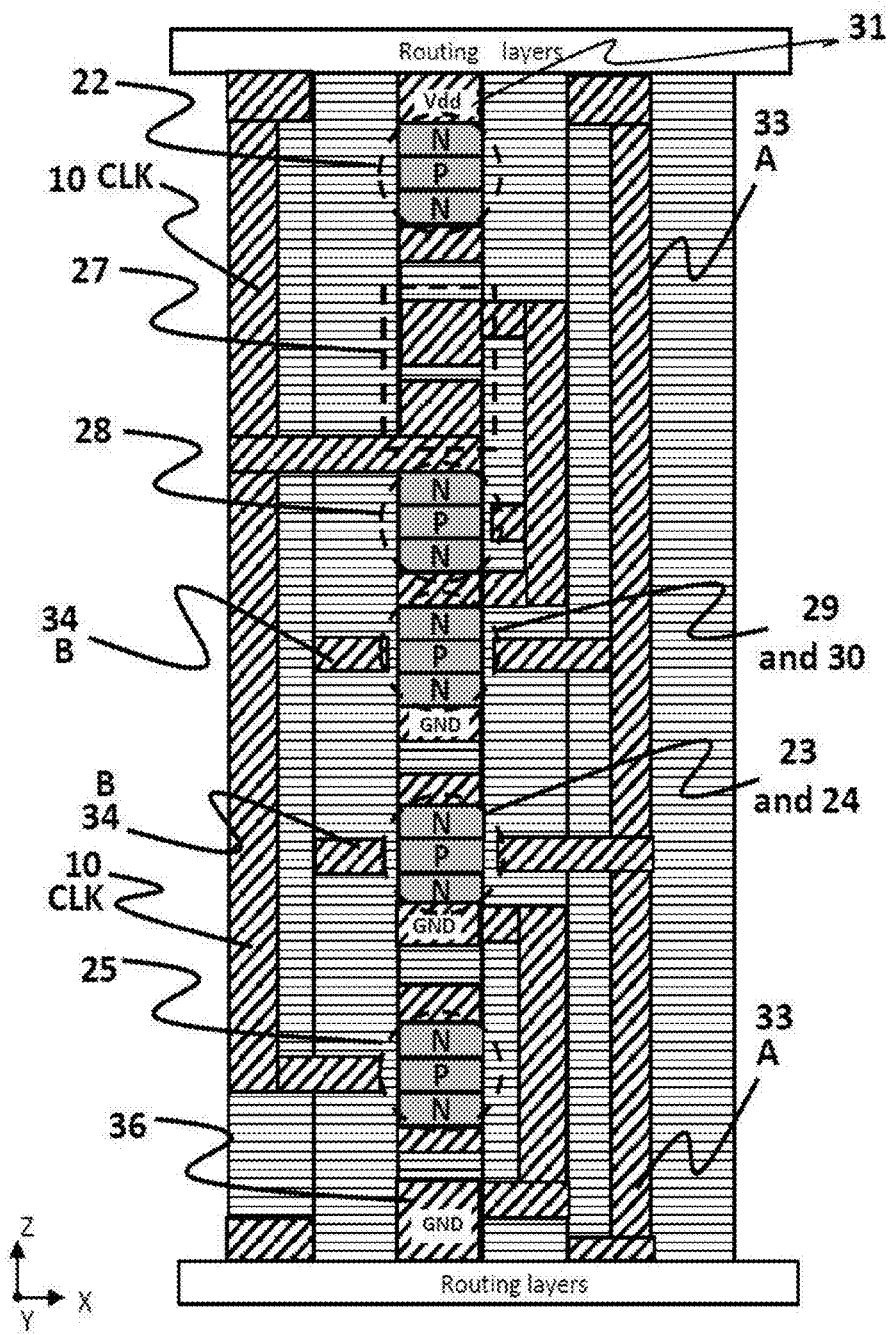
Figure 6R:
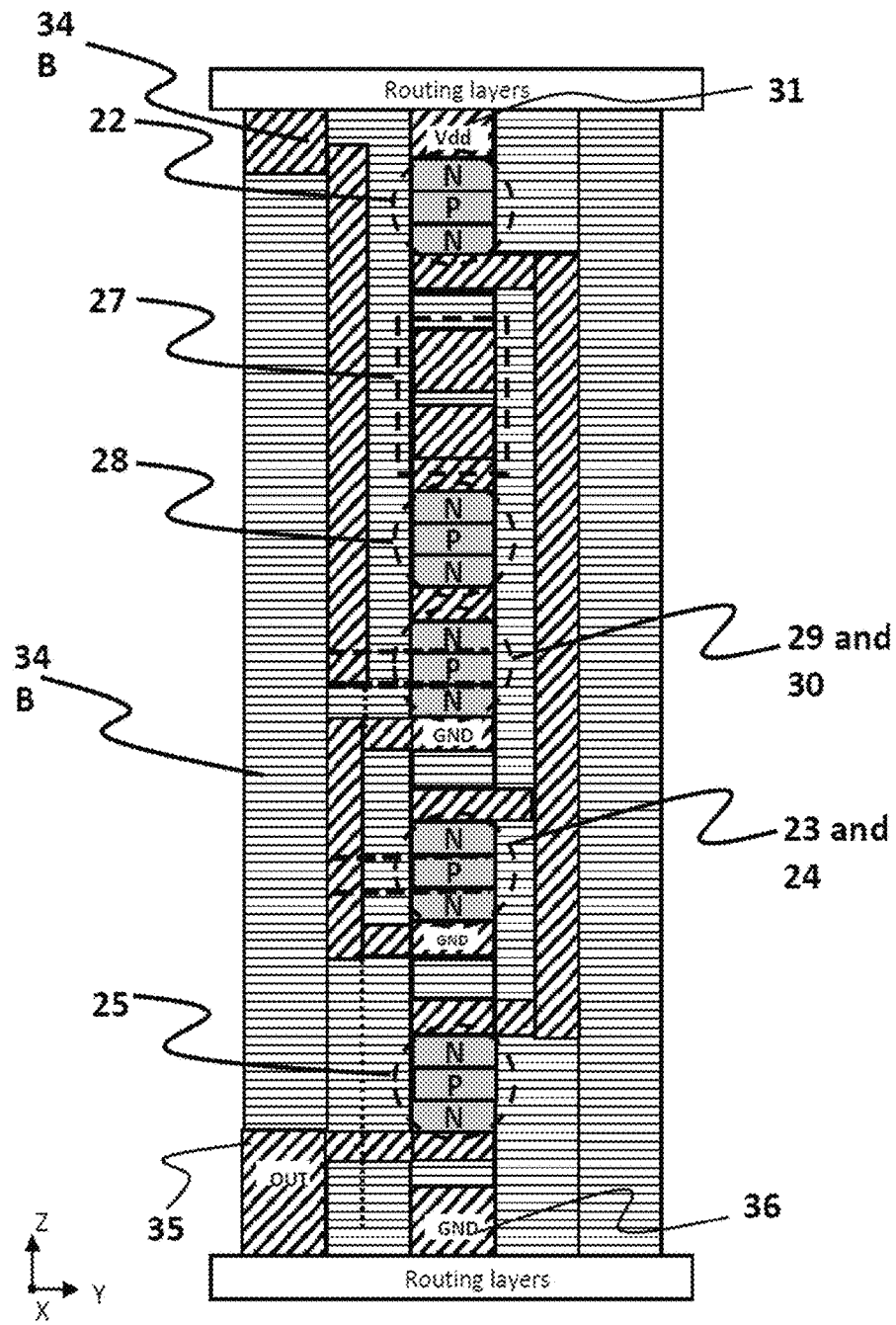
Figure 6S:
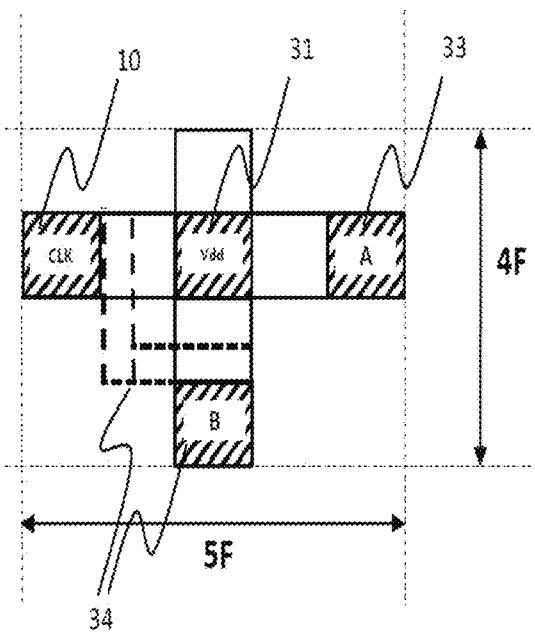
Figure 6T:
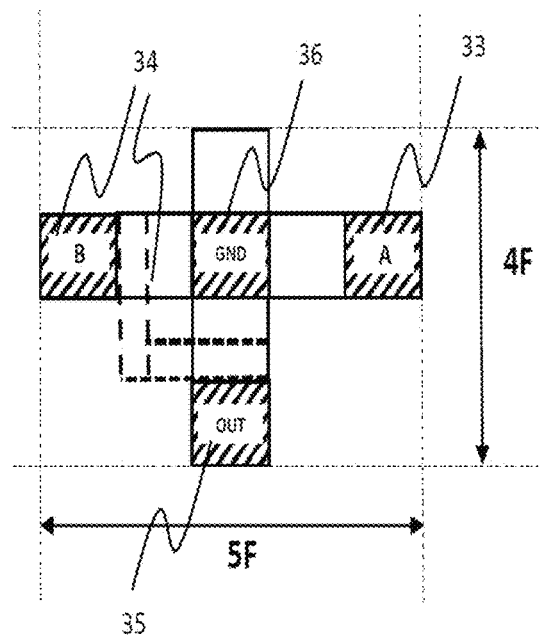
Figure 6U:
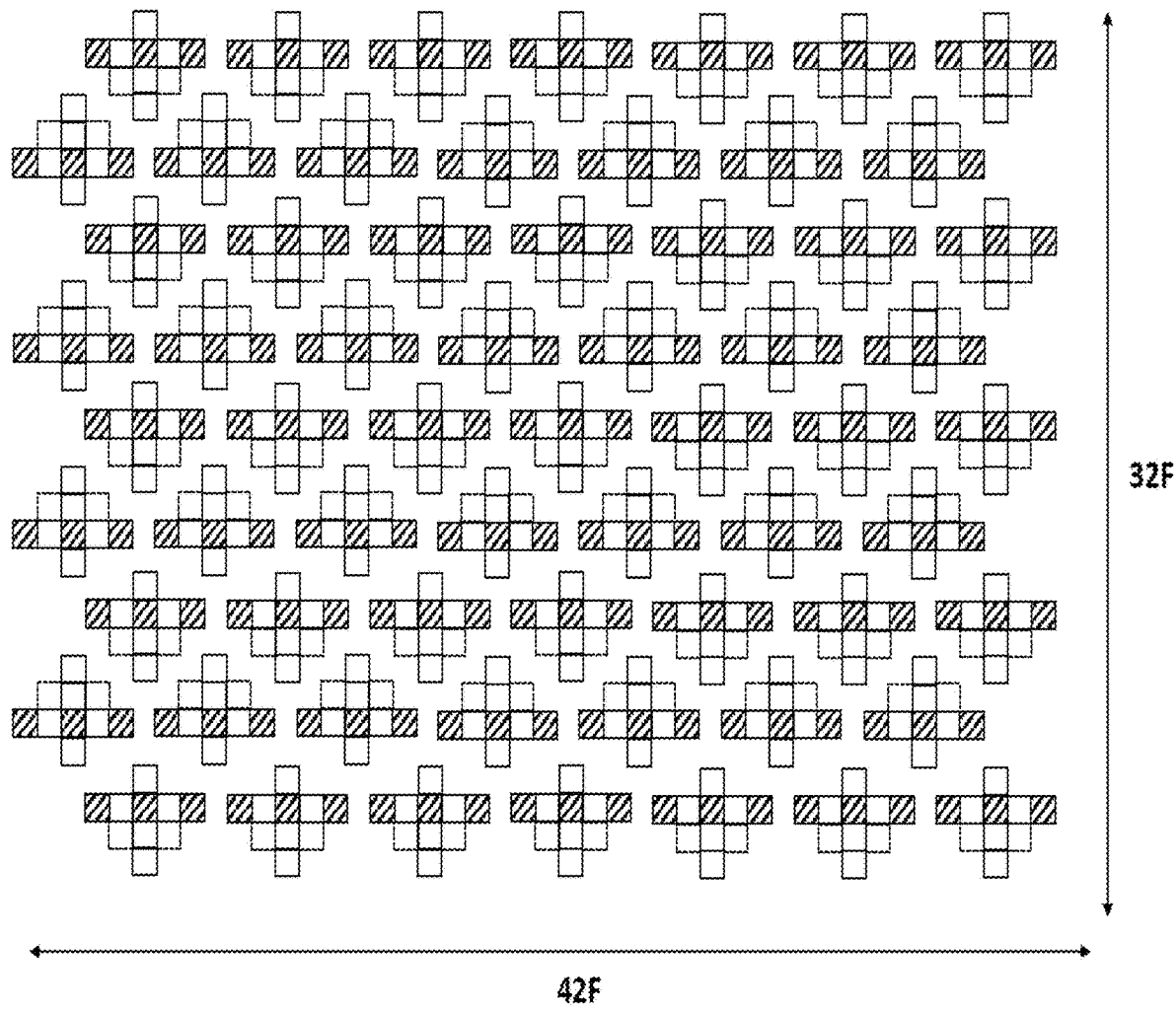
Figure 6V:
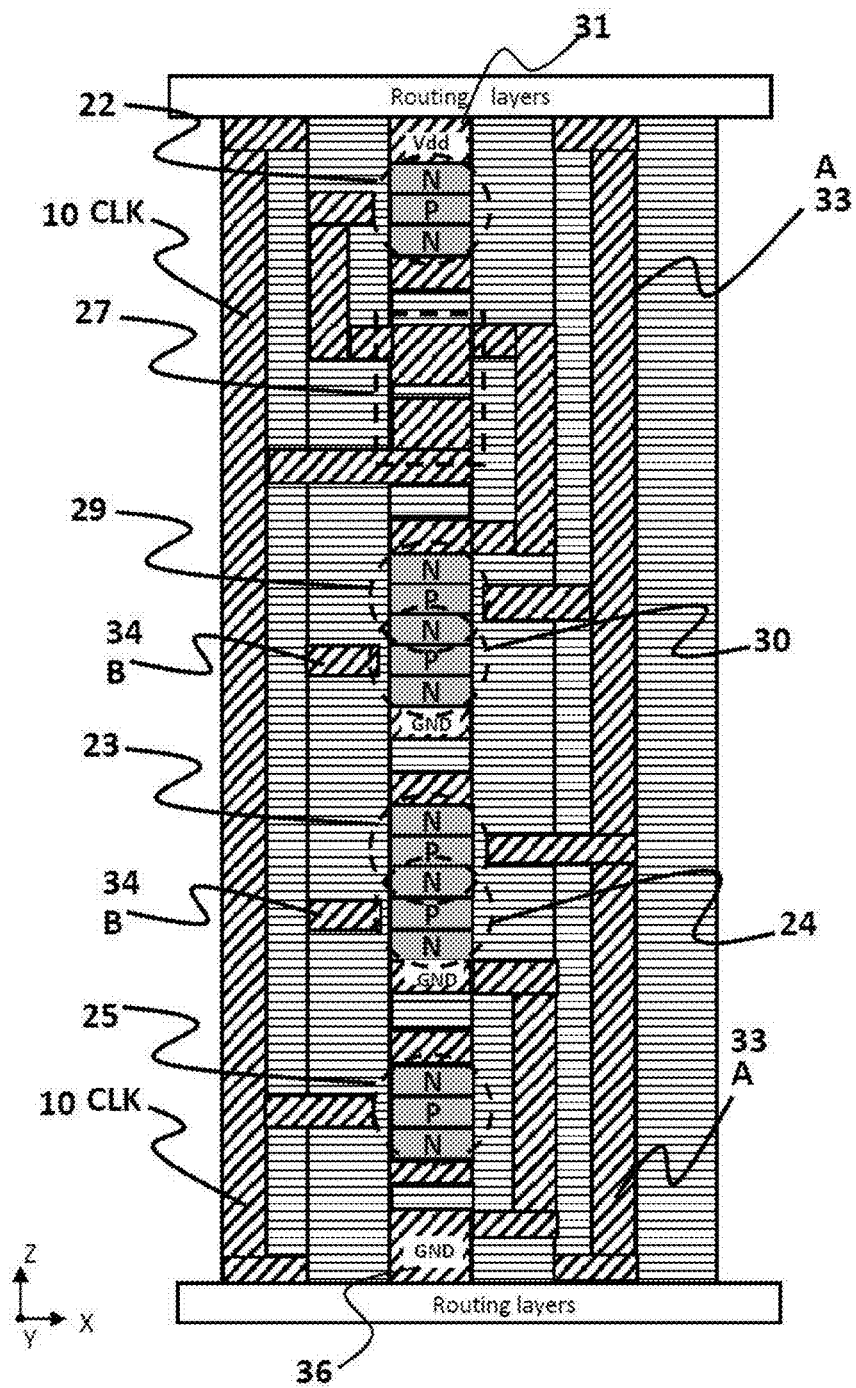
Figure 6W:
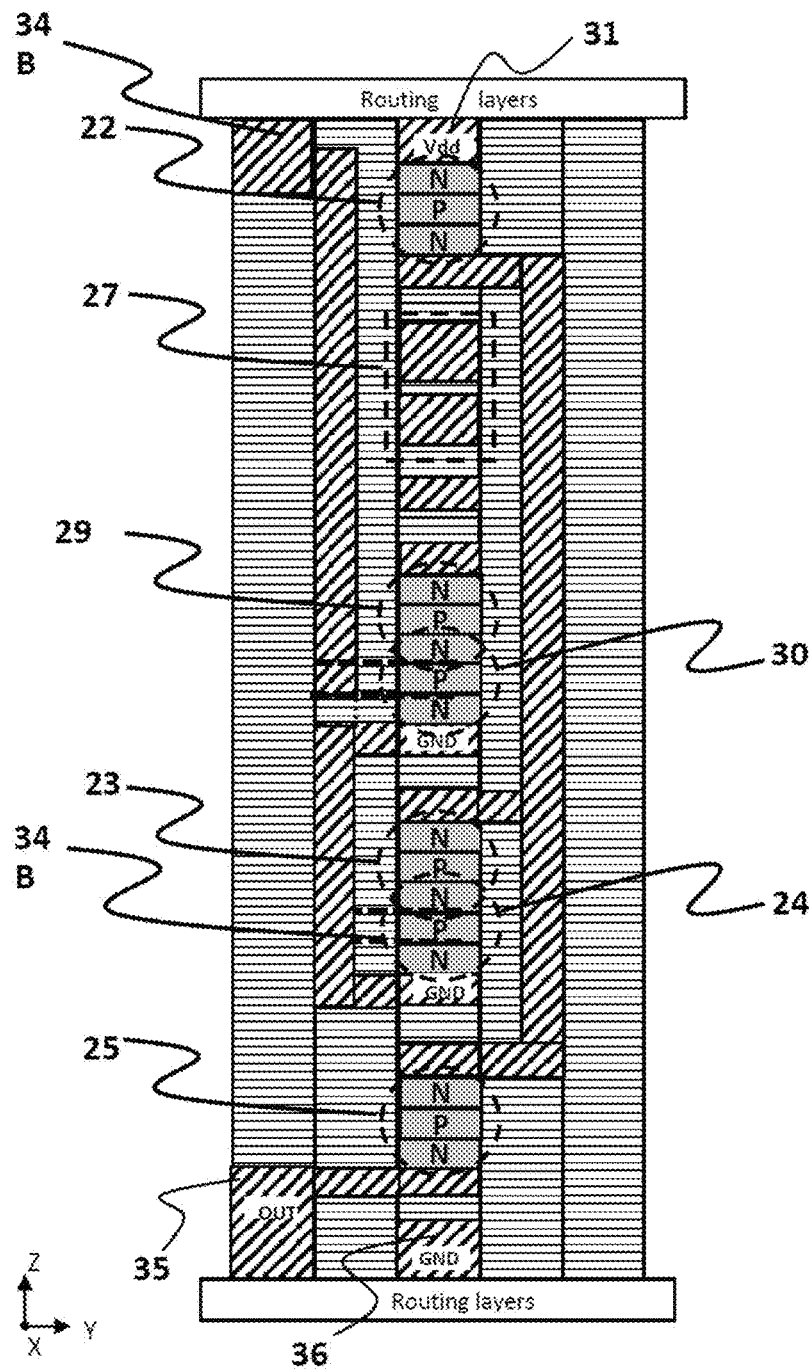

FIG. 6V and FIG. 6W are cross-section views of a vertical structure of a unipolar clocked NAND gate low power circuit single CLK per gate according to an embodiment of the present invention. This structure is a simplified NAND gate whereby transistor (28) is eliminated due to the edge rate of the clock and the value of the capacitor (27) will cause the gate voltage on transistor (22) to be sufficient without requiring transistor (28). This structure, representing the circuit shown in FIG. 1I, reduces the number of layers compared to FIG. 6O and FIG. 6P, which represents the circuit in FIG. 1E, and hence, would lower the cost of fabrication.

FIG. 6Q and FIG. 6R are cross-section views of a vertical structure of a unipolar clocked NOR gate low power circuit single CLK per gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6Q and 6R are cross-sectioned in quadrature planes (planes whose normal vectors are orthogonal to one another). Both FIGS. 6Q and 6R section through an active column (e.g., a column of semiconductor material in which active devices can be fabricated). The semiconductor layers of transistors (22, 23, 24, 25, 28, 29, and 30) and capacitor (27) of FIG. 1F are all fabricated in a single stack. The transistor channel lengths are determined by deposition and not by lithography. This allows very high density circuitry and very high speed. The manufacturing methodology for fabricating the structure shown in FIG. 6Q and FIG. 6R can be similar to methods employed by the flash memory industry for making 3D NAND and other 3D non-volatile memory devices. The gates of the transistors may be of the surrounding gate type thereby permitting better performance.

Figure 6X:
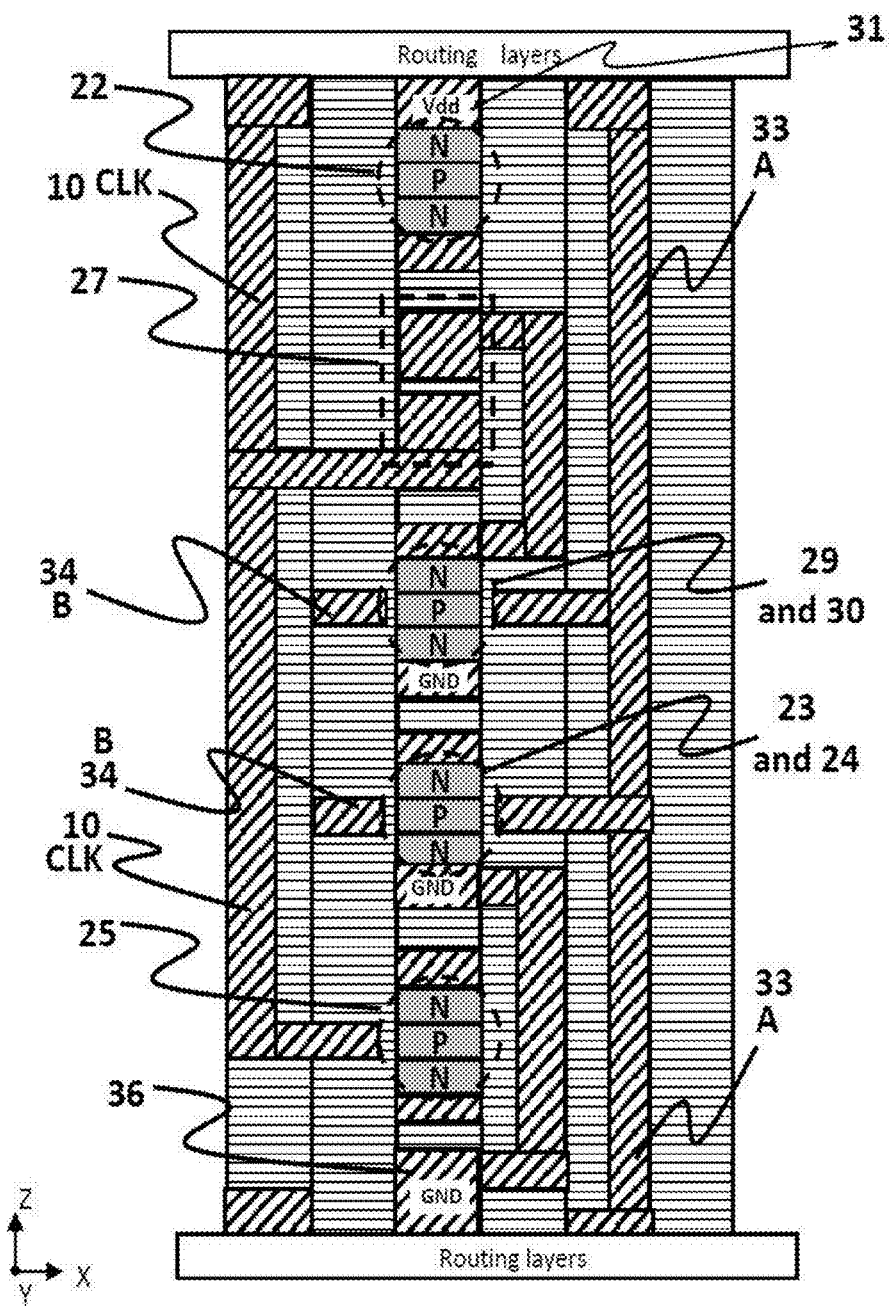
Figure 6Y:
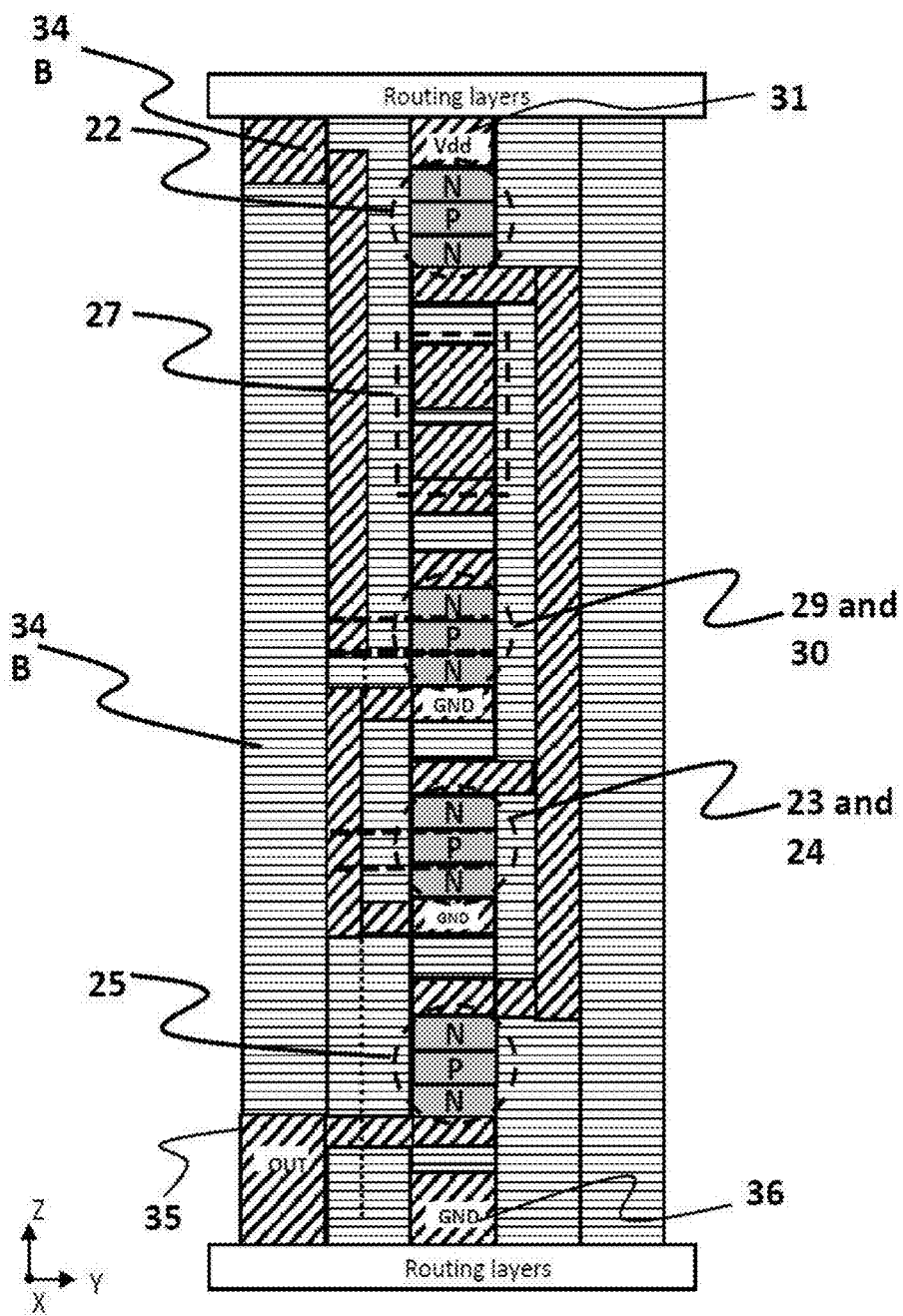

FIG. 6X and FIG. 6Y are cross-section views of a vertical structure of a unipolar clocked NOR gate low power circuit single CLK per gate according to an embodiment of the present invention. This structure is a simplified NOR gate whereby transistor (28) is eliminated due to the edge rate of the clock and the value of the capacitor (27) will cause the gate voltage on transistor (22) to be sufficient without requiring transistor (28). This structure, representing the circuit shown in FIG. 1J, reduces the number of layers compared to FIG. 6Q and FIG. 6R, which represents the circuit in FIG. 1F, and hence, would lower the cost of fabrication.

FIG. 6S is a top view of the top layer connections of a vertical unipolar clocked NAND or NOR gate low power circuits, one CLK per gate, according to an embodiment of the present invention and FIG. 6T is a top view of the bottom layer connections of a vertical unipolar clocked NAND or NOR gate low power circuits, one CLK per gate, according to an embodiment of the present invention. FIGS. 6S and 6T depict the top and bottom views, respectively, of the vertical structure of a unipolar clocked NAND or NOR gate low power circuits, one CLK per gate, depicted in FIGS. 1E and 6O-6P, FIGS. 1F and 6Q-6R, FIGS. 1I and 6V-6W, or FIGS. 1J and 6X-6Y. Connections for gate routing may be made to the vertical gates either from above or below the structure. To maximize density, the output (35) is made from the bottom only in FIG. 6T. Alternatively, output (35) may be routed to the top (not shown), however, that may increase the gate cell area. Other arrangements of connections may also be made without departing from the spirit of the invention.

FIG. 6U is an illustration of one method of creating an array of Vertical Unipolar Clocked NAND and/or NOR Gates low power circuits, one CLK per gate, with an average cell size approximately equal to 24 $F^2$ according to an embodiment of the present invention. Other orientations than shown in FIG. 6U may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation. The average cell size area of the low power clocked NAND and NOR gate circuits, one CLK per gate, shown in FIGS. 6O, 6P, 6Q, 6R, 6S, 6T, 6V, 6W, 6X and 6Y is only slightly larger (about 1-2 $F^2$) compared to the NAND and NOR gate circuits shown in FIGS. 6A, 6B, 6C, 6D, 6E and 6F that do not have the additional low power circuitry employed. A further advantage of the unipolar clocked gate circuits shown in FIGS. 6O, 6P, 6Q, 6R, 6S, 6T, 6V, 6W, 6X and 6Y is that both inputs A (33) and B (34) are accessible for connection from either the top (above) or bottom (below) of the gate structure. This provides great flexibility in design and minimizes the probability of circuit designs from being routing limited as opposed to gate limited.

Figure 7:
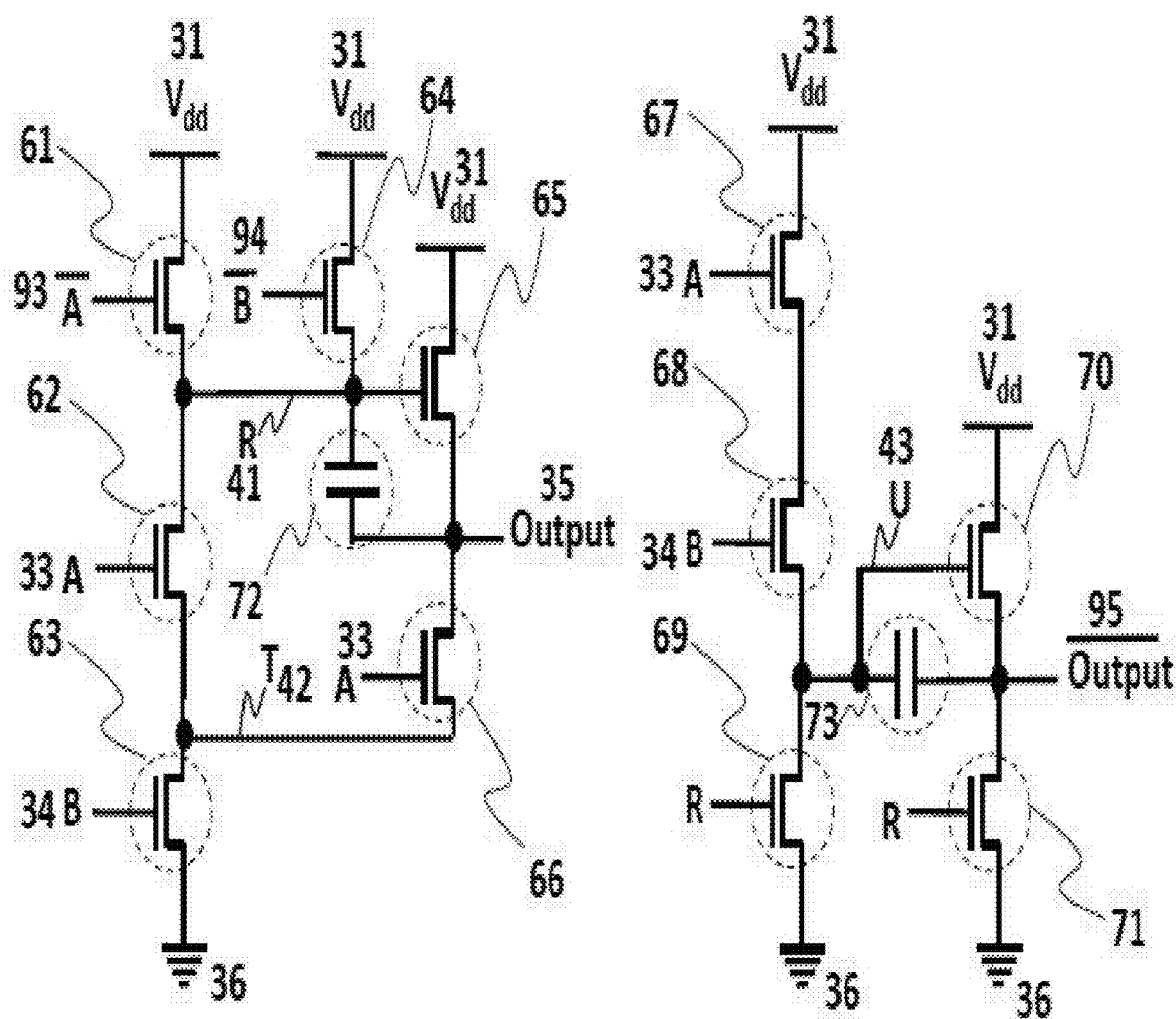

FIG. 7 is a schematic diagram of a Unipolar Bootstrap NAND Gate Circuit according to an embodiment of the present invention. Transistors (61, 62, 63 and 64) together represent a standard unipolar NAND gate. The problem with standard a unipolar NAND gate is that the output of the gate only goes to one threshold voltage (Vt) below the input voltage. After a few gates of propagation the signal will completely degrade. To solve this, transistor (65) and capacitor (72) are added to the circuit. Transistor (65) starts to turn on when node R (41) goes to the threshold voltage (Vt). Output (35) will not rise until transistor (65) has started to turn on. Therefore, output (35) will be one threshold voltage (Vt) below the voltage on R (41) when output (35) begins to rise. As Output (35) rises, the threshold voltage (Vt) will be manifested across capacitor (72). Therefore, capacitor (72) will cause the voltage on R (41) to ultimately rise to one Vt above the output. Transistor (66) isolates the pull down from R (41). Similarly, transistors (67, 68, 69, 70 and 71) and capacitor (73) implement the inverse operation to provide the AND Output (95).

Figure 8A:
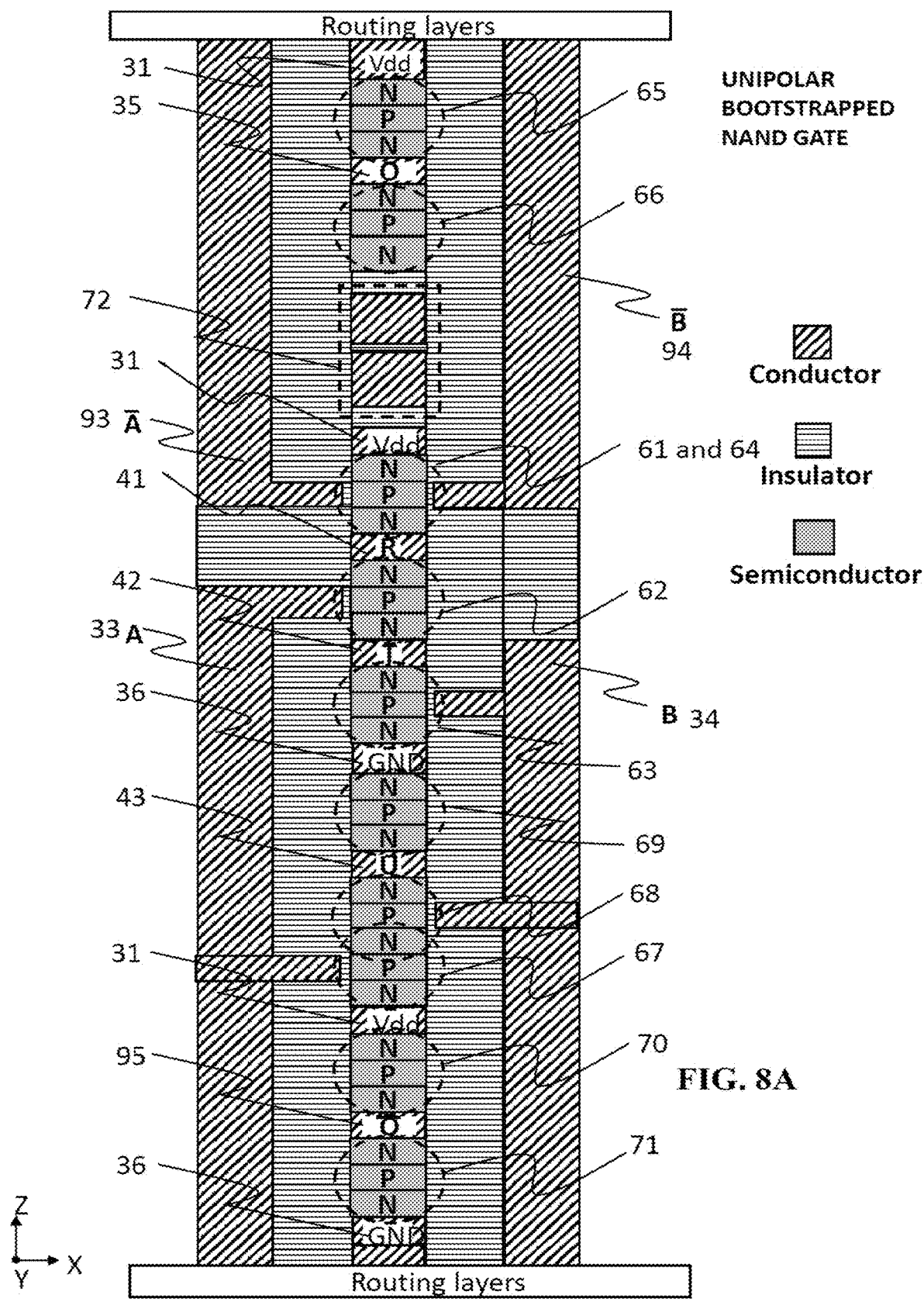
Figure 8B:
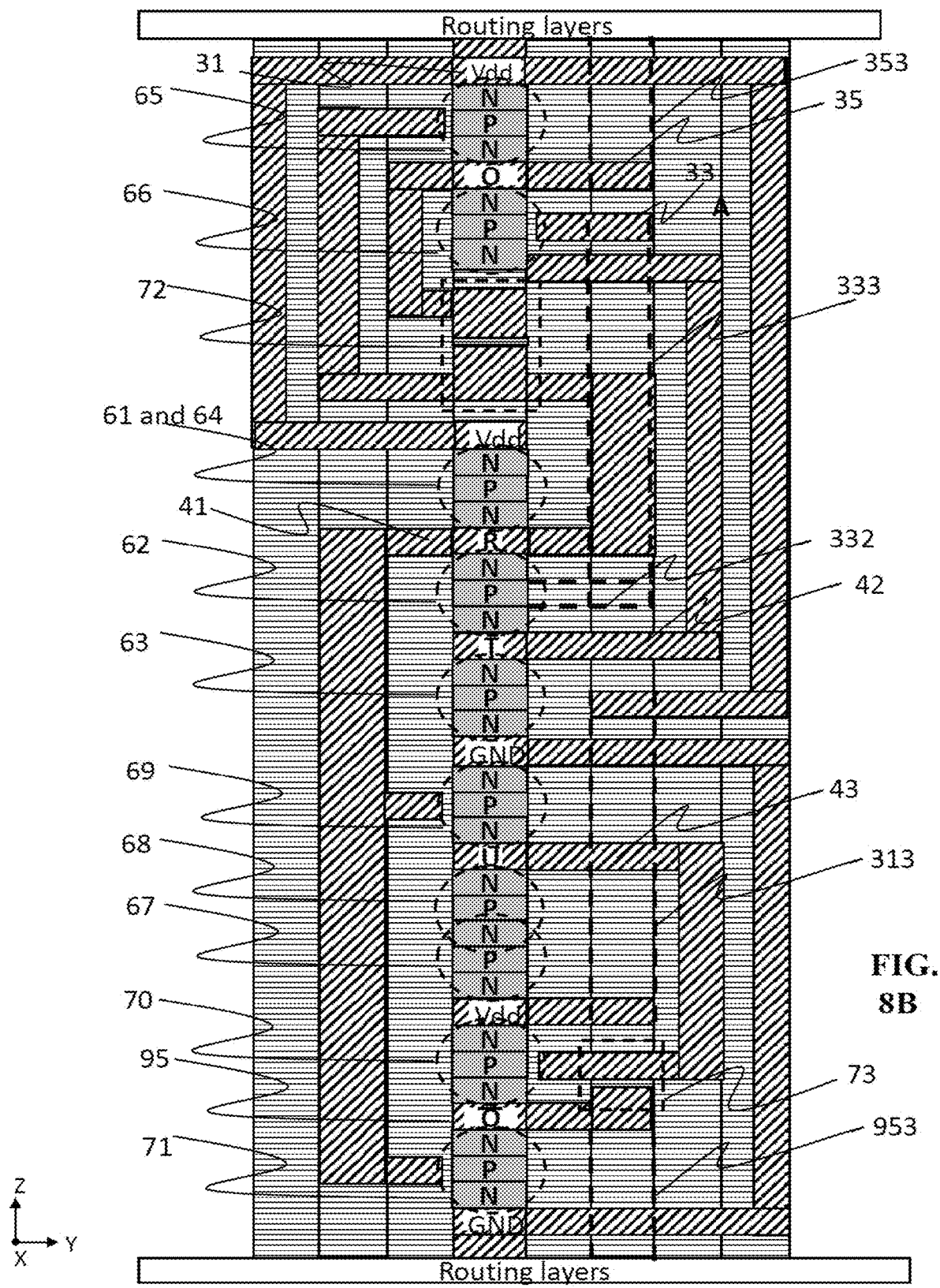

FIG. 8A and FIG. 8B are cross section views of a Vertical Structure of a Unipolar Bootstrapped NAND Gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 8A and 8B are cross-sectioned in quadrature planes (planes whose normal vectors are orthogonal to one another). Both FIGS. 8A and 8B section through an active column (e.g., a column of semiconductor material in which active devices can be fabricated). The semiconductor layers of transistors (61, 62, 63, 64, 65, 66, 67, 68, 69, 70, and 71) and capacitor (72) of FIG. 7 are all fabricated in a single stack. The transistor channel lengths are determined by deposition and not by lithography. This allows very high density circuitry and very high speed. The manufacturing methodology for fabricating the structure shown in FIG. 8A and FIG. 8B is similar to methods employed by the NAND flash industry for making 3D NAND devices. The gates of the transistors may be of the surround gate type thereby allowing better performance. Transistors (67) and (68) are shown to have a common N-type layer in between the transistors; alternatively, one may separate the transistors and connect them with a metal interconnect. Transistors (61 and 64) are represented as one transistor stack with dual gate inputs for $\overline{A}$ (93) and $\overline{B}$ (94).

Figure 8C:
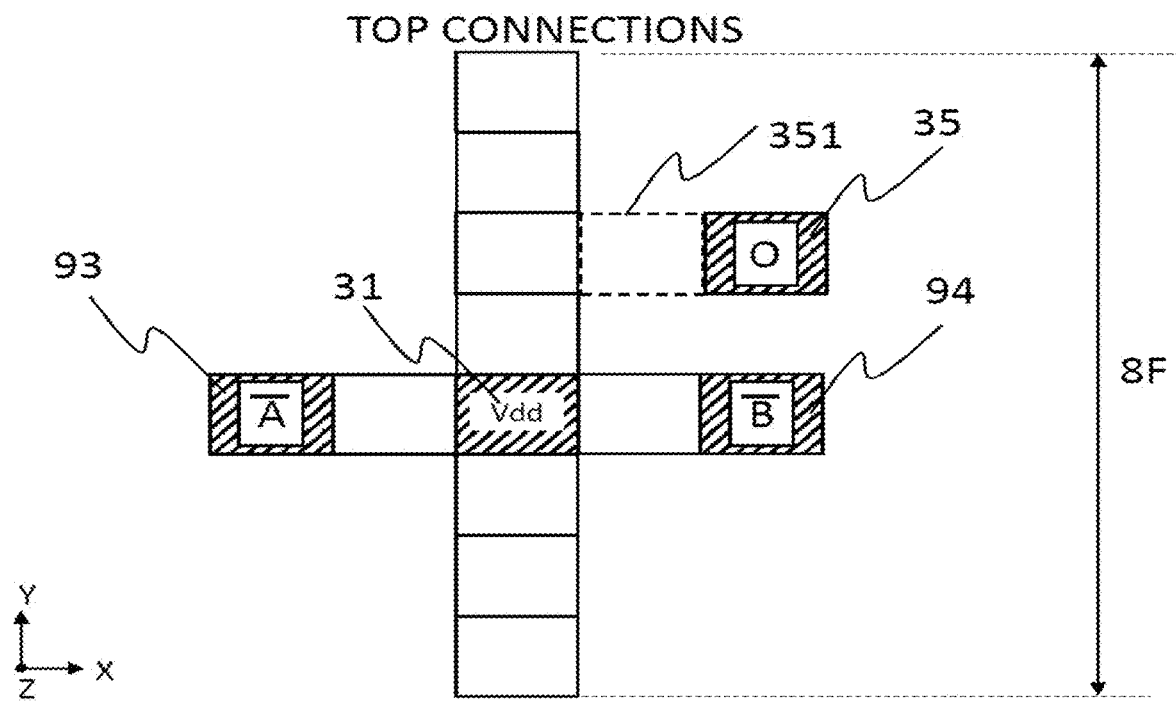
Figure 8D:
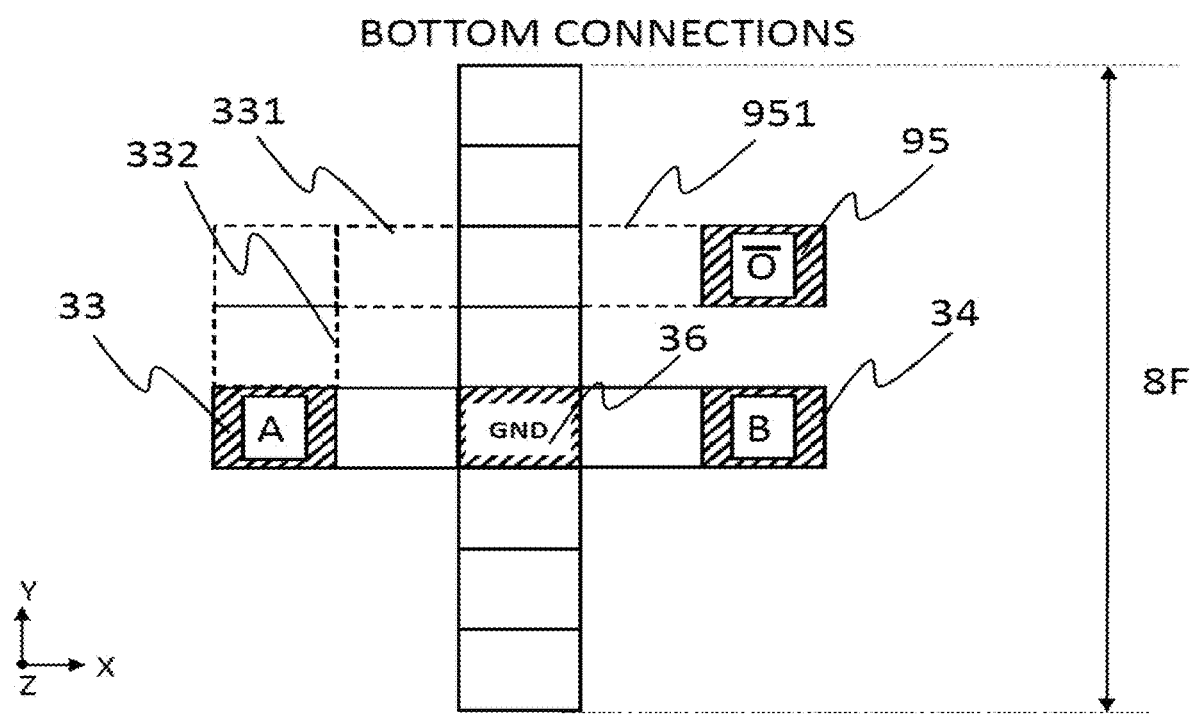
Figure 8E:
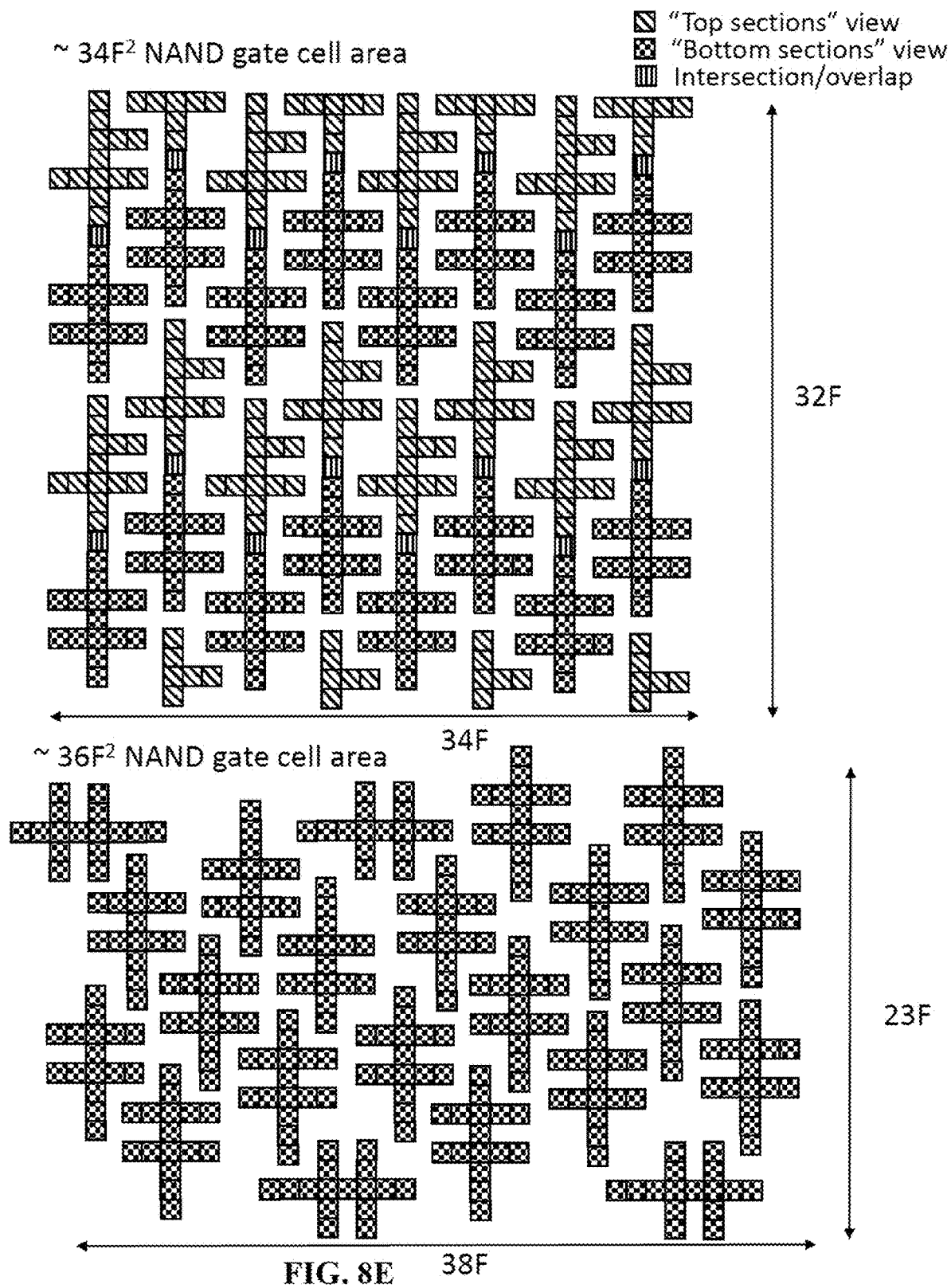

FIG. 8C is a top view of the Top Layer Connections of a Vertical Unipolar Bootstrapped NAND Gate according to an embodiment of the present invention and FIG. 8D is a top view of the Bottom Layer Connections of a Vertical Unipolar Bootstrapped NAND Gate according to an embodiment of the present invention. FIGS. 8C and 8D depict the top and bottom views, respectively, of the vertical structure of a unipolar bootstrapped NAND gate depicted in FIGS. 8A-8B. Connections for gate routing may be made to the vertical gates either from above or below the structure. Other arrangements of connections may also be made without departing from the spirit of the invention. FIG. 8E is an illustration of one method of creating an array of Vertical Unipolar Bootstrapped NAND Gates with average cell sizes ranging from approximately 34 $F^2$ to 36 $F^2$ according to an embodiment of the present invention. Other orientations than shown in FIG. 8E may be designed including flipping a portion or all of the gates in the X, Y, or Z direction. This is a factor of about 3 times smaller compared to conventional planar CMOS logic. In addition to a large increase in density, the short interconnect between logic gates provides for much faster speed of operation.

Figure 9A:
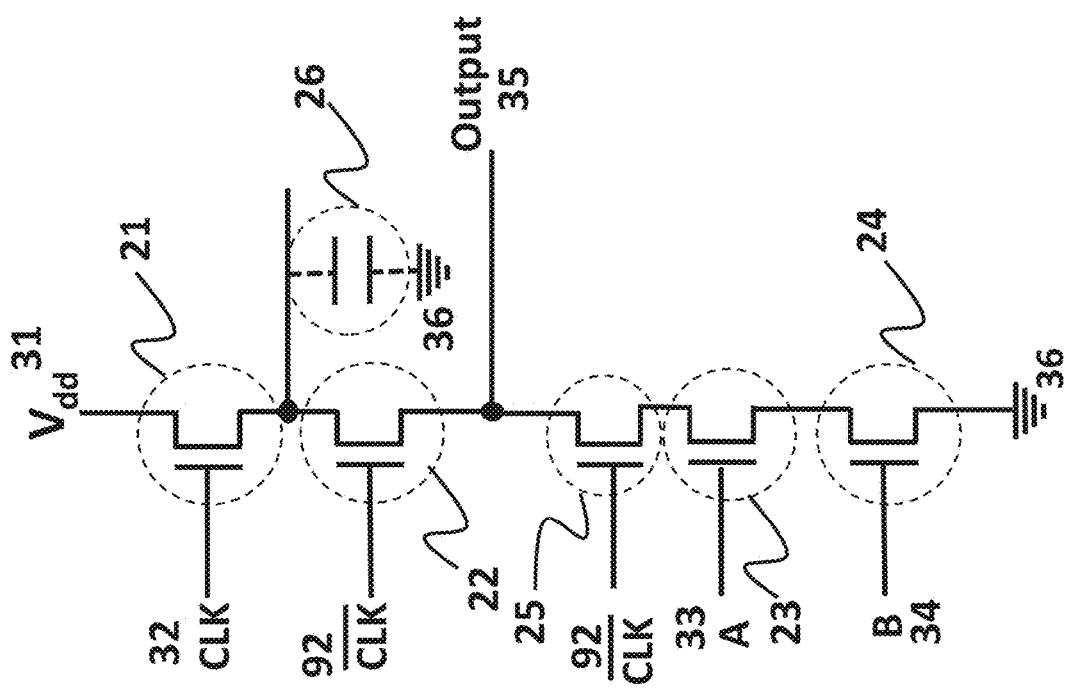
Figure 9B:
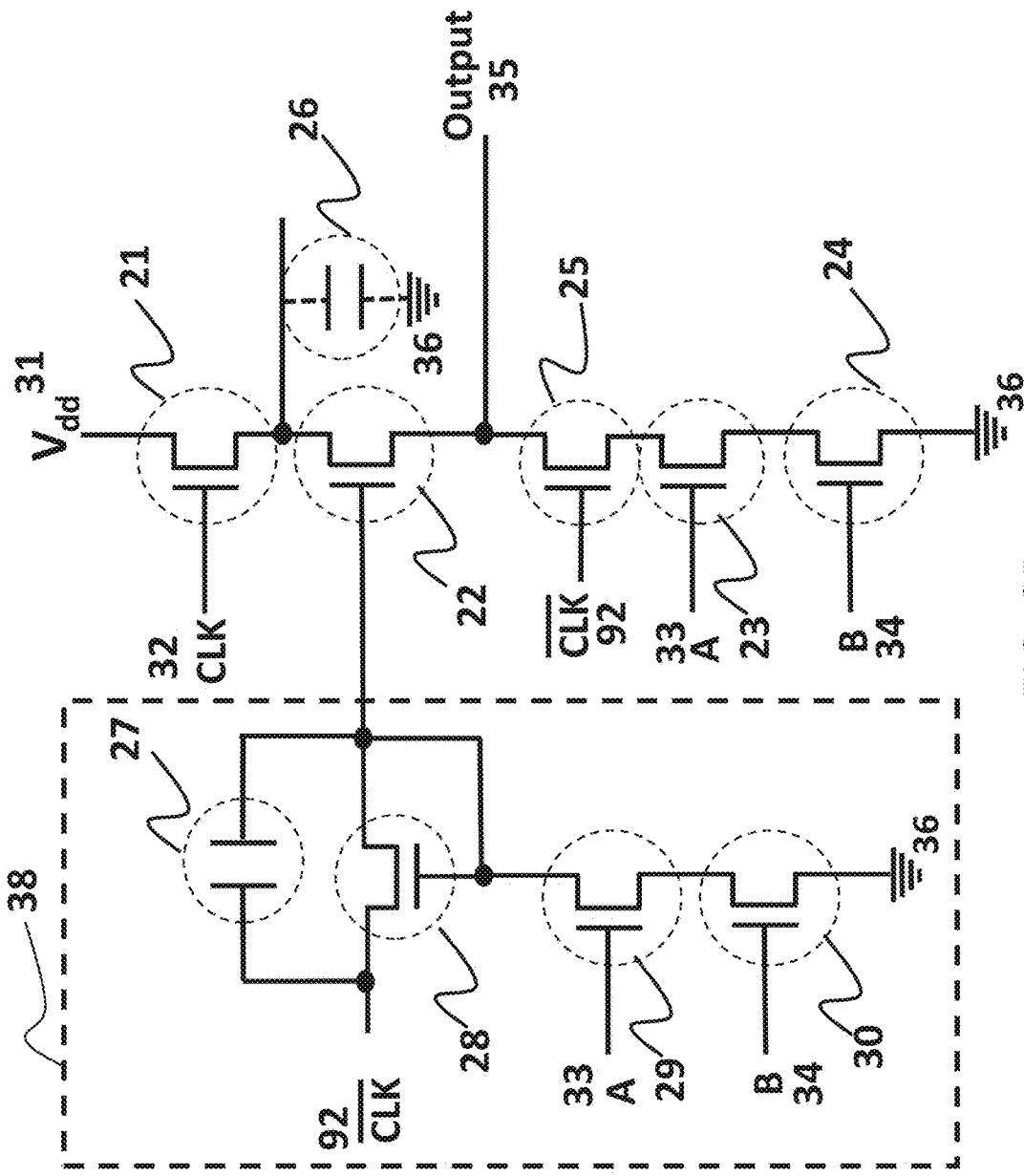
Figure 9C:
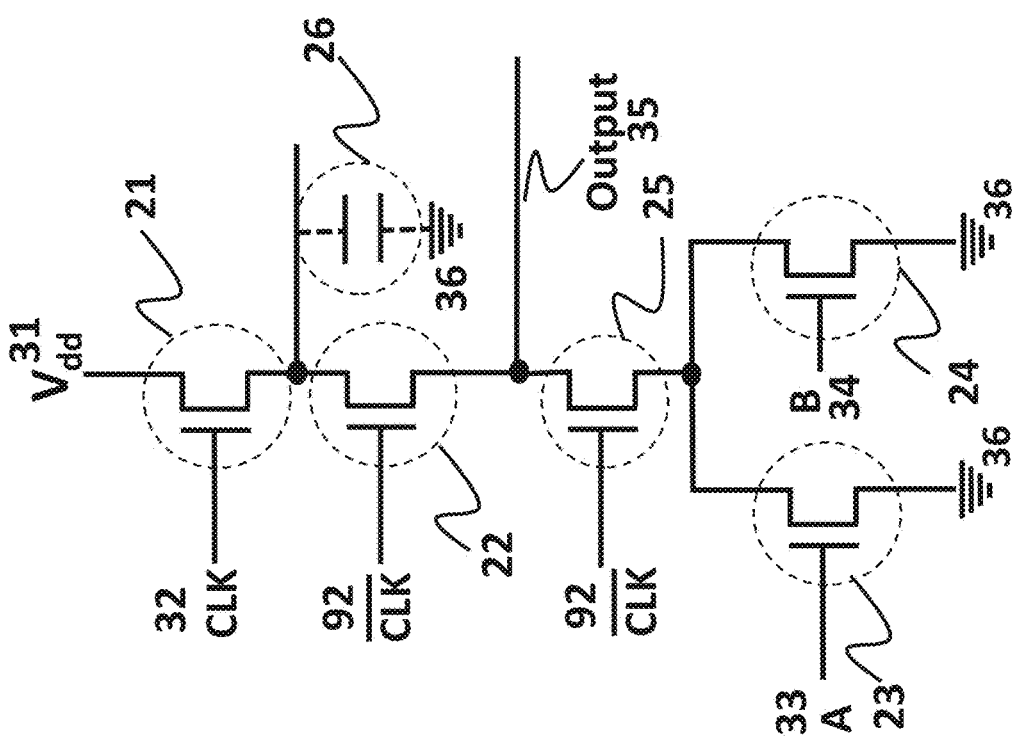
Figure 9D:
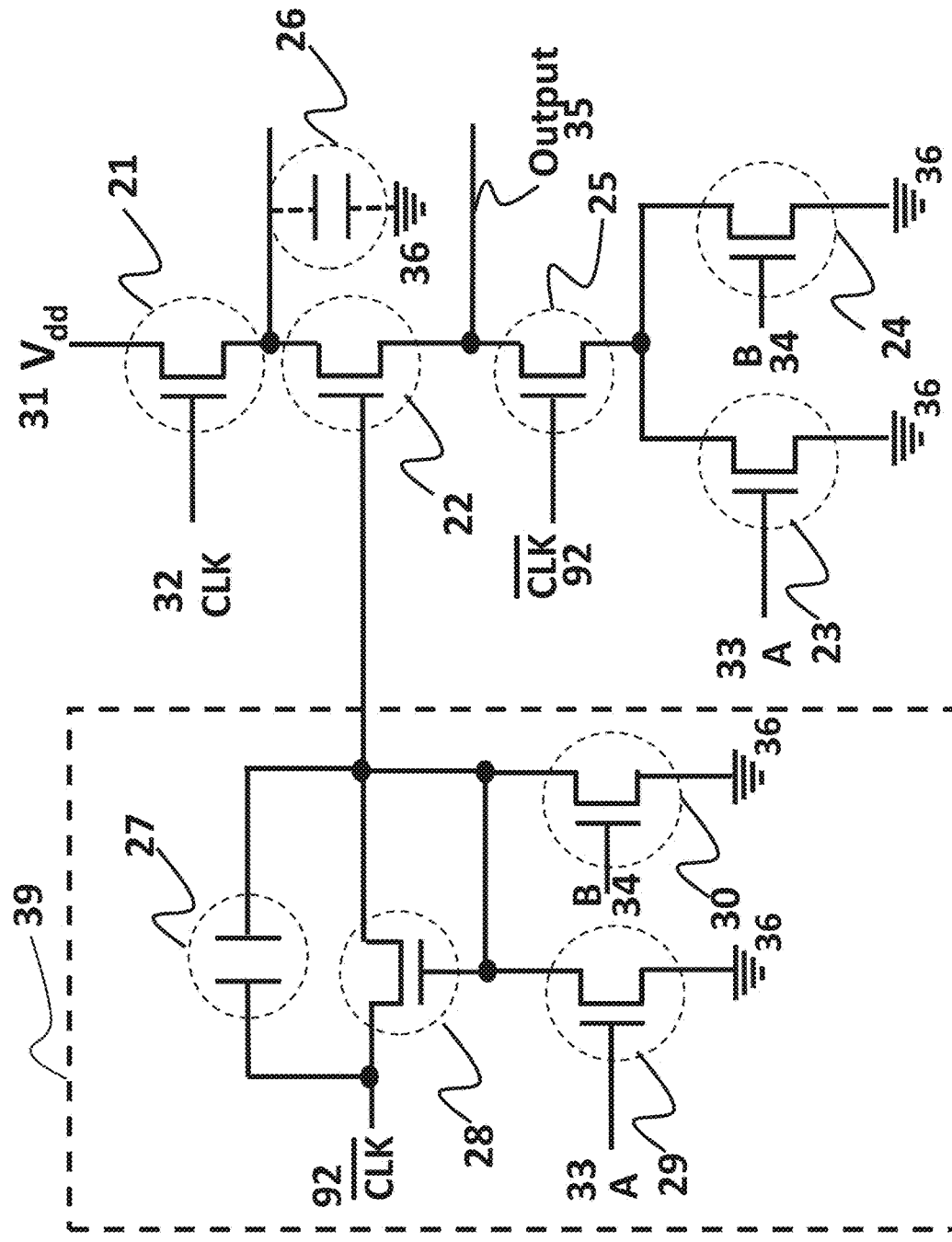
Figure 9E:
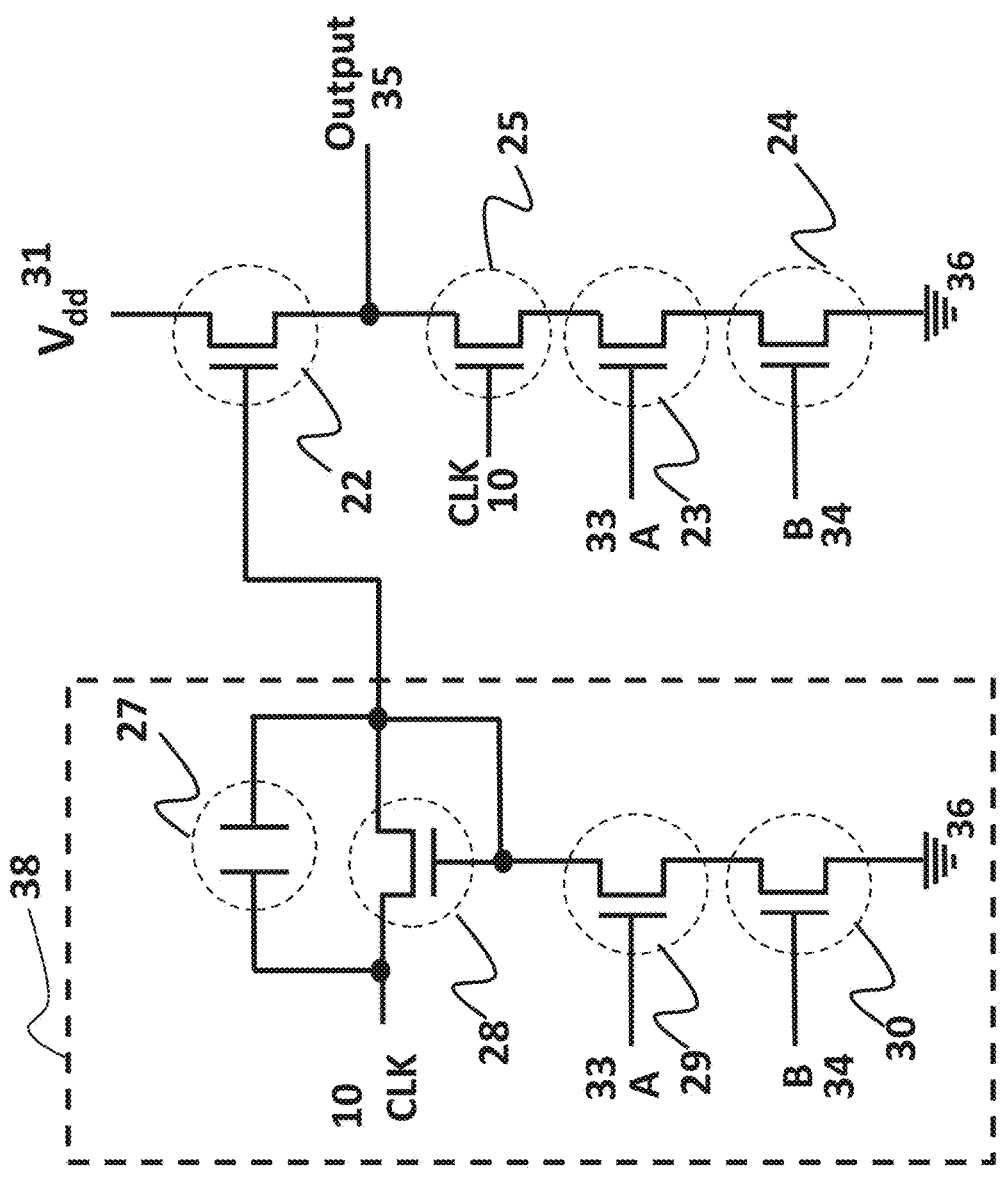
Figure 9F:
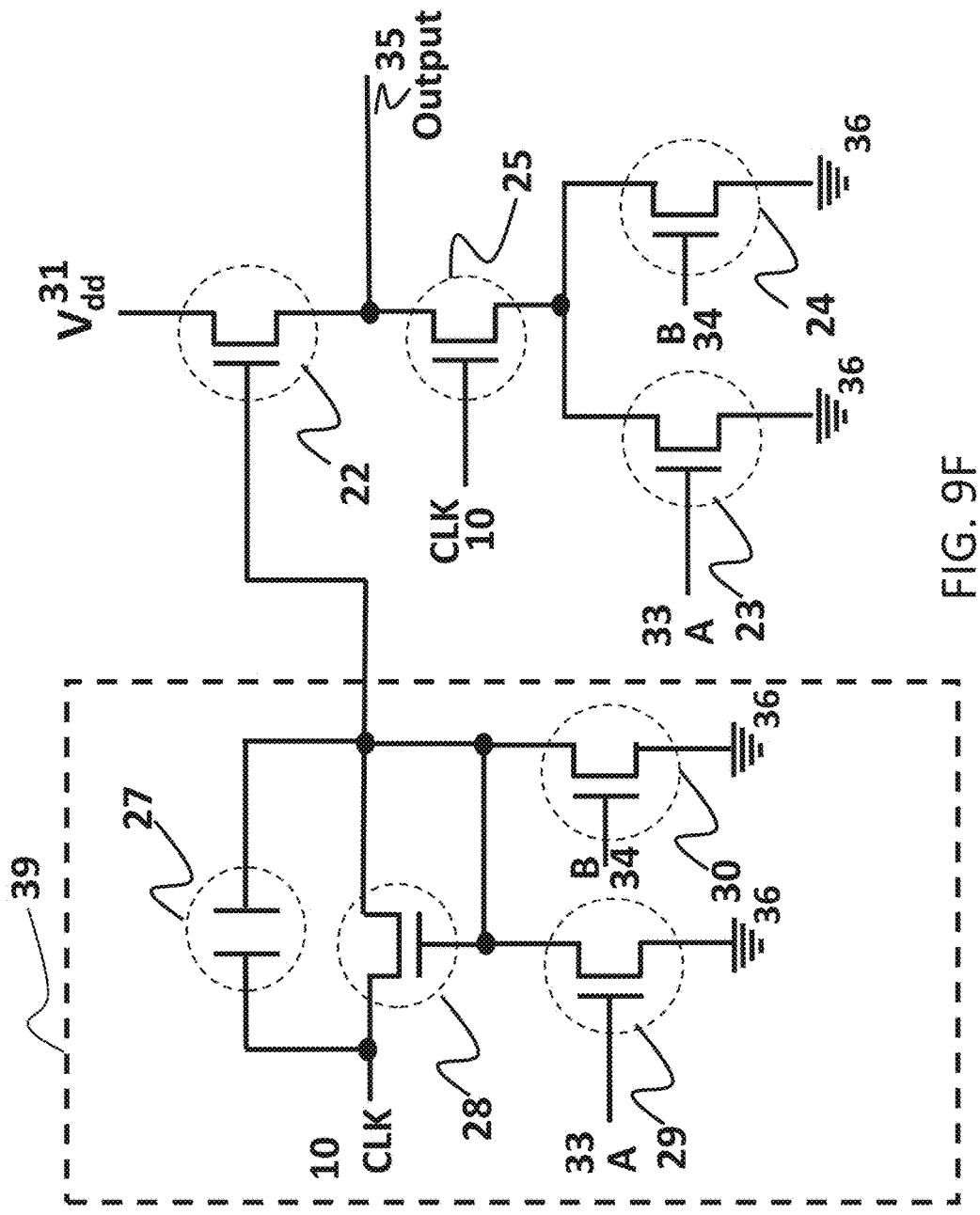
Figure 9G:
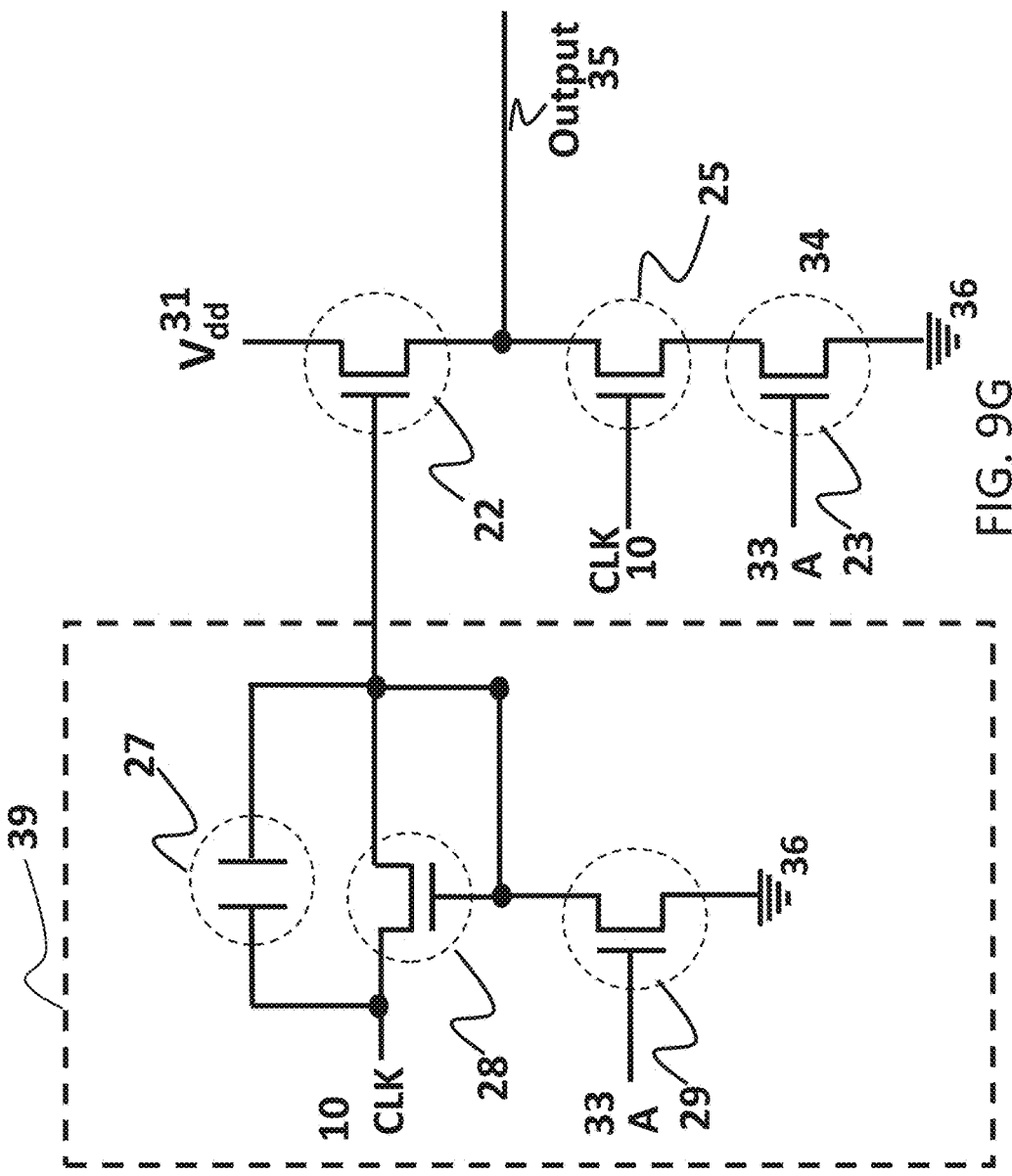
Figure 9H:
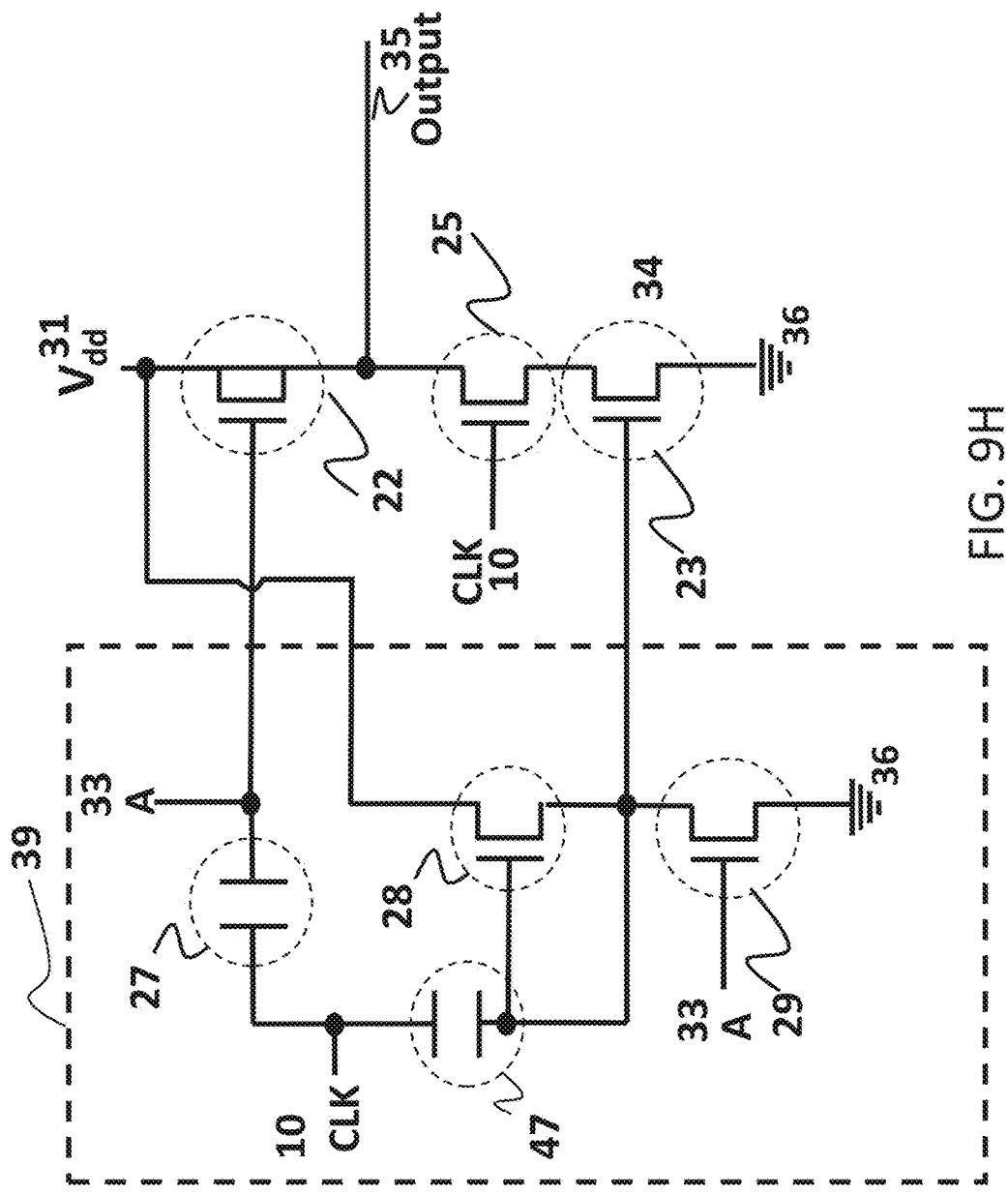
Figure 9I:
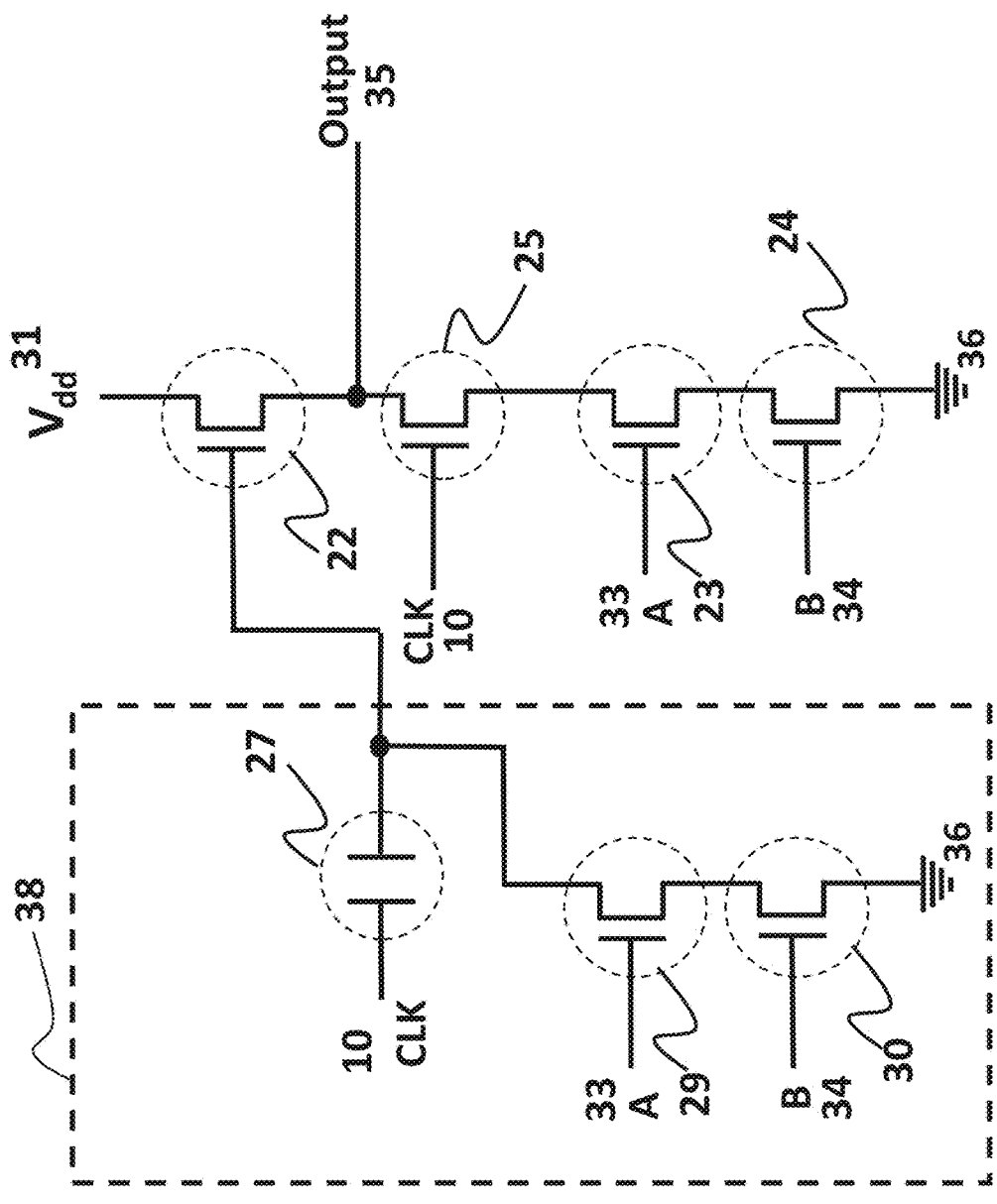
Figure 9J:
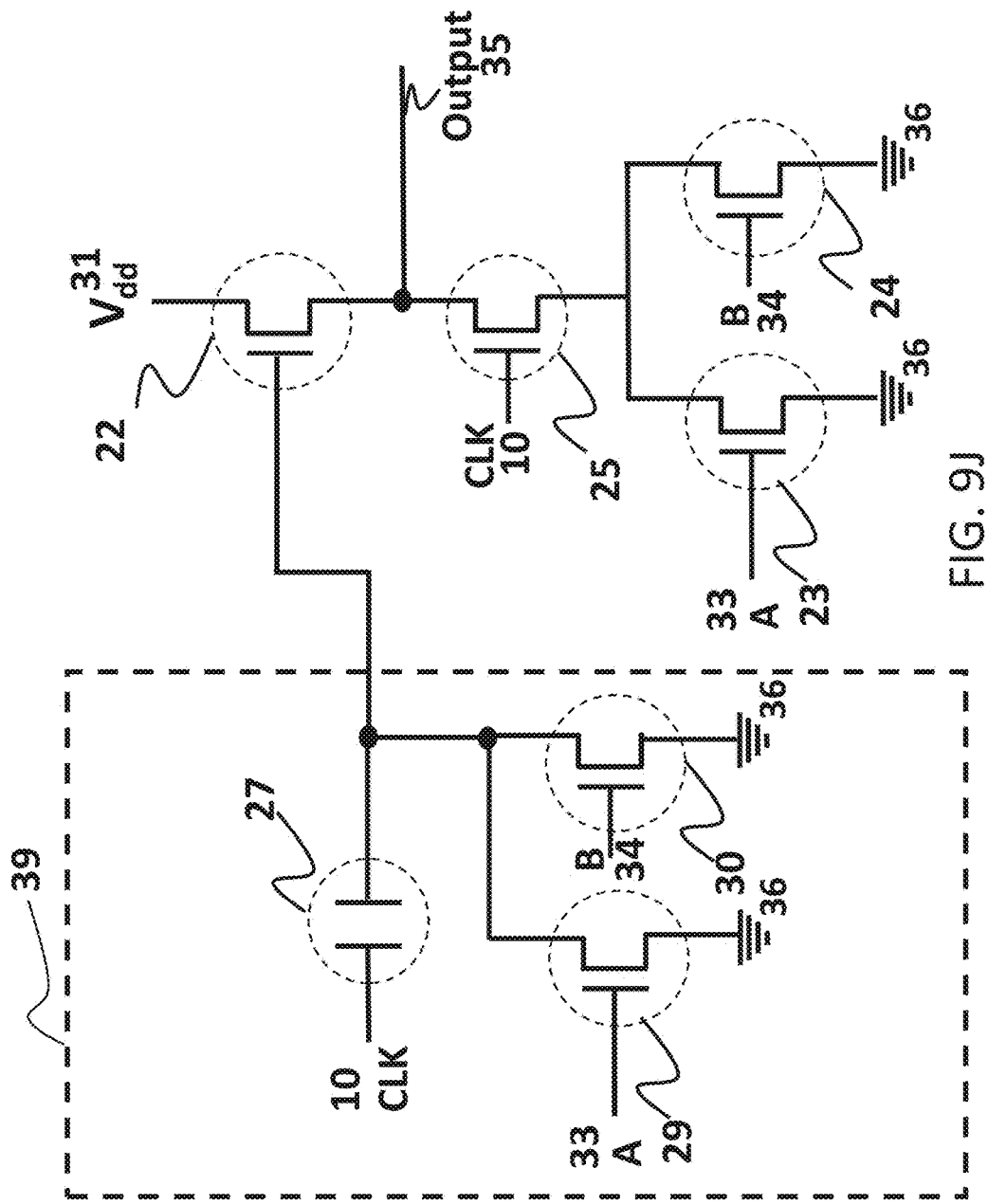
Figure 9K:
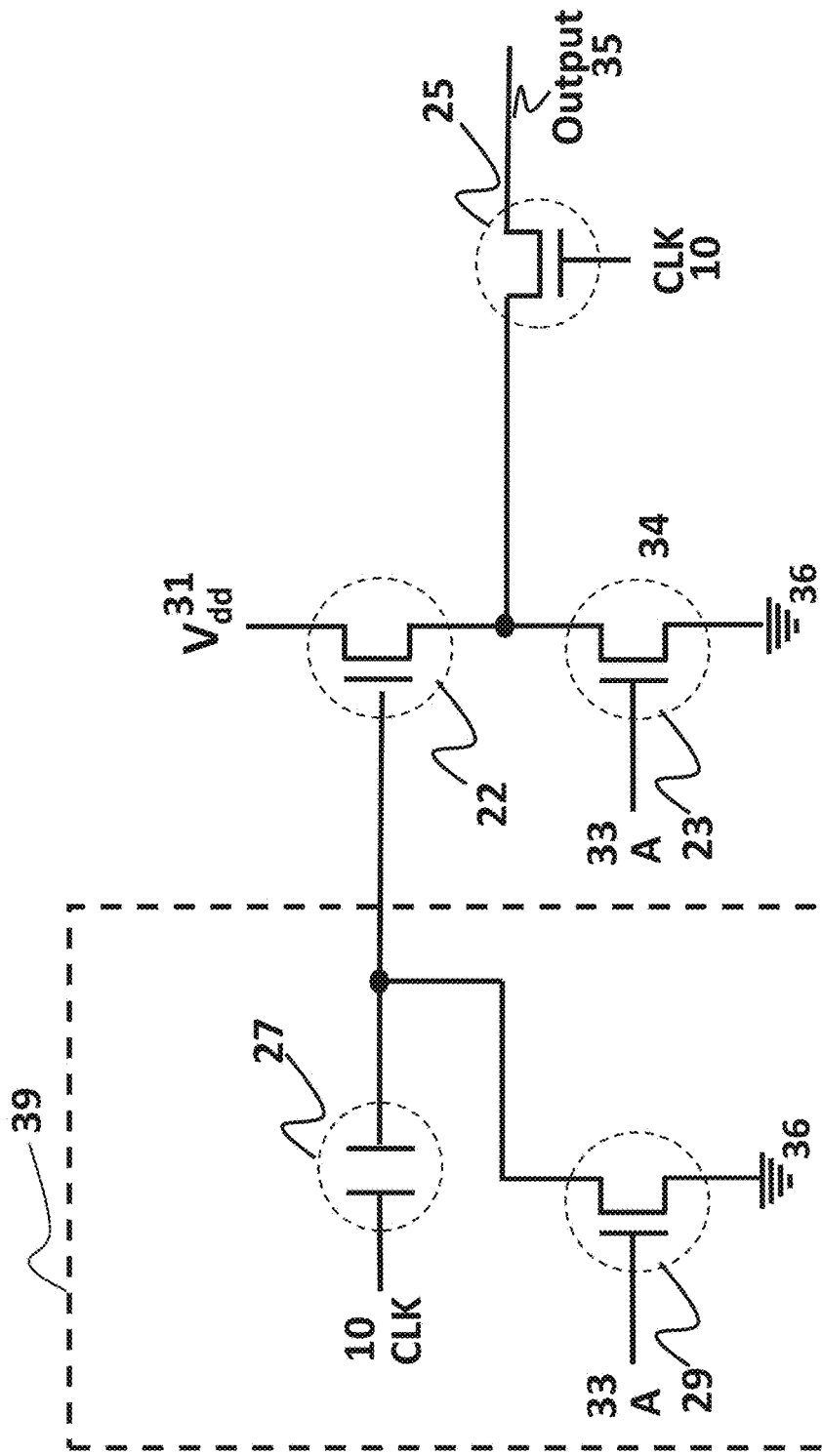
Figure 9L:
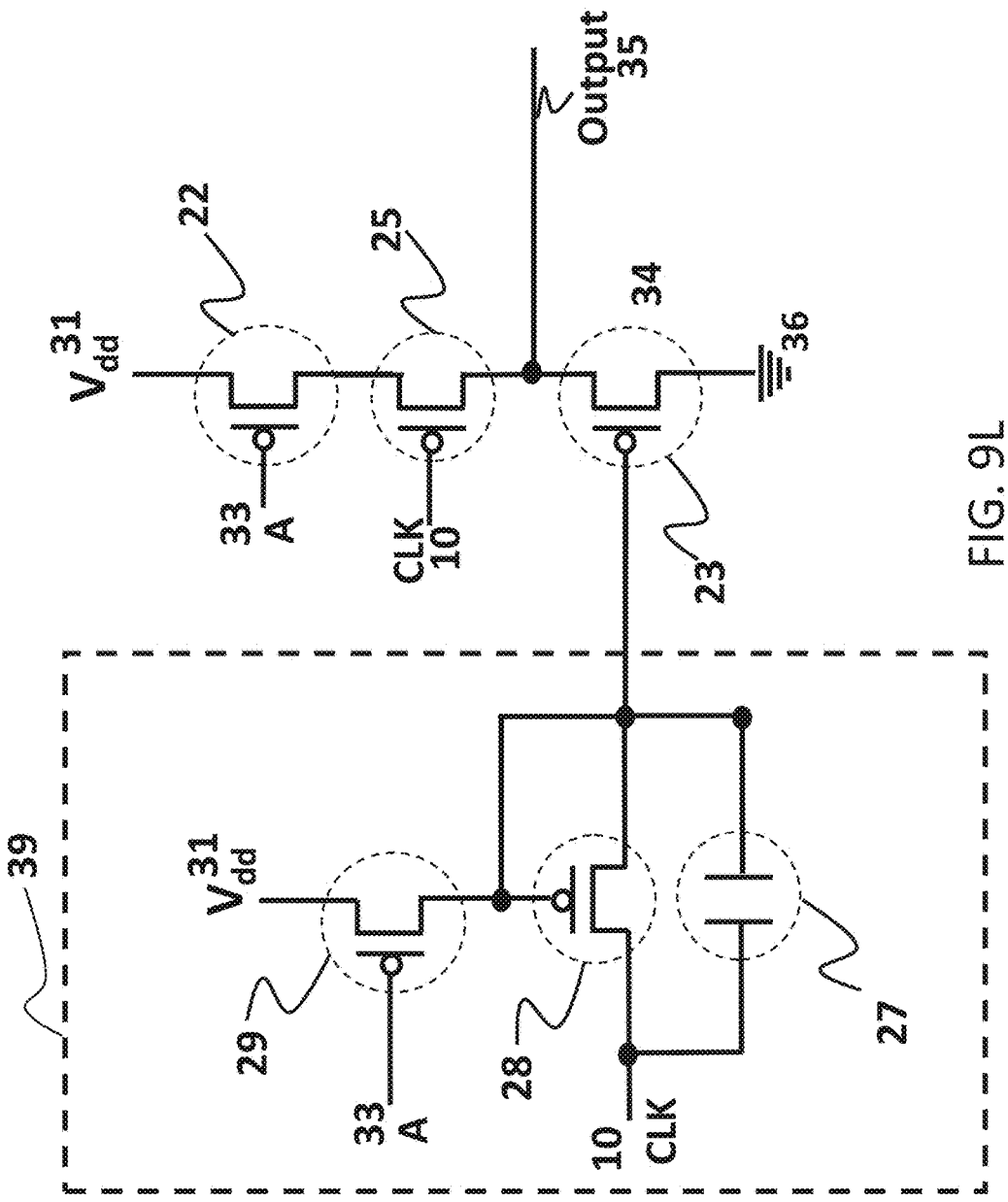
Figure 10:
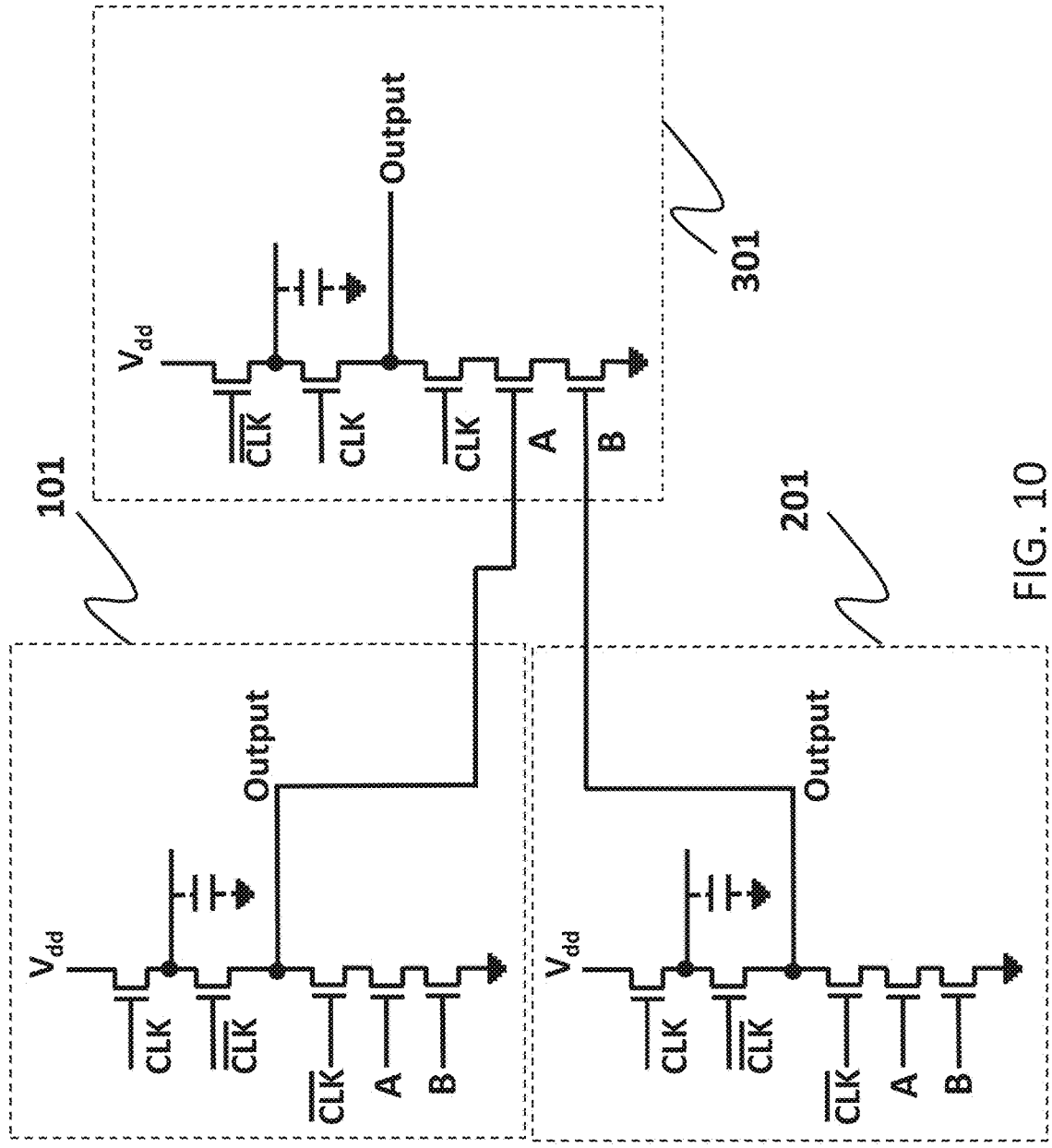

FIGS. 9A-10 depict an embodiment of unipolar logic circuitry identical to the embodiment depicted in FIGS. 1A-2, except that the clocked pass gate is transposed in location so as to be in the pull-down network. For example, in FIG. 9A is identical to FIG. 1A, except that clocked pass gate 25 has been transposed, from its location depicted in FIG. 1A, where it connects output terminal 35 to a net shared by logic transistor 23 and clocking device 92, to its location depicted in FIG. 9A, where it connects logic transistor 23 to output terminal 35, which is also coupled to clocking device 92. In the FIG. 1A configuration clocked pass gate 25 is part of a conductive pull up path between Vdd and output terminal 35, and is part of the conductive pull down path between Vss and output terminal 35. The conducive pull up path between Vdd and output terminal 35 has another device—clocked pass gate 22—that performs substantially the same function as clocked pass gate 25. Therefore clocked pass gate 25 need only provide selective conduction in the pull down path between Vss and output terminal 35. In each of FIGS. 9B-10, clocked pass gate 25 has similarly been transposed from its location depicted in FIGS. 1B-10.

Operation of the logic families depicted in FIGS. 1A-10 embodiments can be described with reference to the NOR gate depicted in FIG. 1C. The NOR depicted in FIG. 1C has complementary first and second clock terminals 32 and 92, logic input terminals 33 and 34, logic output terminal 35, a logic network, a pre-charge network, and a logic clocking network. The logic network includes switching devices 23 and 24. The pre-charge network includes switching device 21 and charge-storage capacitor 26. The logic clocking network includes switching devices 22 and 25. Each of switching devices 21, 22, 23, 24 and 25 are of the same unipolar type. For example, all of switching devices 21, 22, 23, 24 and 25 could be N-type MOSFETS in one embodiment. In another embodiment, all of switching devices 21, 22, 23, 24 and 25 could be P-type MOSFETS, for example.

The logic network in the FIG. 1C embodiment is configured to perform a NOR logic function. Switching devices 23 and 24 of the logic network have control terminals (e.g., gates) coupled to logic input terminals 33 and 34, respectively. The logic network is configured to modulate conductivity, based on logic input signals A and B received on logic input terminals 33 and 34, respectively, and on the NOR logic function that the logic network is configured to perform, between a first supply net (e.g., ground) and a pre-evaluation net, which connects logic network to the logic clocking network.

The pre-charge network is configured to provide an electrical charge to charge-storage capacitor 26 during a first phase of first and second clock signals CLK and $\overline{CLK}$. Switching device 21 of the pre-charge network has a control terminal coupled to the clock input terminal 32. Switching device 21 is configured to modulate conductivity, based on clock signal CLK received on clock input terminal 32, between a second supply net (e.g., Vdd) and a first terminal (e.g., top plate) of charge-storage capacitor 26. For example, when clock signal CLK is of a voltage that causes conductivity of switching device 21 to be high, then the first terminal of charge-storage capacitor 26 will be charge to a voltage approximately equal to the voltage of the second supply net (e.g., Vdd). When clock signal CLK is of a voltage that causes conductivity of switching device 21 to be low (e.g., off), then little or no electrical conduction will occur between the second supply net and the first terminal of charge-storage capacitor 26.

The logic clocking network is configured to couple output terminal 35 to both the pre-charge net and to the first terminal of charge-storage capacitor 26. Each of switching devices 22 and 25 of the logic clocking network has a control terminal coupled to second clock input terminal 92. The logic clocking network is configured to modulate conductivity, based on second clock signal $\overline{CLK}$ received on second clock input terminal 92, between logic output terminal 35 and both the first terminal of charge-storage capacitor 26 and the pre-evaluation net.

If input logic signals A and B are of voltages that causes conductivity of either of switching devices 23 or 24 to be high, then charge-storage capacitor 26 will be discharged to first supply net (e.g., GND) via the logic network when clock signal CLK has a phase that causes conductivity of switching devices 22 and 25 to be high. In such a situation, the voltage provided to output logic terminal 35 will be substantially equal to the voltage of the first supply net (e.g., GND).

If, however, input logic signals A and B are of voltages that causes conductivity of either of switching devices 23 or 24 to be low, then charge-storage capacitor 26 will not be discharged to first supply net (e.g., GND) via the logic network when clock signal CLK has a phase that causes conductivity of switching devices 22 and 25 to be high. In such a situation, the voltage provided to output logic terminal 35 will be substantially equal to the voltage of the first supply net (e.g., GND). In such a situation, the voltage provided to output logic terminal 35 will be a voltage determined by the charge stored on charge-storage capacitor 26 conductively shared, via logic clocking network with any capacitances coupled to logic output net 35.

The clocking scheme describe with reference to FIG. 9C results in a NOR logic gate that has a resolving phase and a holding phase. For example, if the complementary first and second clock signals CLK and $\overline{CLK}$ have voltages that cause switching devices 22 and 25 of the logic clocking network to have relatively-high conductivities, then the NOR gate is in the resolving phase of operation. In the resolving phase of operation, any changes in the state of input logic signals A and B can cause a change in the logic output signal to appear on logic output terminal 35. If, however, the complementary first and second clock signals CLK and $\overline{CLK}$ have voltages that cause switching devices 22 and 25 of the logic clocking network to have relatively-low conductivities, then the NOR gate is in the holding phase of operation. In the holding phase of operation, any changes in the state of input logic signals A and B do not cause a change in the logic output signal to appear on logic output terminal 35.

The various other logic gates depicted in FIGS. 9A-9B and 9D-10 operate in similar fashion to the NOR gate described above with reference to FIG. 9C. In some embodiments, complementary clock signals CLK and $\overline{CLK}$ have first and second phases. Because clock signals CLK and $\overline{CLK}$ are complementary, during each of first and second phases, clock signals CLK and $\overline{CLK}$ are complementary. For example, clock signal CLK might have a relatively-high voltage during the first phase of complementary clock signals CLK and $\overline{CLK}$, and a relatively-low voltage during the second phase of complementary clock signals CLK and $\overline{CLK}$. Then, clock signal CLK might have a relatively-low voltage during the second phase of complementary clock signals CLK and $\overline{CLK}$, and a relatively-high voltage during the second phase of complementary clock signals CLK and $\overline{CLK}$.

The relatively-high voltage can be approximately equal to the voltage of the second supply net (e.g., Vdd). In some embodiments, the relatively-high voltage can exceed the voltage of the second supply net (e.g., >Vdd). A voltage that exceeds the supply can be generated, for example, by using a supply for a clocking network that is different from (e.g., greater than) the supply for the logic gates.

Figure 11A:
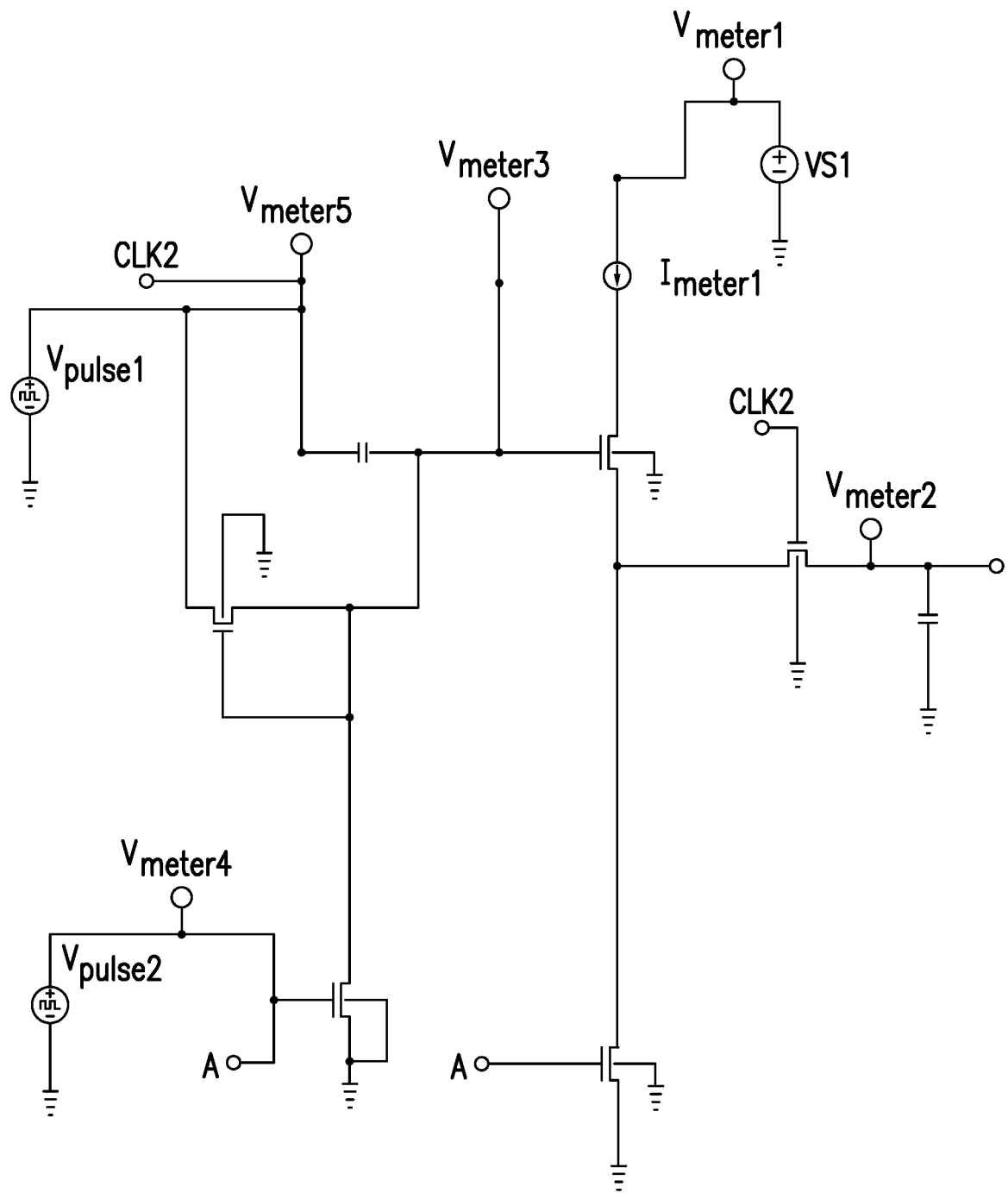
Figure 11B:
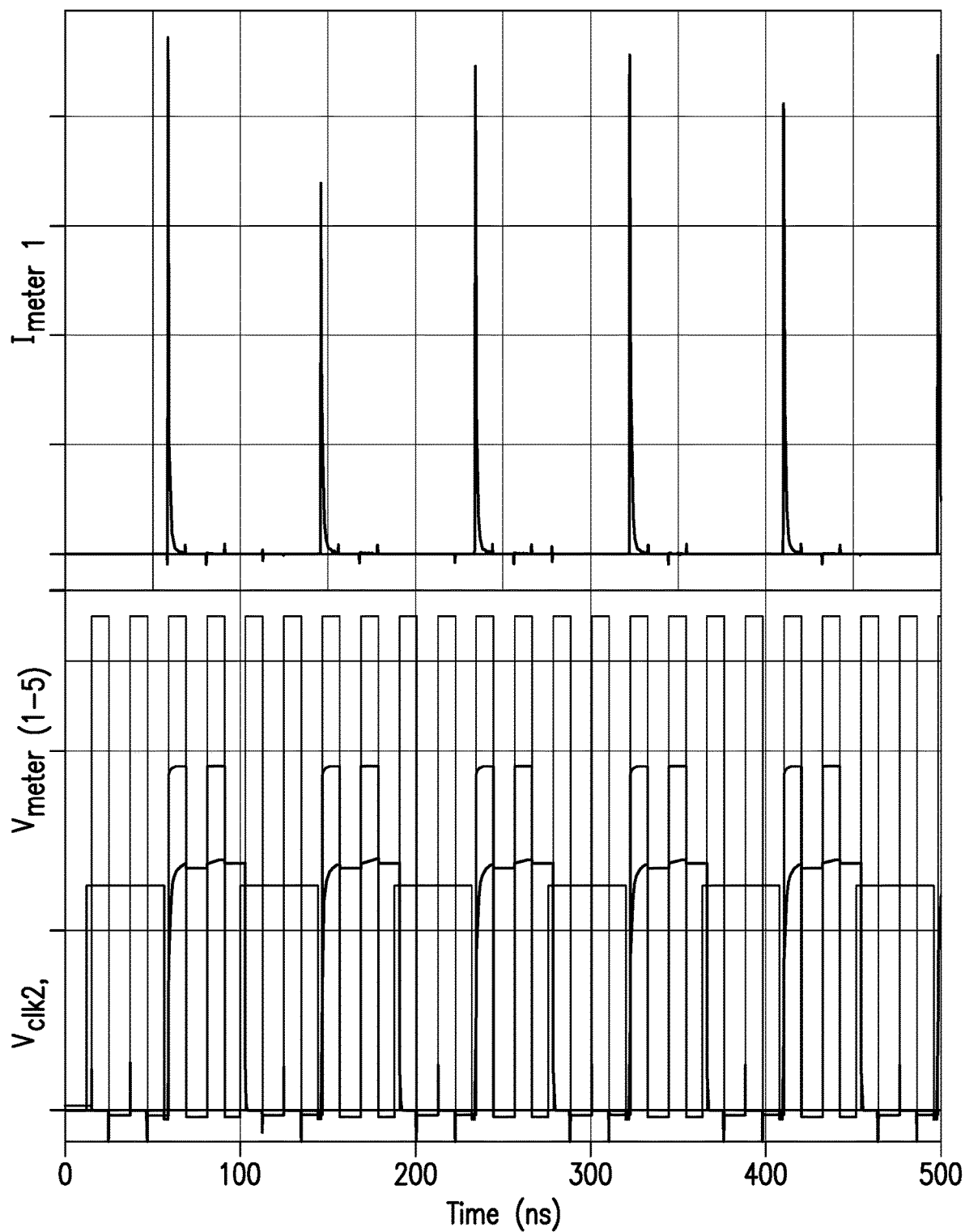
Figure 12A:
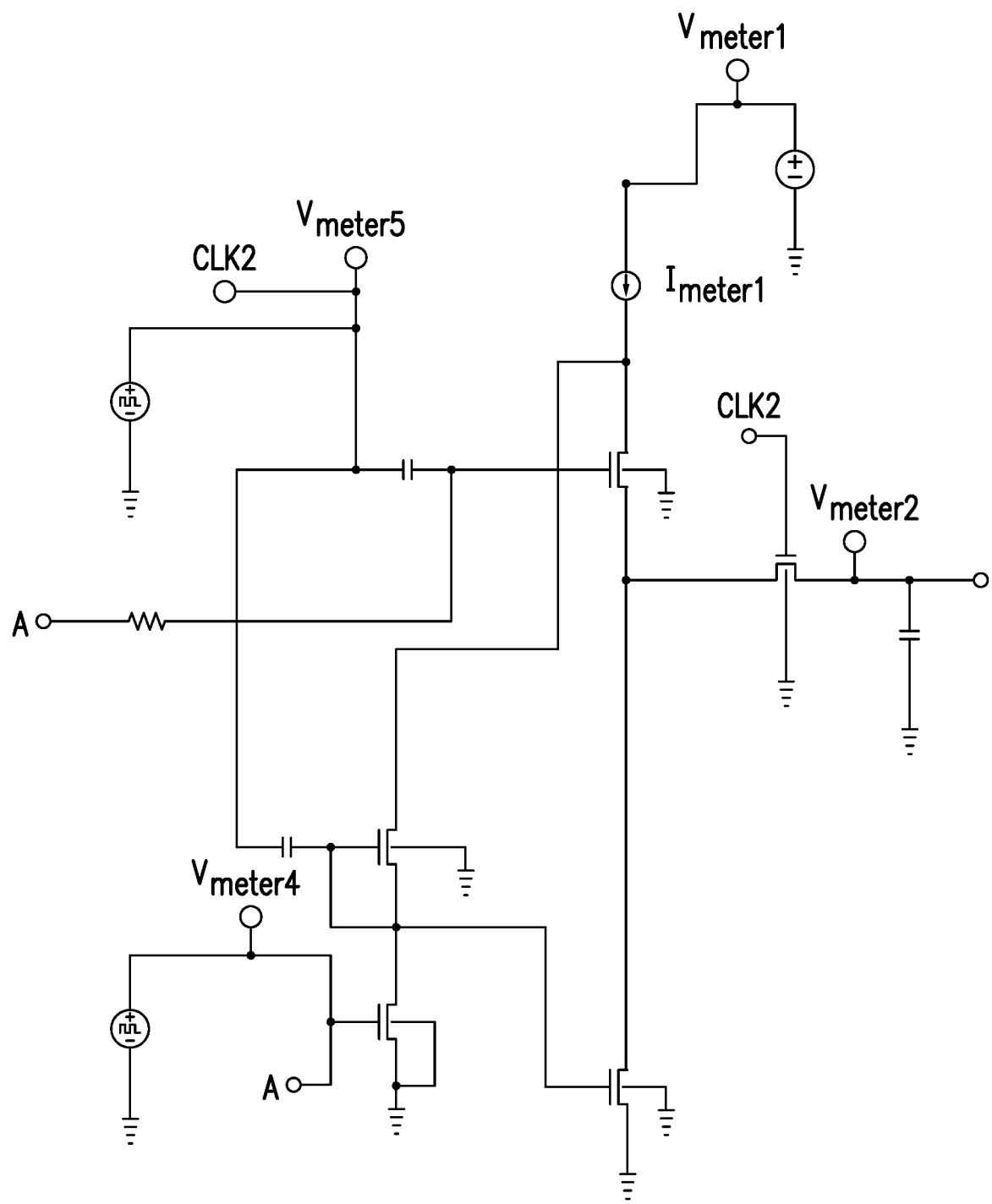
Figure 12B:
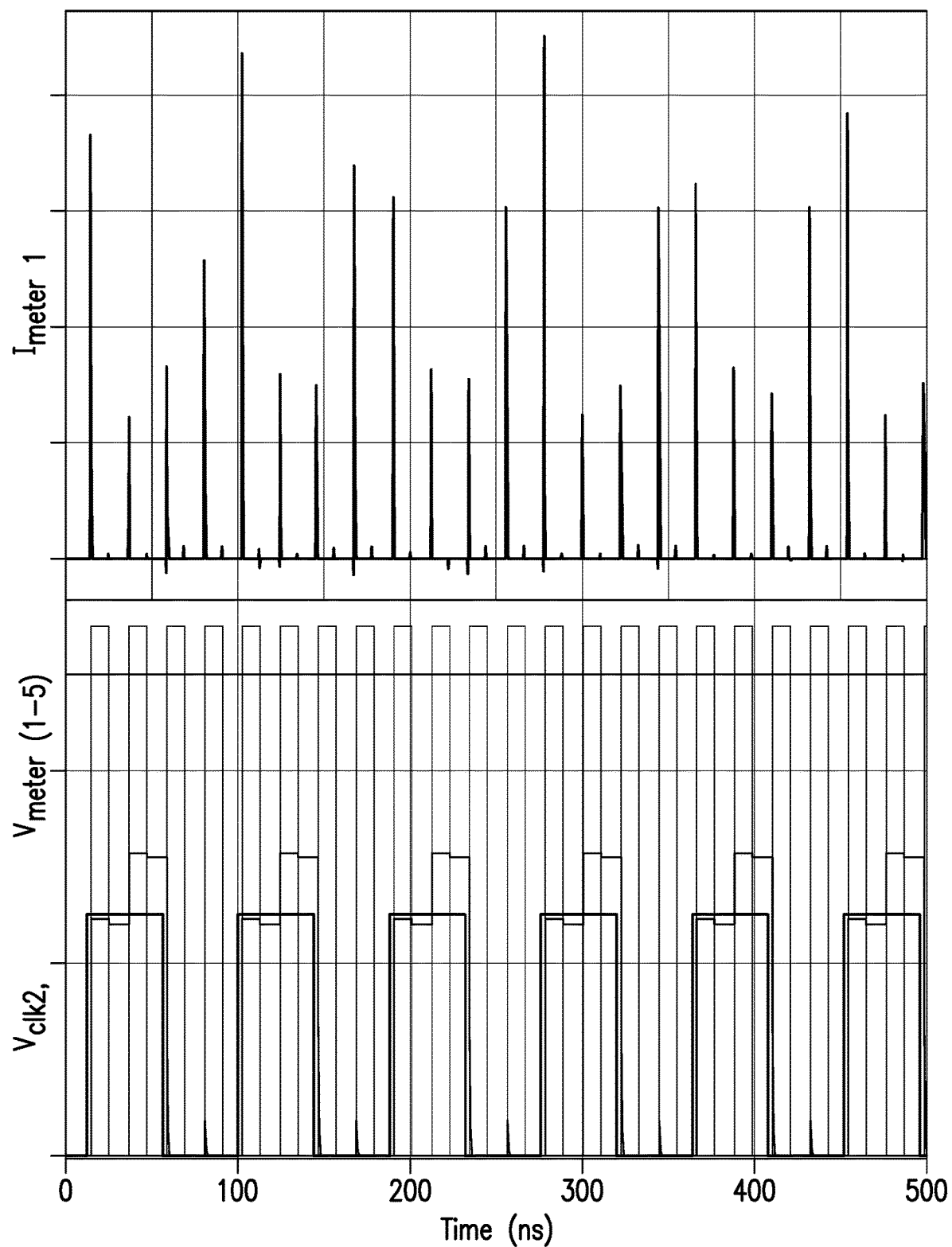
Figure 13A:
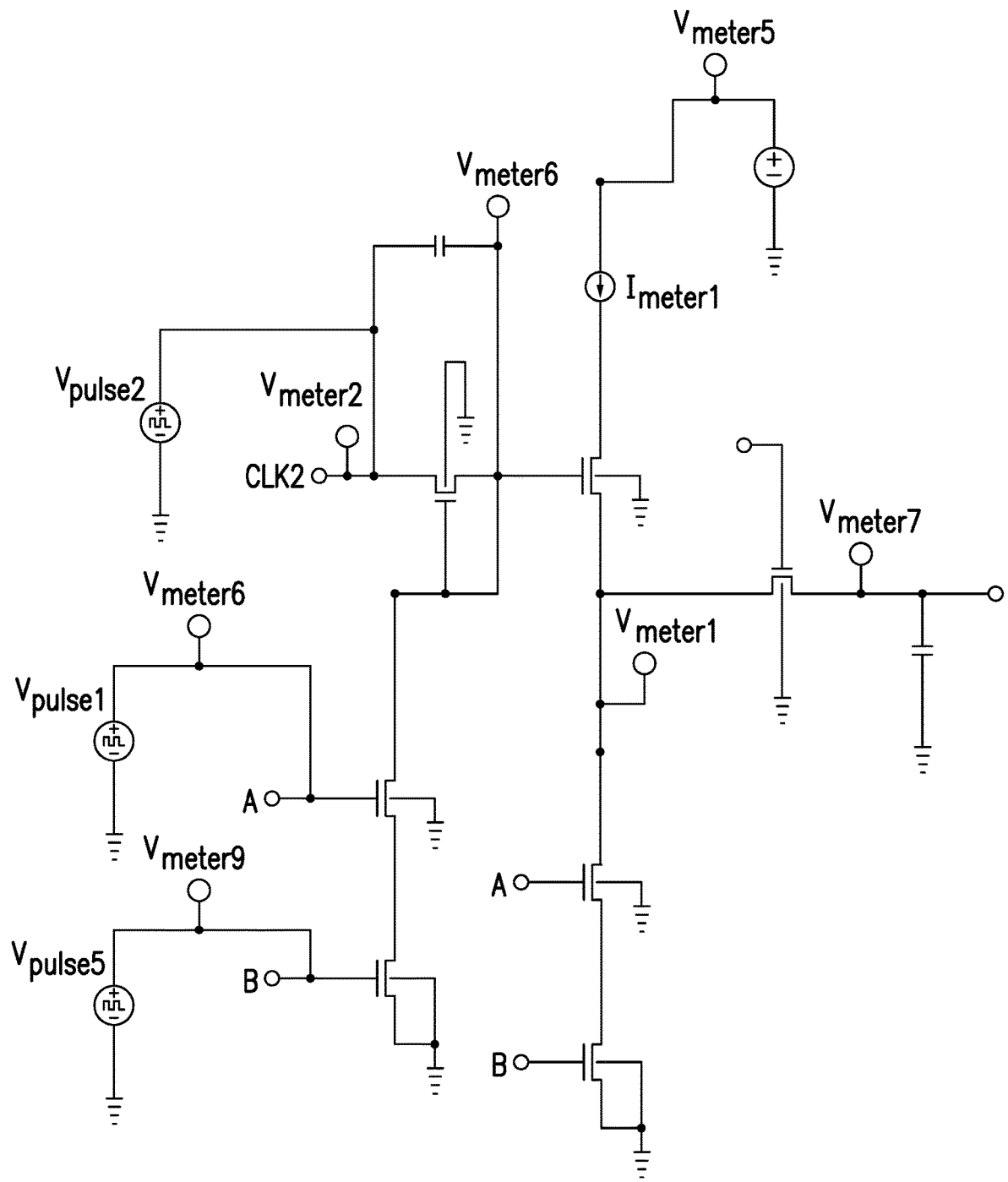
Figure 13B:
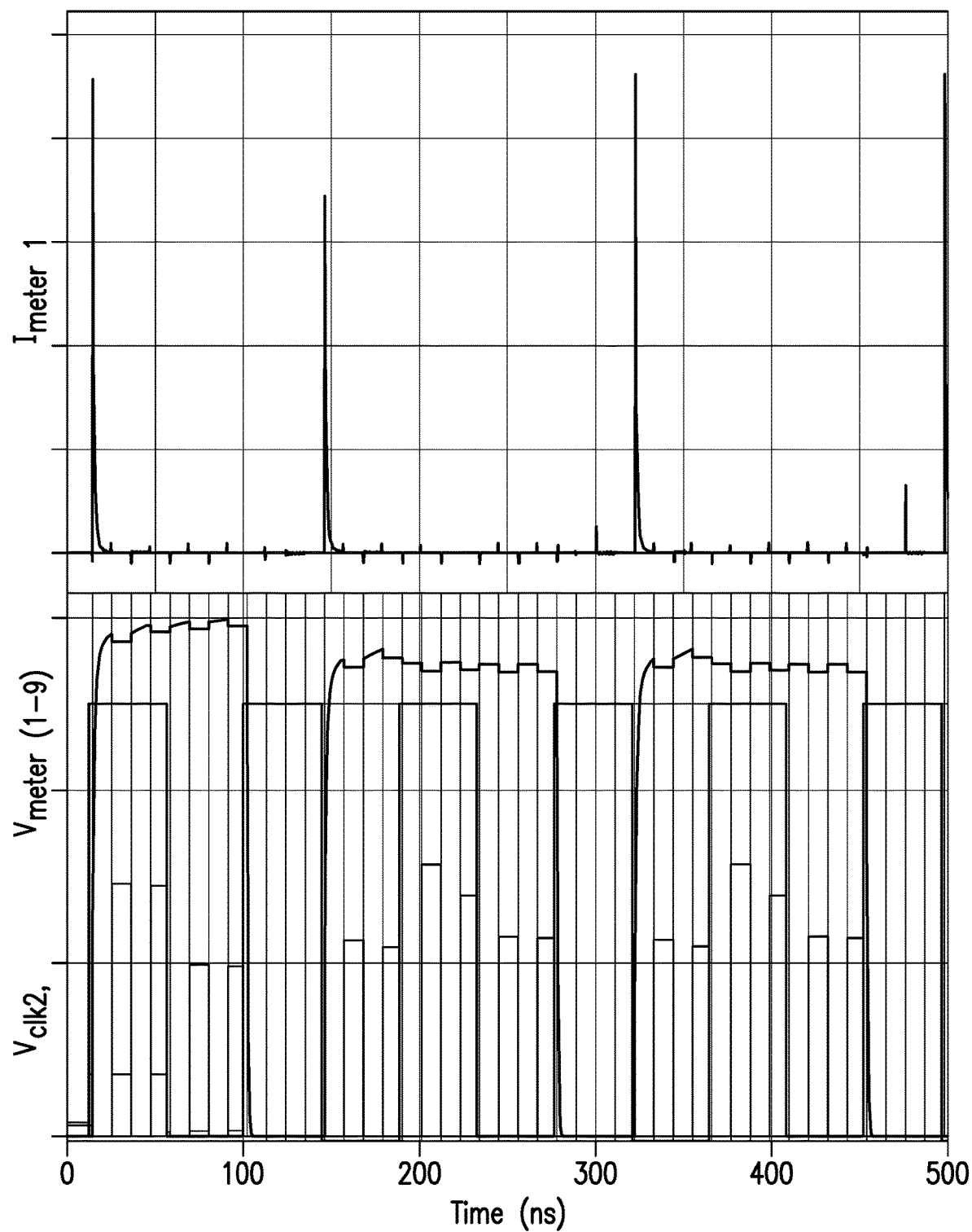
Figure 14A:
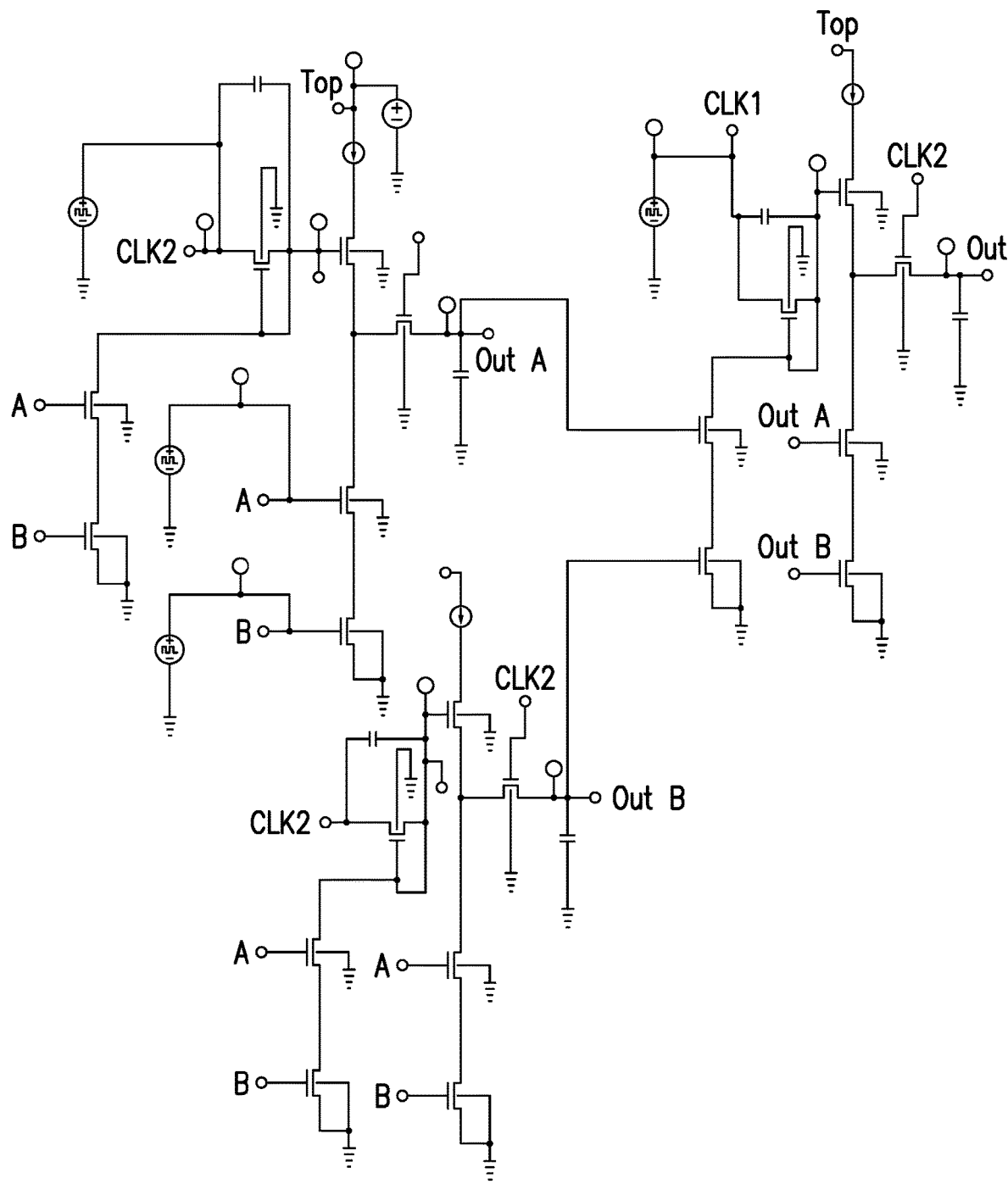
Figure 14B:
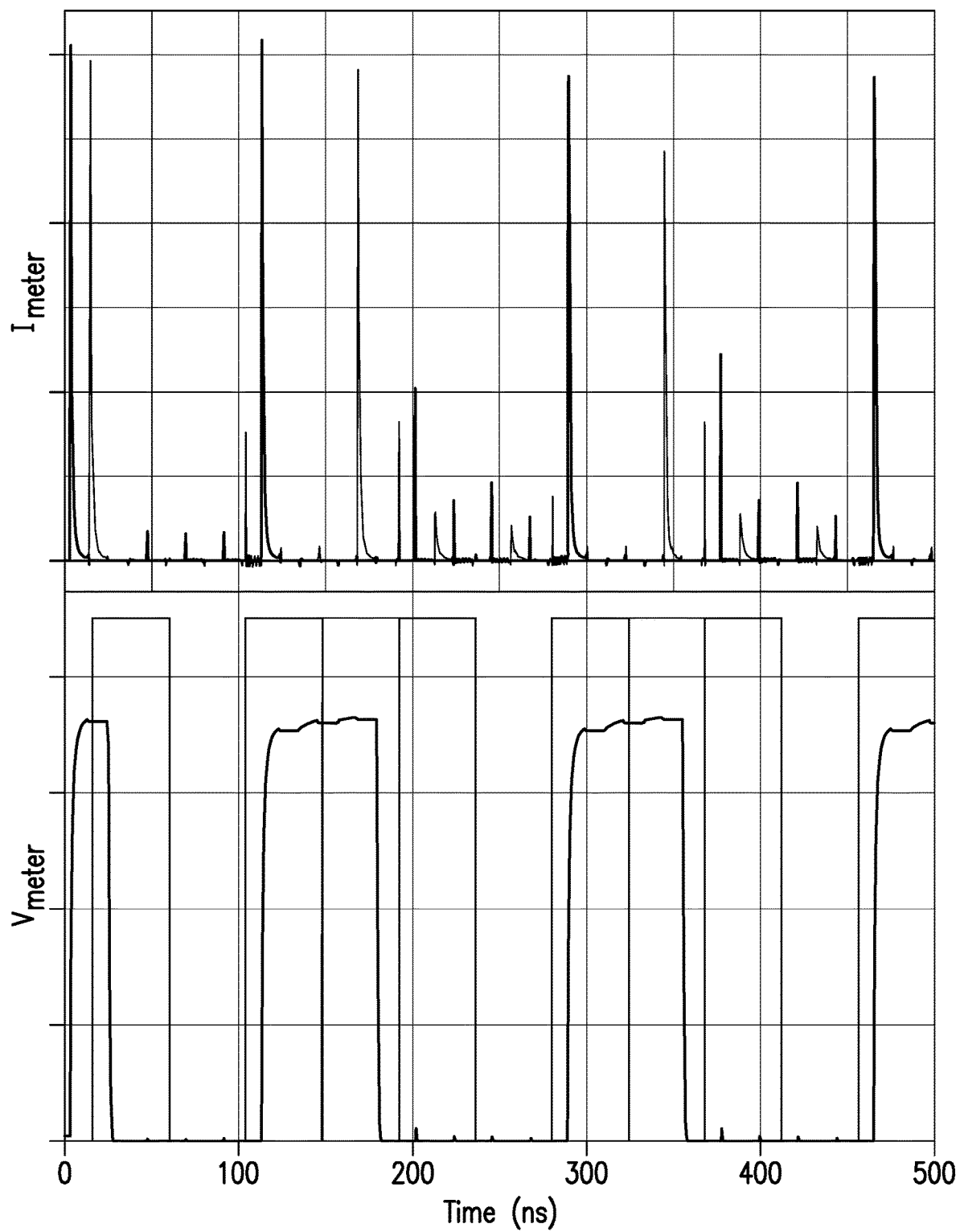

FIGS. 11A-11B represent simulations of Unipolar Clocked Logic gates (Inverter, Buffer and NAND gates), the results of which indicate that the circuits operate in low power as expected.

It should be noted that one skilled in the art will recognize that although embodiments of unipolar gates shown herein are drawn primarily with NMOS transistors, equivalently PMOS transistors may be employed. FIG. 1L, for example, is a PMOS-based Unipolar Clocked Inverter Gate Low Power Circuit Single Clock per Gate according to an embodiment of the present invention, as opposed to the NMOS-based inverter gate of FIG. 1G. Further, in addition to the unipolar NAND, NOR, Inverter and Buffer gates shown in the drawings herein, one skilled in the art would readily recognize that the invention applies also to other logic gates as needed.

Embodiments of the invention described herein may be applied to a variety of nonvolatile logic techniques; for example, a nonvolatile unipolar latched logic gate may employ a nonvolatile element such as the nonvolatile latch described in FIG. 15 of provisional application 62/252,522 and U.S. Pat. No. 8,681,535, (Agan et al.) both of which are herein incorporated by reference in their entirety.

FIG. 7 is a schematic diagram of an embodiment of a unipolar logic gate configured to perform a NOR logic function. In FIG. 7, NOR gate 100 includes clock input terminal 110, logic input terminals 133 and 134, and logic output terminal 135. Clock input terminal 110 is configured to receive a clock signal Logic input terminals 133 and 134 are configured to receive one or more corresponding logic input signals of a binary logical nature. Logic output terminal 135 is configured to output a logic output signal of a binary logical nature. NOR gate 100 also includes logic network 102 that includes device 123 and device 124 of a unipolar type. Devices 123 and 124 are configured to perform the NOR logic function. Each of the devices 123 and 124 of logical network 102 has a control node (e.g., gate) coupled to a corresponding one of the logic input terminals 133 and 134. Logic network 102 is configured to modulate conductivity, based on the configured logic function (e.g., NOR) and the logic input signals received on logic input terminals 133 and 134, between first supply 136 (e.g., GND) and pre-evaluation net 104.

NOR gate 100 includes logic clocking device 114 of the unipolar type having an input node (e.g., source/drain) coupled to pre-evaluation net 104, a control node (e.g., gate) conductively coupled to clock input terminal 110, and an output node (e.g., source/drain) coupled to logic output terminal 135. Logic clocking device 114 is configured to modulate conductivity, based on the received clock signal on clock input terminal 110, between pre-evaluation net 104 and logic output terminal 135.

The NOR gate includes logic-complement clocking device 113 of the unipolar type having an input node (e.g., source/drain) coupled to second supply 131 (e.g., VDD), a control node (e.g., gate) capacitively coupled, via capacitor 111, to clock input terminal 110 and conductively coupled to pre-evaluation net 104, and an output node (e.g., source/drain) coupled to logic output terminal 135, logic-complement clocking device 113 configured to modulate conductivity, based on the received clock signal on clock input terminal 10, between second supply 131 and logic output terminal 135.

In the depicted embodiment, the pre-evaluation net can be charged to a voltage substantially above first supply 136 when the clock signal received on clock input terminal 110 transitions from low to high and the conductivity of the logic network is low. If, however, the conductivity of the logic network is high or the clock signal received on clock input terminal 110 transitions from high to low, the voltage of the pre-evaluation net will be not significantly above first supply 136. If the unipolar type of the depicted devices 113, 114, 123 and 124 is N-type, pre-evaluation net must have a voltage significantly above first supply 136 for logic-complement clocking device 113 to turn on and to provide a high conductivity path between second supply 131 and logic output terminal 135.

FIGS. 8A-8B are graphs depicting clock, logic inputs, logic outputs, and current drawn by an exemplary Unipolar Latched Logic Circuit. In FIG. 8A, graph 54 includes horizontal axis 55 and vertical axes 56, 58, and 60. Horizontal axis 56 is indicative of time. Vertical axes 56, 58, and 60 are indicative of clock voltage, input logic voltage, and output voltage, respectively. Clock signal/time relation 57 depicts a periodic clock signal that is at 3.0 volts during first phase 57a and at 0.0 volts during second phase 57b. First phase 57a can be called an evaluation phase, and second phase 57b can be called a hold phase.

Input logic signal/time relation 59 depicts a logic signal that varies between 0.0 volts and 3.0 volts as a function of time. Input logic signal/time relation 59 is constant during the evaluation phase 57a and changing at time $\tau_{su}$ before clock signal/time relation 57 transitions to hold phase 57b. When the clock signal depicted in clock signal/timing relation 57 transitions from hold phase 57b to evaluation phase 57a, the output logic signal as depicted in output logic signal/time relation 61 to a logic state indicative of a logic function corresponding to a configuration of unipolar devices and the input logic signal as depicted in input logic function/time relation 59. When the clock signal depicted in clock signal/timing relation transitions from evaluation phase 57a to hold phase 57b, the output logic signal is held at the previously determined output logic level, independent of the voltage of the input logic signal as indicated in input logic signal/time relation 59.

In FIG. 8B, graph 62 includes horizontal axis 55 and vertical axes 56, 63, and 60. As depicted in FIG. 7A, horizontal axis 55 is again indicative of time. Vertical axes 56, 63, and 60 are indicative of clock voltage, current, and output voltage, respectively. Clock signal/time relation 57 and output logic signal/time relation 61 depicted in FIG. 7A are reproduced in FIG. 7B to provide a reference to the supply current signal/time relation 64 and clock current/time relation 65. Both supply current signal/time relation 64 and clock current/time relation 65 are modest, because the timing of the various unipolar devices of the unipolar latched logic gate (e.g., as depicted in FIG. 1A) is such that no crowbar current paths are formed.

In some embodiments, evaluation phase 57a of clock signal/time relation 57 can have a voltage level that exceeds a supply voltage. Such a clock-signal/time relation can provide increased conductivity of logic-complement clocking device 113 (depicted in FIG. 7). This can ensure that the output signal on logic output terminal 135 is with a predetermined logic level specification, for example. Various capacitive techniques can provide such a clock signal/time relation 57 that exceeds a supply voltage.

The unipolar logic circuitry and vertical structures shown herein may be utilized with thin film transistors (TFTs) on insulative substrates such as glass or plastic. Alternatively, the unipolar logic circuitry may be utilized on a variety of semiconductor substrates which may be made of any appropriate semiconductor materials, such as silicon, polysilicon, germanium on insulator (GOI), silicon germanium, carborundum, indium antimonite, indium nitride, lead telluride, indium arsenide, indium phosphide, gallium arsenide, indium gallium arsenide, gallium antimonite, gallium nitride, alloy semiconductor, or a combination thereof. In yet another embodiment, unipolar logic circuitry may be fabricated with TFTs either in 2D planar or 3D vertical structures above unipolar logic circuitry embedded in a semiconductor substrate. This enables hybrid structures with ultra-high performance, density and speed. For example, InAs exhibits high electron mobility of 30,000-40,000 cm$^2$/Vs, and is a promising candidate along with other compound semiconductors for the semiconductor technology to replace silicon. However, vertical logic gates fabricated with compound semiconductors may not be feasible as it is with TFTs which can be fabricated at low process temperatures (<400 C). Hence, to maximize overall speed, density, power and cost, a hybrid device may be fabricated for example utilizing unipolar logic circuitry on an InAs substrate with additional unipolar logic circuitry comprised of TFT-based vertical logic gates fabricated above the core InAs logic circuitry.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronic logic gate comprising:
   complementary first and second clock input terminals configured to receive complementary first and second clock signals, respectively wherein a voltage difference between the first clock signal and a first supply voltage during a first phase of the first clock signal has a magnitude that is greater than a magnitude of a voltage difference between a second supply voltage and the first supply voltage;
   one or more logic input terminals configured to receive one or more logic input signals, respectively;
   a logic output terminal configured to transmit a logic output signal;
   a logic network including one or more switching devices, each of the same unipolar type, the logic network configured to perform a logic function, each of the one or more switching devices of the logic network having a control terminal coupled to a corresponding one of the one or more logic input terminals, the logic network configured to modulate conductivity, based on the one or more logic input signals received on the one or more logic input terminals and on the logic function that the logic network is configured to perform, between a first supply net and a pre-evaluation net;
   a pre-charge network including a switching device of the unipolar type and a charge-storage capacitor, the switching device of the pre-charge network having a control terminal coupled to the first clock input terminal and configured to modulate conductivity, based on the first clock signal received on the first clock input terminal, between a second supply net and a first terminal of the charge-storage capacitor, wherein the charge-storage capacitor has a second terminal coupled to the first supply net; and a logic clocking network including two switching devices, each of the unipolar type and having a control terminal coupled to the second clock input terminal, the logic clocking network configured to modulate conductivity, based on the second clock signal received on the second clock input terminal, between the logic output terminal and both the first terminal of the charge-storage capacitor and the pre-evaluation net.

2. The electronic logic gate of claim 1, wherein the logic clocking network is further configured to modulate the conductivity, based on the second clock signal received on the second clock input terminal, between the first terminal of the charge-storage capacitor and the pre-evaluation net.

3. The electronic logic gate of claim 1, wherein the unipolar type is N-type MOS transistors.

4. The electronic logic gate of claim 1, wherein the unipolar type is P-type MOS transistors.

5. The electronic logic gate of claim 1, wherein the logic network includes a plurality of switching devices, each of the unipolar type, wired in a parallel fashion.

6. The electronic logic gate of claim 1, wherein the logic network includes a plurality of switching devices, each of the unipolar type, wired in a series fashion.

7. The electronic logic gate of claim 1, wherein a voltage difference between the second clock signal and the first supply voltage during a second phase of the second clock signal has a magnitude that is greater than a magnitude of a voltage difference between the second supply voltage and the first supply voltage.

8. The electronic logic gate of claim 1, wherein an output signal is generated on the logic output terminal during a second phase of the complementary first and second clock signals, the output signal indicative of a result of the logic function that the logic network is configured to perform when receiving the one or more logic input signals from the one or more logic input terminals.

9. The electronic logic gate of claim 7, wherein the output signal on the logic output terminal generated during an immediately preceding second phase of the complementary first and second clock signals is held independent of the one or more logic input signals received on the one or more logic input terminals during the first phase of the complementary first and second clock signals.

10. A method for generating an electronic output signal indicative of a logic function that a logic network is configured to perform on one or more logic input signals:
receiving, via complementary first and second clock input terminals, complementary first and second clock signals, respectively;
generating a voltage difference between the first clock signal and a first supply voltage during a first phase of the first clock signal that is greater than a voltage difference between a second supply voltage and the first supply voltage;
receiving, via one or more logic input terminals, one or more logic input signals, respectively;
precharging, via a switching device of a unipolar type, a charge-storage capacitor with a voltage indicative of a first binary logic state, wherein the charge-storage capacitor has a terminal coupled to a first supply net;
configuring one or more switching devices, each of the unipolar type, as a logic network configured to perform a logic function;
modulating conductivity, via the logic network and based on the logic function that the logic network is configured to perform and on the one or more logic input signals received on the one or more logic input terminals, between the first supply net and a pre-evaluation net during a first phase of the complementary first and second clock signals;
modulating conductivity, via two switching devices, each of the unipolar type, between a logic output terminal and both the charge-storage capacitor and the pre-evaluation net during a second phase of the complementary first and second clock signals.

11. The method of claim 10, further comprising:
modulating conductivity, based on the received clock signal, between the pre-evaluation net and the logic output terminal.

12. The method of claim 10, further comprising:
providing an output signal indicative of a result of the logic function that the logic network is configured to perform operating on the one or more logic input signals received on the one or more logic input terminals during a second phase of the first and second clock signals.

13. The method of claim 10, further comprising:
holding the output signal provided during an immediately preceding second phase on the logic output terminal independent of the one or more logic input signals received on the one or more logic input terminals during a first phase of the complementary first and second clock signals.

14. The method of claim 10, wherein the unipolar type is N-type MOS transistors.

15. The method of claim 10, wherein the unipolar type is P-type MOS transistors.

16. The method of claim 10, further comprising:
generating a voltage difference between the second clock signal and the first supply voltage during a second phase of the second clock signal that is greater than a voltage difference between the second supply voltage and the first supply voltage.

* * * * *

UNITED STATES PATENT AND TRADEMARK OFFICE
CERTIFICATE OF CORRECTION

| | | |
|---|---|---|
| PATENT NO. | : 10,505,540 B2 | Page 1 of 1 |
| APPLICATION NO. | : 15/915733 | |
| DATED | : December 10, 2019 | |
| INVENTOR(S) | : Tommy Allen Agan and James John Lupino | |

It is certified that error appears in the above-identified patent and that said Letters Patent is hereby corrected as shown below:

In the Specification

Column 1, Lines 6-15:
Delete "This application claims the benefit of U.S. Provisional Application No. 62/468,725 filed Mar. 8, 2017, for "UNIPOLAR LOGIC CIRCUITS" by Tommey Allen Agan and James John Lupino, the entire disclosure of which is hereby incorporated by reference. This application is also a continuation in part U.S. Non-Provisional application Ser. No. 15/729,470 filed Oct. 10, 2017, for "UNIPOLAR LOGIC CIRCUITS" by Tommy Allen Agan and James John Lupino, the entire disclosure of which is hereby incorporated by reference."
Insert --This application is a continuation in part U.S. Non-Provisional application Ser. No. 15/729,470 filed Oct. 10, 2017, for "UNIPOLAR LOGIC CIRCUITS" by Tommy Allen Agan and James John Lupino, the entire disclosure of which is hereby incorporated by reference.--

Signed and Sealed this
Eighteenth Day of February, 2020

Andrei Iancu
*Director of the United States Patent and Trademark Office*